(12) United States Patent
Feng et al.

(10) Patent No.: US 12,051,386 B2
(45) Date of Patent: Jul. 30, 2024

(54) SHIFT REGISTER UNIT, SIGNAL GENERATION UNIT CIRCUIT, DRIVING METHOD AND DISPLAY DEVICE

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 127 days.

(21) Appl. No.: 17/770,250

(22) PCT Filed: Apr. 15, 2021

(86) PCT No.: PCT/CN2021/087374
§ 371 (c)(1),
(2) Date: Apr. 19, 2022

(87) PCT Pub. No.: WO2021/223583
PCT Pub. Date: Nov. 11, 2021

(65) Prior Publication Data
US 2023/0084070 A1    Mar. 16, 2023

(30) Foreign Application Priority Data

May 7, 2020    (CN) .......................... 202010376834.8

(51) Int. Cl.
*G09G 3/20*    (2006.01)
*G09G 5/00*    (2006.01)
*G11C 19/28*   (2006.01)

(52) U.S. Cl.
CPC ............. *G09G 5/006* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 2016/0225462 A1 | 8/2016 | Harada |
| 2017/0039950 A1 | 2/2017 | Li et al. |

(Continued)

FOREIGN PATENT DOCUMENTS

| CN | 104992663 A | 10/2015 |
| CN | 105761757 A | 7/2016 |

(Continued)

OTHER PUBLICATIONS

PCT/CN2021/087374 international search report and written opinion.

*Primary Examiner* — Carl Adams
(74) *Attorney, Agent, or Firm* — IPro, PLLC

(57) ABSTRACT

The present disclosure provides a shift register unit, a signal generation unit circuit, a driving method and a display device. The shift register unit includes a first node control circuit, a second node control circuit and an output circuit, the first node control circuit is used to control a potential of a first node; the second node control circuit controls a potential of a second node; the output circuit is used to control and maintain the potential of the first node and the potential of the second node, and control to connect the output terminal and the second clock signal terminal under the control of the potential of the first node, and control to connect the input terminal and the second voltage terminal under the control of the potential of the second node.

13 Claims, 21 Drawing Sheets

(56) References Cited

U.S. PATENT DOCUMENTS

| | | | |
|---|---|---|---|
| 2018/0240408 A1 | 8/2018 | Ma | |
| 2020/0066209 A1 | 2/2020 | Zhang et al. | |
| 2021/0090484 A1* | 3/2021 | Shang | G09G 3/3266 |
| 2021/0350734 A1 | 11/2021 | Wang et al. | |

FOREIGN PATENT DOCUMENTS

| | | |
|---|---|---|
| CN | 108766358 A | 11/2018 |
| CN | 109616056 A | 4/2019 |
| CN | 110534048 A | 12/2019 |
| CN | 111445832 A | 7/2020 |
| JP | 2014127221 A | 7/2014 |

\* cited by examiner

SHIFT REGISTER UNIT, SIGNAL GENERATION UNIT CIRCUIT, DRIVING METHOD AND DISPLAY DEVICE

CROSS-REFERENCE TO RELATED APPLICATION

This application is the U.S. national phase of PCT Application No. PCT/CN2021/087374 filed on Apr. 15, 2021, which claims priorities of the Chinese patent application No. 202010376834.8 filed on May 7, 2020, which is incorporated herein by reference in its entity.

TECHNICAL FIELD

The present disclosure relates to the field of display technology, and more particularly to a shift register unit, a signal generation unit circuit, a driving method and a display device.

BACKGROUND

In the display field, gate driving circuits are used to replace gate driving signals to reduce costs. Since the complexity of the gate driving circuit determines the display panel frame and the yield of the display panel, a simple gate driving circuit is very important. However, for the pixel compensation circuit in the display panel, it usually requires a lot of time to compensate the threshold voltage shift, so a circuit capable of outputting multi-pulse signals is required, and the number of pulses and pulse width need to be adjustable, but it is very complicated for the existing driving circuit to realize this kind of waveform.

SUMMARY

A first aspect of the present disclosure provides a shift register unit, including a first node control circuit, a second node control circuit and an output circuit, wherein, the first node control circuit is configured to control a potential of a first node; the second node control circuit is electrically connected to a second node, a third node, a first voltage terminal, an initial voltage terminal and a first clock signal terminal, and is configured to control a potential of the third node under the control a first voltage signal and an initial voltage signal, and control to connect the third node and the second node under the control of a first clock signal; the first voltage terminal is used for providing the first voltage signal, the initial voltage terminal is used for providing the initial voltage signal, and the first clock signal terminal is used for providing the first clock signal; the output circuit is electrically connected to an output terminal, the first node, the second node, a second clock signal terminal and a second voltage terminal, is configured to maintain the potential of the first node and a potential of the second node, and control to connect the output terminal and the second clock signal terminal under the control of the potential of the first node, and control to connect the output terminal and the second voltage terminal under the control of the potential of the second node.

Optionally, the first node control circuit is connected to the first clock signal terminal, the first node, and the initial voltage terminal, and configured to control the potential of the first node according to the first clock signal provided by the first clock signal terminal and the initial voltage signal provided by the initial voltage terminal.

Optionally, the first node control circuit comprises a first transistor; a control electrode of the first transistor is electrically connected to the first clock signal terminal, a first electrode of the first transistor is electrically connected to the initial voltage terminal, and a second electrode of the first transistor is electrically connected to the first node; the second node control circuit may include a second transistor, a third transistor, and a fourth transistor, wherein, a control electrode of the second transistor and a first electrode of the second transistor are both electrically connected to the first voltage terminal, and a second electrode of the second transistor is electrically connected to the third node; a control electrode of the third transistor is electrically connected to the initial voltage terminal, a first electrode of the third transistor is electrically connected to the third node, and a second electrode of the third transistor is electrically connected to the second voltage terminal; a control electrode of the fourth transistor is electrically connected to the first clock signal terminal, a first electrode of the fourth transistor is electrically connected to the third node, and a second electrode of the fourth transistor is electrically connected to the second node.

Optionally, the first node control circuit includes a first control sub-circuit, a second control sub-circuit and a first node control sub-circuit; the first control sub-circuit is electrically connected to the first voltage terminal, the first clock signal terminal, the second node and a fourth node, and is configured to control to connect the fourth node and the first voltage terminal under the control of the first clock signal, and control to connect the fourth node and the first clock signal terminal under the control of the potential of the second node, and configured to maintain a potential of the fourth node; the second control sub-circuit is electrically connected to the fourth node, the second clock signal terminal and a fifth node, and is configured to control to connect the fifth node and the second clock signal terminal under the control of the potential of the fourth node; the first node control sub-circuit is electrically connected to the second clock signal terminal, the fifth node, the first node, the second node and the second voltage terminal, is configured to control to connect the first node and the fifth node under the control of the second clock signal provided by the second clock signal terminal, control to connect the first node and the second voltage terminal under the control of the potential of the second node.

Optionally, the first control sub-circuit includes a first transistor, a fifth transistor and a control capacitor, the second control sub-circuit includes a sixth transistor, and the first node control sub-circuit includes a seventh transistor and an eighth transistor, a control electrode of the first transistor is electrically connected to the first clock signal terminal, a first electrode of the first transistor is electrically connected to the first voltage terminal, and a second electrode of the first transistor is electrically connected to the fourth node; a control electrode of the fifth transistor is electrically connected to the second node, a first electrode of the fifth transistor is electrically connected to the fourth node, and a second electrode of the fifth transistor is electrically connected to the first clock signal terminal; a first terminal of the control capacitor is electrically connected to the fourth node, and a second terminal of the control capacitor is electrically connected to the fifth node; a control electrode of the sixth transistor is electrically connected to the fourth node, a first electrode of the sixth transistor is electrically connected to the second clock signal terminal, and a second electrode of the sixth transistor is electrically connected to the fifth node; a control electrode of the seventh transistor is electrically connected to the second clock signal terminal, a first electrode of the seventh transistor is electrically connected to the fifth node, and a second electrode of the seventh transistor is electrically connected to the first node; a control electrode of the eighth transistor is electrically connected to the second node, a first electrode of the eighth transistor is electrically connected to the first node, and a second electrode of the eighth transistor is electrically connected to the second voltage terminal.

Optionally, the second node control circuit is connected to the second clock signal terminal and the fourth node, and is also configured to control to connect the second node and the second voltage terminal under the control of the potential of the fourth node and the second clock signal provided by the second clock signal terminal.

Optionally, the second node control circuit includes a second transistor, a third transistor, a fourth transistor, a ninth transistor, and a tenth transistor, wherein, a control electrode of the second transistor and a first electrode of the second transistor are both electrically connected to the first voltage terminal, and a second electrode of the second transistor is electrically connected to the third node; a control electrode of the third transistor is electrically connected to the initial voltage terminal, a first electrode of the third transistor is electrically connected to the third node, and a second electrode of the third transistor is electrically connected to the second voltage terminal; a control electrode of the fourth transistor is electrically connected to the first clock signal terminal, a first electrode of the fourth transistor is electrically connected to the third node, and a second electrode of the fourth transistor is electrically connected to the second node; a control electrode of the ninth transistor is electrically connected to the fourth node, and a first electrode of the ninth transistor is electrically connected to the second voltage terminal; a control electrode of the tenth transistor is electrically connected to the second clock signal terminal, a first electrode of the tenth transistor is electrically connected to a second electrode of the ninth transistor, and a second electrode of the tenth transistor is electrically connected to the second node.

Optionally, the second node control circuit comprises a second transistor, a third transistor, a fourth transistor, and a ninth transistor; a control electrode of the second transistor and a first electrode of the second transistor are both electrically connected to the first voltage terminal, and a second electrode of the second transistor is electrically connected to the third node; a control electrode of the third transistor is electrically connected to the initial voltage terminal, a first electrode of the third transistor is electrically connected to the third node, and a second electrode of the third transistor is electrically connected to the second voltage terminal; a control electrode of the fourth transistor is electrically connected to the first clock signal terminal, a first electrode of the fourth transistor is electrically connected to the third node, and a second electrode of the fourth transistor is electrically connected to the second node; a control electrode of the ninth transistor is electrically connected to the fourth node, a first electrode of the ninth transistor is electrically connected to the second voltage terminal, and a second electrode of the ninth transistor is electrically connected to the second node.

Optionally, the output circuit comprises a first output transistor, a second output transistor, a first output capacitor and a second output capacitor; a control electrode of the first output transistor is electrically connected to the first node, a first electrode of the first output transistor is electrically connected to the second clock signal terminal, and a second electrode of the first output transistor is electrically connected to the output terminal; a first terminal of the first output capacitor is electrically connected to the first node, and a second terminal of the first output capacitor is electrically connected to the output terminal; a control electrode of the second output transistor is electrically connected to the second node, a first electrode of the second output transistor is electrically connected to the output terminal, and a second electrode of the second output transistor is electrically connected to the second voltage terminal; a first terminal of the second output capacitor is electrically connected to the second node, and a second terminal of the second output capacitor is electrically connected to the second voltage terminal.

In a second aspect, an embodiment of the present disclosure provides a driving method, applied to the shift register unit, the driving method includes: controlling, by the first node control circuit, the potential of the first node; controlling, by the second node control circuit, the potential of the third node under the control of the first voltage signal and the initial voltage signal, and controlling to connect to disconnect the third node and the second node under the control of the first clock signal; controlling, by the output circuit, to connect or disconnect the output terminal and the second clock signal terminal under the control of the potential of the first node, and controlling to connect or disconnect the output terminal and the second voltage terminal under the control of the potential of the second node.

Optionally, the step of controlling, by the first node control circuit, the potential of the first node includes: controlling, by the first node control circuit, the potential of the first node according to the first clock signal and the initial voltage signal.

Optionally, the first node control circuit includes a first control sub-circuit, a second control sub-circuit and a first node control sub-circuit; the step of controlling, by the first node control circuit, the potential of the first node includes: controlling, by the first control sub-circuit, to connect or disconnect a fourth node and the first voltage terminal under the control of the first clock signal, and controlling, by the first control sub-circuit, to connect or disconnect the fourth node and the first clock signal terminal under the control of the potential of the second node, and maintaining, by the first control sub-circuit, a potential of the fourth node; controlling, by the second control sub-circuit, to connect or disconnect a fifth node and a second clock signal terminal under the control of the potential of the fourth node; controlling, by the first node control sub-circuit, to connect or disconnect the first node and the fifth node under the control of the second clock signal, and controlling, by the first node control sub-circuit, to connect or disconnect the first node and the second voltage terminal under the control of the potential of the second node.

Optionally, the driving method further includes: controlling, by the second node control circuit, to connect or disconnect the second node and the second voltage terminal under the control of the potential of the fourth node and the second clock signal.

In a third aspect, an embodiment of the present disclosure provides a gate driving circuit including a plurality of stages of shift register units; except for a first stage of shift register unit, an initial voltage terminal of each stage of the shift register unit is electrically connected to an output terminal of an adjacent previous stage of the shift register unit.

In a fourth aspect, an embodiment of the present disclosure provides a display device including the gate driving circuit.

In a fifth aspect, an embodiment of the present disclosure provides a signal generation unit circuit, including a signal generation circuit, an output control signal generation circuit and an output control circuit, wherein, the signal generation circuit is connected to an (N−1)th stage of first carry signal terminal, a first clock signal terminal, a second clock signal terminal, a first signal output terminal, a first voltage terminal and a second voltage terminal, is configured to generate an N-th stage of first carry signal according to an (N−1)th stage of first carry signal, a first clock signal, a second clock signal, a first voltage signal and a second voltage signal, control a potential of a second node, and control to connect the first signal output terminal and the first voltage terminal under the control of the N-th stage of first carry signal, control to connect the first signal output terminal and the second voltage terminal under the control of the potential of the second node; the output control signal generation circuit is configured to control a potential of the output control terminal; the output control circuit is electrically connected to the output control terminal and the first signal output terminal, and is configured to control a scan signal outputted by the first signal output terminal under the control of an output control signal provided by the output control terminal; the first clock signal terminal is used to provide the first clock signal, the second clock signal terminal is used to provide the second clock signal; the (N−1)th stage of first carry signal terminal is used to provide the (N−1)th stage of first carry signal; the first voltage terminal is used to provide the first voltage signal, and the second voltage terminal is used to provide the second voltage signal; N is a positive integer.

Optionally, the signal generation circuit comprises a carry signal control circuit, a second node control circuit and an output circuit, wherein, the carry signal control circuit is configured to generate and output the N-th stage of first carry signal through the N-th stage of first carry signal output terminal according to the first clock signal, the second clock signal, the first voltage signal and the second voltage signal; the second node control circuit is connected to the second node, the third node, the first voltage terminal, the (N−1)th stage of first carry signal terminal, the first clock signal terminal, the second clock signal terminal and the second voltage terminal, and is configured to control a potential of a third node under the control of the first voltage signal and the (N−1)th stage of first carry signal, and control to connect the third node and the second node under the control of the first clock signal; the output circuit is electrically connected to the first signal output terminal, the N-th stage of first carry signal terminal, the second node, the first voltage terminal and the second voltage terminal, is configured to control and maintain a potential of the N-th stage of first carry signal and the potential of the second node, and control to connect the first signal output terminal and the first voltage terminal under the control of the N-th stage of first carry signal, and control to connect the first signal output terminal and the second voltage terminal under the control of the potential of the second node.

Optionally, the carry signal control circuit comprises a first control sub-circuit, a second control sub-circuit and a carry signal control sub-circuit; the first control sub-circuit is electrically connected to the first voltage terminal, the first clock signal terminal, the second node and the fourth node, and is configured to control to connect the fourth node and the first voltage terminal under the control of the first clock signal, and control to connect the fourth node and the first clock signal terminal under the control of the potential of the second node, and maintain the potential of the fourth node; the second control sub-circuit is electrically connected to the fourth node, the second clock signal terminal and the fifth node, and is configured to control to connect the fifth node and the second clock signal terminal under the control of the potential of the fourth node; the carry signal control sub-circuit is connected to the second clock signal terminal, the fifth node, the N-th stage of first carry signal terminal, the second node and the second voltage terminal, and configured to control to connect the N-th stage of first carry signal terminal and the fifth node under the control of the second clock signal provided by the second clock signal terminal, and control to connect the N-th stage of first carry signal terminal and the second voltage terminal under the control of the potential of the second node.

Optionally, the first control sub-circuit includes a first control transistor, a second control transistor and a control capacitor, the second control sub-circuit includes a third control transistor, and the carry signal control sub-circuit includes a fourth control transistor and a fifth control transistor, wherein, a control electrode of the first control transistor is electrically connected to the first clock signal terminal, a first electrode of the first control transistor is electrically connected to the first voltage terminal, and a second electrode of the first control transistor is electrically connected to the fourth node; a control electrode of the second control transistor is electrically connected to the second node, a first electrode of the second control transistor is electrically connected to the fourth node, and a second electrode of the second control transistor is electrically connected to the first clock signal terminal; a first terminal of the control capacitor is electrically connected to the fourth node, and a second terminal of the control capacitor is electrically connected to the fifth node; a control electrode of the third control transistor is electrically connected to the fourth node, a first electrode of the third control transistor is electrically connected to the second clock signal terminal, and a second electrode of the third control transistor is electrically connected to the fifth node; a control electrode of the fourth control transistor is electrically connected to the second clock signal terminal, a first electrode of the fourth control transistor is electrically connected to the fifth node, and a second electrode of the fourth control transistor is electrically connected to the N-th stage of first carry signal terminal; a control electrode of the fifth control transistor is electrically connected to the second node, a first electrode of the fifth control transistor is electrically connected to the N-th stage of first carry signal terminal, and a second electrode of the fifth control transistor is electrically connected to the second voltage terminal.

Optionally, the second node control circuit comprises a third node control sub-circuit and a second node control sub-circuit, wherein, the third node control sub-circuit is electrically connected to the (N−1)th stage of first carry signal terminal and the third node, and is configured to control the potential of the third node under the control of the (N−1)th stage of first carry signal; the second node control sub-circuit is electrically connected to the first clock signal terminal, the third node, the fourth node, the second clock signal terminal, the second voltage terminal and the second node, is configured to control to connect the third node and the second node under the control of the first clock signal, and control to connect the second node and the second voltage terminal under the control of the potential of the fourth node and the second clock signal.

Optionally, the second node control sub-circuit comprises a sixth control transistor, a seventh control transistor and an eighth control transistor, wherein, a control electrode of the sixth control transistor is electrically connected to the first clock signal terminal, a first electrode of the sixth control transistor is electrically connected to the third node, and a second electrode of the sixth control transistor is electrically connected to the second node; a control electrode of the seventh control transistor is electrically connected to the fourth node, and a first electrode of the seventh control transistor is electrically connected to the second voltage terminal; a control electrode of the eighth control transistor is electrically connected to the second clock signal terminal, a first electrode of the eighth control transistor is electrically connected to a second electrode of the seventh control transistor, and the second electrode of the eighth control transistor is electrically connected to the second node.

Optionally, the third node control sub-circuit comprises a ninth control transistor and a tenth control transistor, wherein, a control electrode of the ninth control transistor and a first electrode of the ninth control transistor are both electrically connected to the first voltage terminal; a control electrode of the tenth control transistor is electrically connected to the (N−1)th stage of first carry signal terminal, a first electrode of the tenth control transistor is electrically connected to a first electrode of the ninth control transistor, and a second electrode of the ten control transistor is electrically connected to the second voltage terminal.

Optionally, the third node control sub-circuit comprises a ninth control transistor, a tenth control transistor, an eleventh control transistor and a twelfth control transistor, wherein, a control electrode of the ninth control transistor and a first electrode of the ninth control transistor are electrically connected to the first voltage terminal; a control electrode of the tenth control transistor is electrically connected to the (N−1)th stage of first carry signal terminal, a first electrode of the tenth control transistor is electrically connected to a second electrode of the ninth control transistor, and a second electrode of the tenth control transistor is electrically connected to the second voltage terminal; a control electrode of the eleventh control transistor is electrically connected to the second electrode of the ninth control transistor, a first electrode of the eleventh control transistor is electrically connected to the first voltage terminal, and a second electrode of the eleventh control transistor is electrically connected to the third node; a control electrode of the twelfth control transistor is electrically connected to the (N−1)th stage of first carry signal terminal, a first electrode of the twelfth control transistor is electrically connected to the third node, and a second electrode of twelfth control transistor is electrically connected to the second voltage terminal.

Optionally, the output circuit comprises a first output transistor, a second output transistor, a first output capacitor, and a second output capacitor, wherein, a control electrode of the first output transistor is electrically connected to the N-th stage of first carry signal terminal, a first electrode of the first output transistor is electrically connected to the first voltage terminal, and a second electrode of the first output transistor is electrically connected to the first signal output terminal; a control electrode of the second output transistor is electrically connected to the second node, a first electrode of the second output transistor is electrically connected to the first signal output terminal, and a second electrode of the second output transistor is electrically connected to the second voltage terminal; a first terminal of the first output capacitor is electrically connected to the first voltage terminal, and a second terminal of the first output capacitor is electrically connected to the N-th stage of first carry signal terminal; a first terminal of the second output capacitor is electrically connected to the second node, and a second terminal of the second output capacitor is electrically connected to the second voltage terminal.

Optionally, the output control terminal is an N-th stage of second carry signal terminal; the output control signal generation circuit is connected to an (N−1)th stage of second carry signal terminal, an (N+5)th stage of second carry signal terminal, the N-th stage of second carry signal terminal, the first clock signal terminal and the second clock signal terminal, is configured to generate and output an N-th stage of second carry signal through the N-th stage of second carry signal terminal according to an (N−1)th stage of second carry signal, an (N+5)th stage of second carry signal, the first clock signal and the second clock signal; the (N−1)th stage of second carry signal terminal is used to provide the (N−1)th stage of second carry signal, and the (N+5)th stage of second carry signal terminal is used to provide the (N+5)th stage of second carry signal.

Optionally, the output control signal generation circuit comprises a first control node control sub-circuit, a second control node control sub-circuit and an output control signal generation sub-circuit; the first control node control sub-circuit is connected to the (N−1)th stage of second carry signal terminal, the (N+5)th stage of second carry signal terminal, a first control node and a second control node, and is configured to control a potential of the first control node and maintain the potential of the first control node under the control of the (N−1)th stage of second carry signal, the (N+5)th stage of second carry signal, and a potential of the second control node; the second control node control sub-circuit is electrically connected to the first clock signal terminal, the first control node and the second control node, and is configured to control the potential of the second control node and maintain the potential of the second control node under the control of the first clock signal and the potential of the first control node; the output control signal generation sub-circuit is electrically connected to the first control node, the second control node, the second clock signal terminal, the second voltage terminal and the output control terminal, is configured to control to connect the output control terminal and the second clock signal terminal under the control of the potential of the first control node, and control to connect the output control terminal and the second voltage terminal under the control of the potential of the second control node.

Optionally, the first control node control sub-circuit includes a first control node control transistor, a second control node control transistor, a third control node control transistor, and a first control node control capacitor, wherein, a control electrode of the first control node control transistor and a first electrode of first control node control transistor are both electrically connected to the (N−1)th stage of second carry signal terminal, and a second electrode of the first control node control transistor is electrically connected to the first control node; a control electrode of the second control node control transistor is electrically connected to the (N+5)th stage of second carry signal terminal, a first electrode of the second control node control transistor is electrically connected to the first control node, and a second electrode of the second control node control transistor is electrically connected to the second voltage terminal; a control electrode of the third control node control transistor is electrically connected to the second control node, a first electrode of the third control node control transistor is electrically connected to the first control node, and a second electrode of the third control node control transistor is electrically connected to the second voltage terminal; a first terminal of the first control node control capacitor is electrically connected to the first control node, and a second terminal of the first control node control capacitor is electrically connected to the first signal output terminal; the second control node control sub-circuit includes a fourth control node control transistor, a fifth control node control transistor and a second control node control capacitor; a control electrode of the fourth control node control transistor and a first electrode of the fourth control node control transistor are electrically connected to the first clock signal terminal, and a second electrode of the fourth control node control transistor is electrically connected to the second control node; a control electrode of the fifth control node control transistor is electrically connected to the first control node, a first electrode of the fifth control node control transistor is electrically connected to the second control node, and a second electrode of the fifth control node control transistor is electrically connected to the second voltage terminal; a first terminal of the second control node control capacitor is electrically connected to the second control node, and a second terminal of the second control node control capacitor is electrically connected to the second voltage terminal; the output control signal generation sub-circuit includes a first output control signal generation transistor and a second output control signal generation transistor, wherein, a control electrode of the first output control signal generation transistor is electrically connected to the first control node, a first electrode of the first output control signal generation transistor is electrically connected to the second clock signal terminal, and a second electrode of the first output control signal generation transistor is electrically connected to the N-th stage of second carry signal terminal; a control electrode of the second output control signal generation transistor is electrically connected to the second control node, and a first electrode of the second output control signal generation transistor is electrically connected to the N-th stage of second carry signal terminal, a second electrode of the second output control signal generation transistor is electrically connected to the second voltage terminal.

Optionally, the output control signal generation circuit includes a third control node control sub-circuit, a second carry signal generation sub-circuit, a fourth control node control sub-circuit and an output control signal generation sub-circuit, wherein, the third control node control sub-circuit is electrically connected to a third control node, the first clock signal terminal, a fourth control node, the second clock signal terminal and a first voltage terminal, and is configured to control the potential of the third control node and maintain a potential of the third control node according to the first clock signal, the second clock signal, a potential of the fourth control node and the first voltage signal; the second carry signal generation sub-circuit is electrically connected to the third control node, the fourth control node, the second clock signal terminal, the N-th stage of second carry signal terminal and a second voltage terminal, is configured to control the N-th stage of second carry signal outputted by the N-th stage of second carry signal terminal according to the potential of the third control node, the second clock signal, the potential of the fourth control node and the second voltage signal; the fourth control node control sub-circuit is connected to the first voltage terminal, the (N−1)th stage of second carry signal terminal, the first clock signal terminal, the third control node, the second clock signal terminal and the fourth control node, and is configured to control the potential of the fourth control node and maintain the potential of the fourth control node according to the first voltage signal, the (N−1)th stage of second carry signal, the potential of the third control node, the first clock signal, the second clock signal and the second voltage signal; the output control signal generation sub-circuit is electrically connected to the N-th stage of second carry signal terminal, the fourth control node, the second clock signal terminal, the second voltage terminal and the output control terminal, is configured to control to connect the output control terminal and the second clock signal terminal under the control of the N-th stage of second carry signal, and control to connect the output control terminal and the second voltage terminal under the control of the potential of the fourth control node.

Optionally, the third control node control sub-circuit includes a first generation control transistor, a second generation control transistor and a first generation control capacitor, wherein, a control electrode of the first generation control transistor is electrically connected to the first clock signal terminal, a first electrode of the first generation control transistor is electrically connected to the first voltage terminal, and a second electrode of the first generation control transistor is electrically connected to the third control node; a control electrode of the second generation control transistor is electrically connected to the fourth control node, a first electrode of the second generation control transistor is electrically connected to the third control node, and a second electrode of the second generation control transistor is electrically connected to the second clock signal terminal; a first terminal of the first generation control capacitor is electrically connected to the third control node, and a second terminal of the first generation control capacitor is electrically connected to a fifth control node; the second carry signal generation sub-circuit includes a third generation control transistor, a fourth generation control transistor, a fifth generation control transistor and a second generation control capacitor, wherein, a control electrode of the third generation control transistor is electrically connected to the third control node, a first electrode of the third generation control transistor is electrically connected to the second clock signal terminal, and the second electrode of the third generation control transistor is electrically connected to the fifth control node; a control electrode of the fourth generation control transistor is electrically connected to the second clock signal terminal, a first electrode of the fourth generation control transistor is electrically connected to the fifth control node, and a second electrode of the fourth generation control transistor is electrically connected to the N-th stage of second carry signal terminal; a control electrode of the fifth generation control transistor is electrically connected to the fourth control node, a first electrode of the fifth generation control transistor is electrically connected to the N-th stage of second carry signal terminal, and a second electrode of the fifth generation control transistor is electrically connected to the second voltage terminal; a first terminal of the second generation control capacitor is electrically connected to the N-th stage of second carry signal terminal, and a second terminal of the second generation control capacitor is electrically connected to the output control terminal.

Optionally, the fourth control node control sub-circuit includes a sixth generation control transistor, a seventh generation control transistor, an eighth generation control transistor, a ninth generation control transistor, a tenth generation control transistor, and a third generation control capacitor; a control electrode of the sixth generation control transistor and a first electrode of the sixth generation control transistor are both electrically connected to the first voltage terminal; a control electrode of the seventh generation control transistor is electrically connected to the (N−1)th stage of second carry signal terminal, a first electrode of the seventh generation control transistor is electrically connected to a second electrode of the sixth generation control transistor, a second electrode of the seventh generation control transistor is electrically connected to the second voltage terminal; a control electrode of the eighth generation control transistor is electrically connected to the first clock signal terminal, a first electrode of the eighth generation control transistor is electrically connected to the first electrode of the seventh generation control transistor, and a second electrode of the eighth generation control transistor is electrically connected to the fourth control node; a control electrode of the ninth generation control transistor is electrically connected to the third control node, and a first electrode of the ninth generation control transistor is electrically connected to the second voltage terminal; a control electrode of the tenth generation control transistor is electrically connected to the second clock signal terminal, a first electrode of the tenth generation control transistor is electrically connected to a second electrode of the ninth generation control transistor, and a second electrode of the tenth generation control transistor is electrically connected to the third control node; a first terminal of the third generation control capacitor is electrically connected to the fourth control node, and a second terminal of the third generation control capacitor is electrically connected to the second voltage terminal.

Optionally, the fourth control node control sub-circuit includes a first input transistor, a second input transistor, a sixth generation control transistor, a seventh generation control transistor, an eighth generation control transistor, a ninth generation control transistor, and a tenth generation control transistor and a third generation control capacitor; a control electrode of the first input transistor and a first electrode of the first input transistor are both electrically connected to the first voltage terminal; a control electrode of the second input transistor is electrically connected to the (N−1)th stage of second carry signal terminal, a first electrode of the second input transistor is electrically connected to a second electrode of the first input transistor, and a second electrode of the second input transistor is electrically connected to the second voltage terminal; a control electrode of the sixth generation control transistor is electrically connected to a first electrode of the second input transistor, and a first electrode of the sixth generation control transistor is electrically connected to the first voltage terminal; a control electrode of the seventh generation control transistor is electrically connected to the (N−1)th stage of second carry signal terminal, a first electrode of the seventh generation control transistor is electrically connected to a second electrode of the sixth generation control transistor, a second electrode of the seventh generation control transistor is electrically connected to the second voltage terminal; a control electrode of the eighth generation control transistor is electrically connected to the first clock signal terminal, a first electrode of the eighth generation control transistor is electrically connected to the first electrode of the seventh generation control transistor, and a second electrode of the eighth generation control transistor is electrically connected to the fourth control node; a control electrode of the ninth generation control transistor is electrically connected to the third control node, and a first electrode of the ninth generation control transistor is electrically connected to the second voltage terminal; a control electrode of the tenth generation control transistor is electrically connected to the second clock signal terminal, a first electrode of the tenth generation control transistor is electrically connected to a second electrode of the ninth generation control transistor, and a second electrode of the tenth generation control transistor is electrically connected to the third control node; a first terminal of the third generation control capacitor is electrically connected to the fourth control node, and a second terminal of the third generation control capacitor is electrically connected to the second voltage terminal.

Optionally, the output control signal generation sub-circuit includes an eleventh generation control transistor and a twelfth generation control transistor, wherein, a control electrode of the eleventh generation control transistor is electrically connected to the N-th stage of second carry signal terminal, a first electrode of the eleventh generation control transistor is electrically connected to the second clock signal terminal, and a second electrode of the eleventh generation control transistor is electrically connected to the output control terminal; a control electrode of the twelfth generation control transistor is electrically connected to the fourth control node, a first electrode of the twelfth generation control transistor is electrically connected to the output control terminal, and a second electrode of the twelfth generation control transistor is electrically connected to the second voltage terminal.

Optionally, the output control circuit includes a first output control transistor; a control electrode of the first output control transistor is electrically connected to the output control terminal, and a first electrode of the first output control transistor is connected to the first signal output terminal, and a second electrode of the first output control transistor is electrically connected to the second voltage terminal.

Optionally, the output control circuit is electrically connected to the first voltage terminal, the second signal output terminal, the second node and the first signal output terminal, and is configured to control to connect the second signal output terminal and the first voltage terminal under the control of a scan signal outputted by the first signal output terminal, and control to connect the second signal output terminal and the second voltage terminal under the control of the potential of the second node.

Optionally, the output control circuit includes a first output control transistor, a second output control transistor, a third output control transistor, and an output control capacitor, wherein a control electrode of the first output control transistor is electrically connected to the output control terminal, a first electrode of the first output control transistor is electrically connected to the first signal output terminal, and a second electrode of the first output control transistor is electrically connected to the second voltage terminal; a control electrode of the second output control transistor is electrically connected to the first signal output terminal, a first electrode of the second output control transistor is electrically connected to the first voltage terminal, and a second electrode of the second output control transistor is electrically connected to the second signal output terminal; a control electrode of the third output control transistor is electrically connected to the second node, a first electrode of the third output control transistor is electrically connected to the second signal output terminal, and a second electrode of the third output control transistor is electrically connected to the second voltage terminal; a first terminal of the output control capacitor is electrically connected to the first voltage terminal, and a second terminal of the output control capacitor is electrically connected to the first signal output terminal.

In a sixth aspect, an embodiment of the present disclosure provides a signal generation method, applied to the signal generation unit circuit, the signal generation method includes: generating, by the signal generation circuit, the N-th stage of first carry signal according the (N−1)th stage of first carry signal, the first clock signal, the second clock signal, the first voltage signal, and the second voltage signal, and controlling the potential of the second node, and controlling to connect the first signal output terminal and the first voltage terminal under the control of the N-th stage of first carry signal, and controlling to connect the first signal output terminal and the second voltage terminal under the control the potential of the second node; controlling, by the output control signal generation circuit, the potential of the output control terminal; controlling, by the output control circuit, the scan signal outputted by the first signal output terminal under the control of the output control signal provided by the output control terminal.

In a seventh aspect, an embodiment of the present disclosure provides a signal generation circuit including a plurality of stages of signal generation unit circuits; the N-th stage of signal generation circuit is electrically connected to the (N−1)th stage of first carry signal terminal, the N-th stage of first carry signal terminal, the N-th stage of first signal output terminal, the (N−1)th stage of second carry signal terminal and the N-th stage of second carry signal terminal; N is a positive integer.

Optionally, the output control terminal is the N-th stage of second carry signal terminal; the output control signal generation circuit is connected to the (N−1)th stage of second carry signal terminal, the (N+5)th stage of second carry signal terminal, the N-th stage of second carry signal terminal, the first clock signal terminal and the second clock signal terminal, is configured to generate and output the N-th stage of second carry signal outputted by the N-th stage of second carry signal terminal according to the (N−1)th stage of second carry signal, the (N+5)th stage of second carry signal, the first clock signal and the second clock signal; the N-th stage of signal generation circuit is also electrically connected to the (N+5)th stage of second carry signal terminal.

In an eighth aspect, an embodiment of the present disclosure provides a display device including the signal generation circuit.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative efforts shall fall within the protection scope of the present disclosure.

Figure 1:
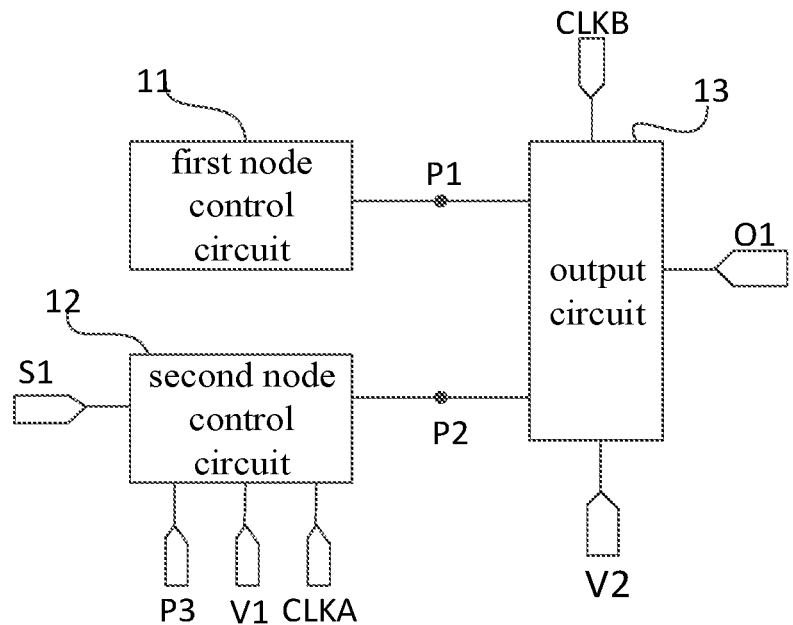
FIG. 1 is a structural diagram of a shift register unit according to at least one embodiment of the present disclosure.

As shown in FIG. 1, the shift register unit described in at least one embodiment of the present disclosure includes a first node control circuit 11, a second node control circuit 12 and an output circuit 13, wherein, The first node control circuit 11 is electrically connected to a first node P1 and configured to control a potential of the first node P1;

The second node control circuit 12 is electrically connected to a second node P2, a third node P3, a first voltage terminal V1, an initial voltage terminal S1 and a first clock signal terminal CLKA, and is configured to control the potential of the third node P3 under the control a first voltage signal and an initial voltage signal, and control to connect the third node P3 and the second node P2 under the control of the first clock signal; the first voltage terminal V1 is used for providing the first voltage signal, the initial voltage terminal S1 is used for providing the initial voltage signal, and the first clock signal terminal CLKA is used for providing the first clock signal;

The output circuit 13 is electrically connected to an output terminal O1, the first node P1, the second node P2, a second clock signal terminal CLKB and a second voltage terminal V2, is configured to maintain a potential of the first node P1 and a potential of the second node P2, and control to connect the output terminal O1 and the second clock signal terminal CLKB under the control of the potential of the first node P1, and control to connect the output terminal O1 and the second voltage terminal V2 under the control of the potential of the second node P2.

The shift register unit described in at least one embodiment of the present disclosure can output a pulse signal, the pulse signal is a multi-pulse signal, and the number of pulses and the pulse width are adjustable, so as to correspond to threshold voltage compensation time required by different internal compensation circuits (the internal compensation circuit is included in the pixel circuit).

In at least one embodiment of the present disclosure, the first voltage signal may be a high voltage signal, and the second voltage signal may be a low voltage signal, but not limited thereto.

In at least one embodiment of the present disclosure, the first clock signal and the second clock signal may be mutually inverse in phase, but not limited thereto.

In a specific implementation, the first node control circuit is electrically connected to the first clock signal terminal, the first node, and the initial voltage terminal, respectively, and is configured to control the potential of the first node according to the first clock signal provided by the first clock signal terminal and the initial voltage signal provided by the initial voltage terminal.

Figure 2:
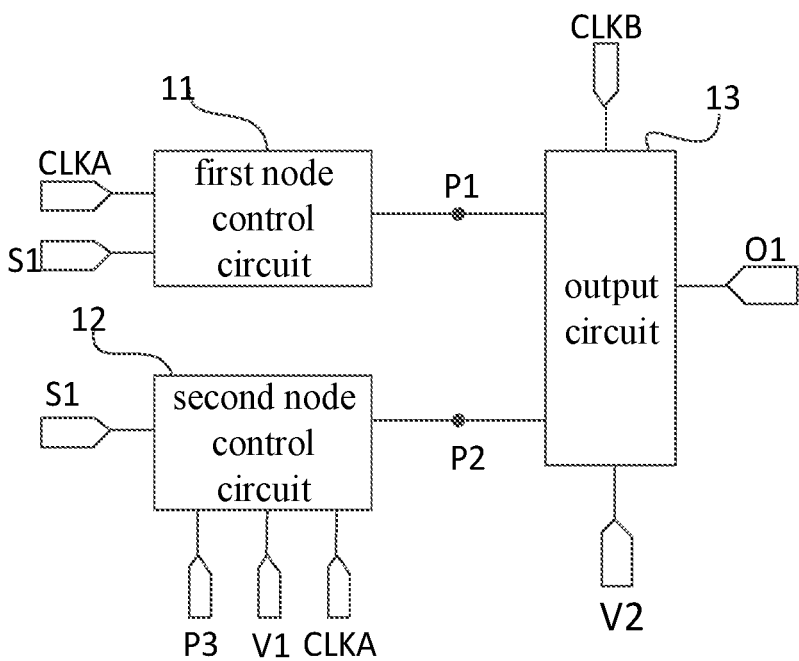
FIG. 2 is a structural diagram of a shift register unit according to at least one embodiment of the present disclosure.

As shown in FIG. 2, on the basis of at least one embodiment of the shift register unit shown in FIG. 1, the first node control circuit 11 is connected to the first clock signal terminal CLKA, the first node P1, and the initial voltage terminal S1 to control the potential of the first node P1 according to the first clock signal provided by the first clock signal terminal CLKA and the initial voltage signal provided by the initial voltage terminal S1.

In a specific implementation, the initial voltage terminal S1 may be an output terminal of an adjacent previous stage of shift register unit, but it is not limited thereto.

Optionally, the first node control circuit may include a first transistor;

A control electrode of the first transistor is electrically connected to the first clock signal terminal, a first electrode of the first transistor is electrically connected to the initial voltage terminal, and a second electrode of the first transistor is electrically connected to the first node.

In at least one embodiment of the present disclosure, the second node control circuit may include a second transistor, a third transistor, and a fourth transistor, wherein, A control electrode of the second transistor and a first electrode of the second transistor are both electrically connected to the first voltage terminal, and a second electrode of the second transistor is electrically connected to the third node;

A control electrode of the third transistor is electrically connected to the initial voltage terminal, a first electrode of the third transistor is electrically connected to the third node, and a second electrode of the third transistor is electrically connected to the second voltage terminal;

A control electrode of the fourth transistor is electrically connected to the first clock signal terminal, a first electrode of the fourth transistor is electrically connected to the third node, and a second electrode of the fourth transistor is electrically connected to the second node.

In at least one embodiment of the present disclosure, the output circuit may include a first output transistor, a second output transistor, a first output capacitor, and a second output capacitor;

A control electrode of the first output transistor is electrically connected to the first node, a first electrode of the first output transistor is electrically connected to the second clock signal terminal, and a second electrode of the first output transistor is electrically connected to the output terminal;

A first terminal of the first output capacitor is electrically connected to the first node, and a second terminal of the first output capacitor is electrically connected to the output terminal;

A control electrode of the second output transistor is electrically connected to the second node, a first electrode of the second output transistor is electrically connected to the output terminal, and a second electrode of the second output transistor is electrically connected to the second voltage terminal;

A first terminal of the second output capacitor is electrically connected to the second node, and a second terminal of the second output capacitor is electrically connected to the second voltage terminal.

Figure 3:
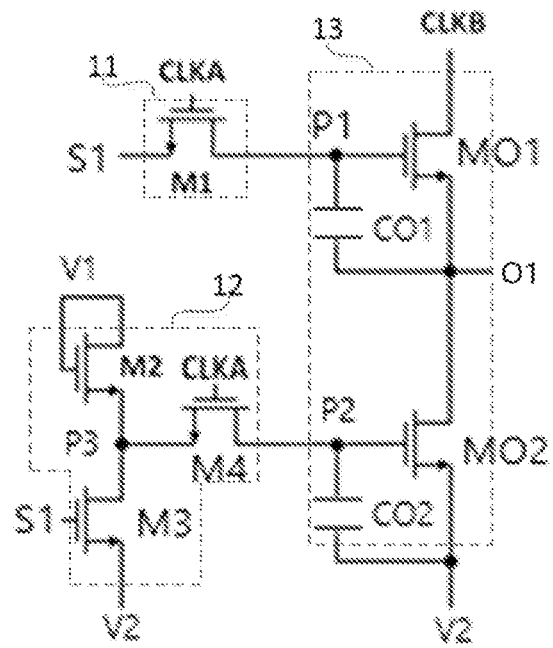
FIG. 3 is a circuit diagram of the shift register unit according to a first embodiment of the present disclosure.

As shown in FIG. 3, the shift register unit described in the present disclosure includes a first node control circuit 11, a second node control circuit 12 and an output circuit 13, wherein, The first node control circuit 11 includes a first transistor M1;

The gate electrode of the first transistor M1 is electrically connected to the first clock signal terminal CLKA, the drain electrode of the first transistor M1 is electrically connected to the initial voltage terminal S1, and the source electrode of the first transistor M1 is electrically connected to the first node P1;

The second node control circuit 12 includes a second transistor M2, a third transistor M3 and a fourth transistor M4, wherein, The gate electrode of the second transistor M2 and the drain electrode of the second transistor M2 are both electrically connected to the first voltage terminal V1, and the source electrode of the second transistor M2 is electrically connected to the third node P3;

The gate electrode of the third transistor M3 is electrically connected to the initial voltage terminal S1, the drain electrode of the third transistor M3 is electrically connected to the third node P3, and the source electrode of the third transistor M3 is electrically connected to the second voltage terminal V2;

The gate electrode of the fourth transistor M4 is electrically connected to the first clock signal terminal CLKA, the drain electrode of the fourth transistor M4 is electrically connected to the third node P3, and the source electrode of the fourth transistor M4 is electrically connected to the second node P2;

The output circuit 13 includes a first output transistor MO1, a second output transistor M02, a first output capacitor CO1 and a second output capacitor CO2;

The gate electrode of the first output transistor MO1 is electrically connected to the first node P1, the drain electrode of the first output transistor MO1 is electrically connected to the second clock signal terminal CLKA, and the source electrode of the first output transistor MO1 is electrically connected to the output terminal O1;

The first terminal of the first output capacitor CO1 is electrically connected to the first node P1, and the second terminal of the first output capacitor CO1 is electrically connected to the output terminal O1;

The gate electrode of the second output transistor MO2 is electrically connected to the second node P2, the drain electrode of the second output transistor MO2 is electrically connected to the output terminal O1, and the source electrode of the second output transistor MO2 is electrically connected to the second voltage terminal;

The first terminal of the second output capacitor CO2 is electrically connected to the second node P2, and the second terminal of the second output capacitor CO2 is electrically connected to the second voltage terminal V2.

In the first specific embodiment of the shift register unit shown in FIG. 3, the width-to-length ratio of M3 is greater than the width-to-length ratio of M2, but not limited thereto.

In the first specific embodiment of the shift register unit shown in FIG. 3, all transistors are n-type thin film transistors, but not limited thereto.

In the first specific embodiment of the shift register unit shown in FIG. 3, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

Figure 4:
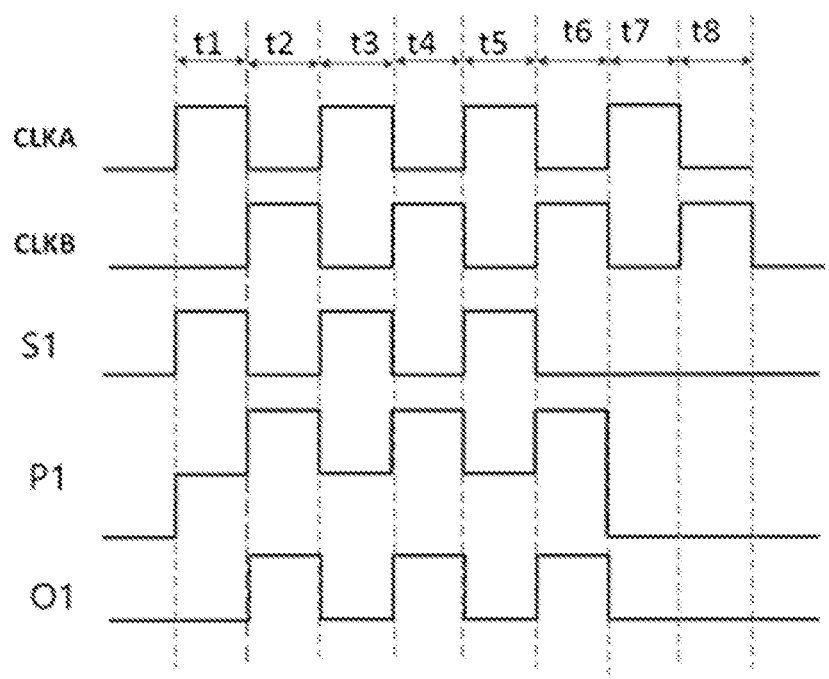
FIG. 4 is a working timing diagram of the shift register unit according to the first embodiment of the present disclosure.

As shown in FIG. 4, when the shift register unit shown in FIG. 3 of the present disclosure is in operation, In a first time period t1, CLKA provides a high voltage, CLKB provides a low voltage, S1 provides a high voltage, M1 is turned on, M2 is turned on, M3 is turned on, M4 is turned on, the potential of A is a low voltage, and the potential of P2 is a low voltage, the potential of P1 is a high voltage, MO1 is turned on, MO2 is turned off, and O1 outputs a low level;

In a second time period t2, CLKA provides a low voltage, CLKB provides a high voltage, S1 provides a low voltage, M1 is turned off, M2 is turned on, M3 is turned off, M4 is turned off, MO1 is turned on, CO1 increases the potential of P1 by bootstrapping, and O1 outputs a high voltage;

In a third time period t3, CLKA provides a high voltage, CLKB provides a low voltage, S1 provides a high voltage, M1 is turned on, M2 is turned on, M3 is turned on, M4 is turned on, the potential of A is a low voltage, and the potential of P2 is a low voltage, the potential of P2 is a high voltage, MO1 is turned on, MO2 is turned off, and O1 outputs a low voltage;

In a fourth time period t4, CLKA provides a low voltage, CLKB provides a high voltage, S1 provides a low voltage, M1 is turned off, M2 is turned on, M3 is turned off, the potential of A is a high voltage, the potential of PD is maintained at a low voltage, and MO2 is turned off, MO1 is turned on, CO1 increases the voltage of P1 by bootstrapping, and O1 outputs a high voltage;

In a fifth time period t5, CLKA provides a high voltage, CLKB provides a low voltage, S1 provides a high voltage, M1 is turned on, M2 is turned on, M3 is turned on, the voltage of A is low voltage, M4 is turned on, and the potential of P2 is low voltage, the voltage of P2 is a high voltage, MO1 is turned on, and O1 outputs a low voltage;

In a sixth time period t6, CLKA provides a low voltage, CLKB provides a high voltage, S1 provides a low voltage, M1 is turned off, M2 is turned on, M3 is turned off, the potential of A is a high voltage, M4 is turned off, the potential of P2 is a low voltage, MO2 is turned off, MO1 is turned on, the potential of P1 is pulled up by the bootstrapping, and O1 outputs a high voltage;

In a seventh time period t7, CLKA provides a high voltage, CLKB provides a low voltage, S1 provides a low voltage, M1 is turned on, the potential of P1 is pulled down, MO1 is turned off, M2 is turned on, M3 is turned off, M4 is turned on, and the potential of P2 is a high voltage, MO2 is turned on, and O1 outputs a low voltage;

In an eighth time period t8, CLKA provides a low voltage, CLKB provides a high voltage, S1 provides a low voltage, M1 is turned off, M2 is turned on, M3 is turned off, M4 is turned off, the potential of P2 is maintained at a high voltage, and the potential of P1 is a low voltage, MO1 is turned off, MO2 is turned on, and O1 outputs a low voltage.

Figure 5:
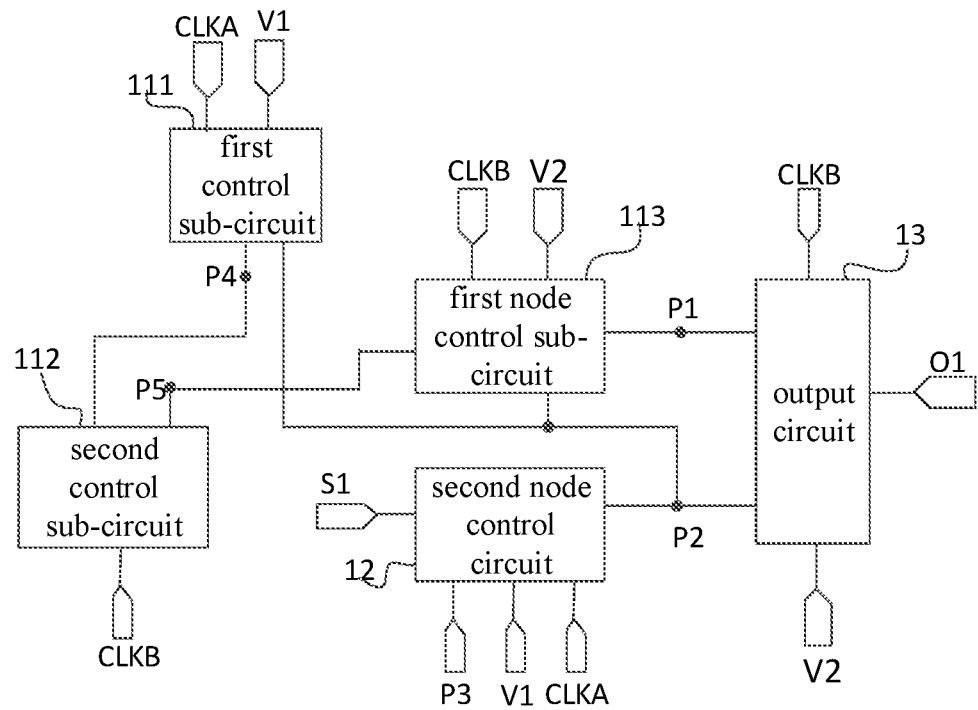
FIG. 5 is a structural diagram of a shift register unit according to at least one embodiment of the present disclosure.

During specific implementation, based on at least one embodiment of the shift register unit shown in FIG. 1, as shown in FIG. 5, the first node control circuit may include a first control sub-circuit 111, a second control sub-circuit 112 and a first node control sub-circuit 113;

The first control sub-circuit 111 is respectively electrically connected to the first voltage terminal V1, the first clock signal terminal CLKA, the second node P2 and the fourth node P4, and is used to control to connect the fourth node P4 and the first voltage terminal V1 under the control of the first clock signal, and control to connect the fourth node P4 and the first clock signal terminal CLKA under the control of the potential of the second node P2, and used to maintain the potential of the fourth node P4;

The second control sub-circuit 112 is electrically connected to the fourth node P4, the second clock signal terminal CLKB and the fifth node P5, and is used to control to connect the fifth node P5 and the second clock signal terminal CLKB under the control of the potential of the fourth node P4;

The first node control sub-circuit 113 is electrically connected to the second clock signal terminal CLKB, the fifth node P5, the first node P1, the second node P2 and the second voltage terminal V2, is used to control to connect the first node P1 and the fifth node P5 under the control of the second clock signal provided by the second clock signal terminal CLKB, control to connect the first node P1 and the second voltage terminal V2 under the control of the potential of the second node P2.

When the shift register unit of the present disclosure as shown in FIG. 5 is in operation, when the potential of the fourth node P4 is a high voltage, the potential of the second node P2 is a low voltage, and the potential of the first node P1 is a low voltage to reduce the noise.

Optionally, the first control sub-circuit includes a first transistor, a fifth transistor and a control capacitor, the second control sub-circuit includes a sixth transistor, and the first node control sub-circuit includes a seventh transistor and an eighth transistor, A control electrode of the first transistor is electrically connected to the first clock signal terminal, a first electrode of the first transistor is electrically connected to the first voltage terminal, and a second electrode of the first transistor is electrically connected to the fourth node;

A control electrode of the fifth transistor is electrically connected to the second node, a first electrode of the fifth transistor is electrically connected to the fourth node, and a second electrode of the fifth transistor is electrically connected to the first clock signal terminal;

A first terminal of the control capacitor is electrically connected to the fourth node, and a second terminal of the control capacitor is electrically connected to the fifth node;

A control electrode of the sixth transistor is electrically connected to the fourth node, a first electrode of the sixth transistor is electrically connected to the second clock signal terminal, and a second electrode of the sixth transistor is electrically connected to the fifth node;

A control electrode of the seventh transistor is electrically connected to the second clock signal terminal, a first electrode of the seventh transistor is electrically connected to the fifth node, a the second electrode of the seventh transistor is electrically connected to the first node;

A control electrode of the eighth transistor is electrically connected to the second node, a first electrode of the eighth transistor is electrically connected to the first node, and a second electrode of the eighth transistor is electrically connected to the second voltage terminal.

Figure 6:
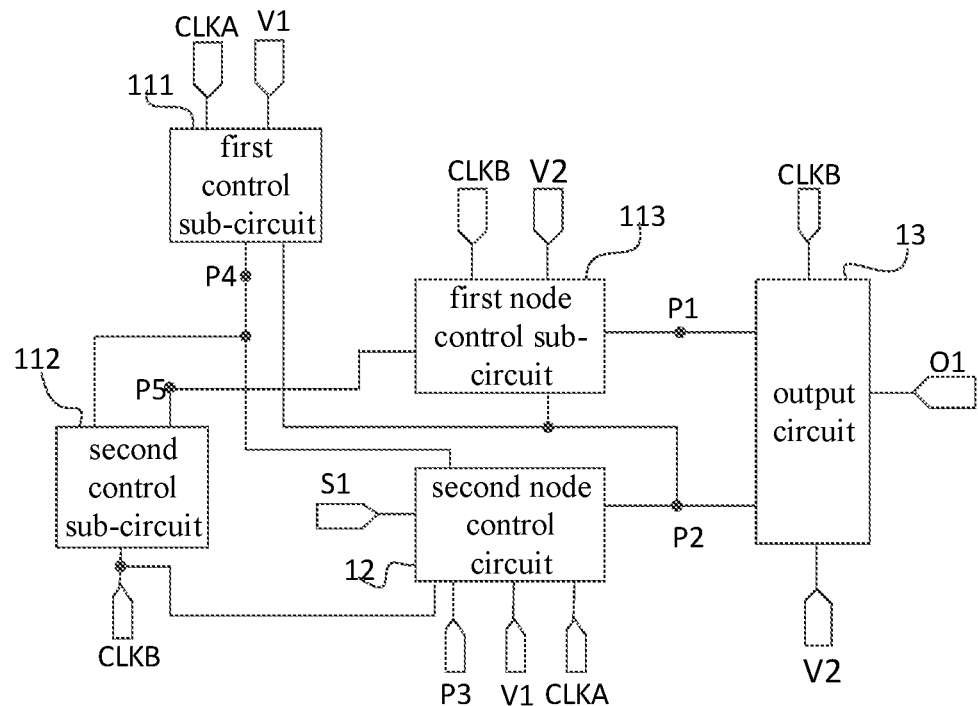
FIG. 6 is a structural diagram of a shift register unit according to at least one embodiment of the present disclosure.

As shown in FIG. 6, on the basis of at least one embodiment of the shift register unit shown in FIG. 5, the second node control circuit 12 may also be connected to the second clock signal terminal CLKB and the fourth node P4, and is also configured to control to connect the second node P2 and the second voltage terminal V2 under the control of the potential of the fourth node P4 and the second clock signal provided by the second clock signal terminal CLKB.

Optionally, the second node control circuit includes a second transistor, a third transistor, a fourth transistor, a ninth transistor, and a tenth transistor, wherein, A control electrode of the second transistor and a first electrode of the second transistor are both electrically connected to the first voltage terminal, and a second electrode of the second transistor is electrically connected to the third node;

A control electrode of the third transistor is electrically connected to the initial voltage terminal, a first electrode of the third transistor is electrically connected to the third node, and a second electrode of the third transistor is electrically connected to the second voltage terminal;

A control electrode of the fourth transistor is electrically connected to the first clock signal terminal, a first electrode of the fourth transistor is electrically connected to the third node, and a second electrode of the fourth transistor is electrically connected to the second node;

A control electrode of the ninth transistor is electrically connected to the fourth node, and a first electrode of the ninth transistor is electrically connected to the second voltage terminal;

A control electrode of the tenth transistor is electrically connected to the second clock signal terminal, a first electrode of the tenth transistor is electrically connected to a second electrode of the ninth transistor, and a second electrode of the tenth transistor is electrically connected to the second node.

Figure 7A:
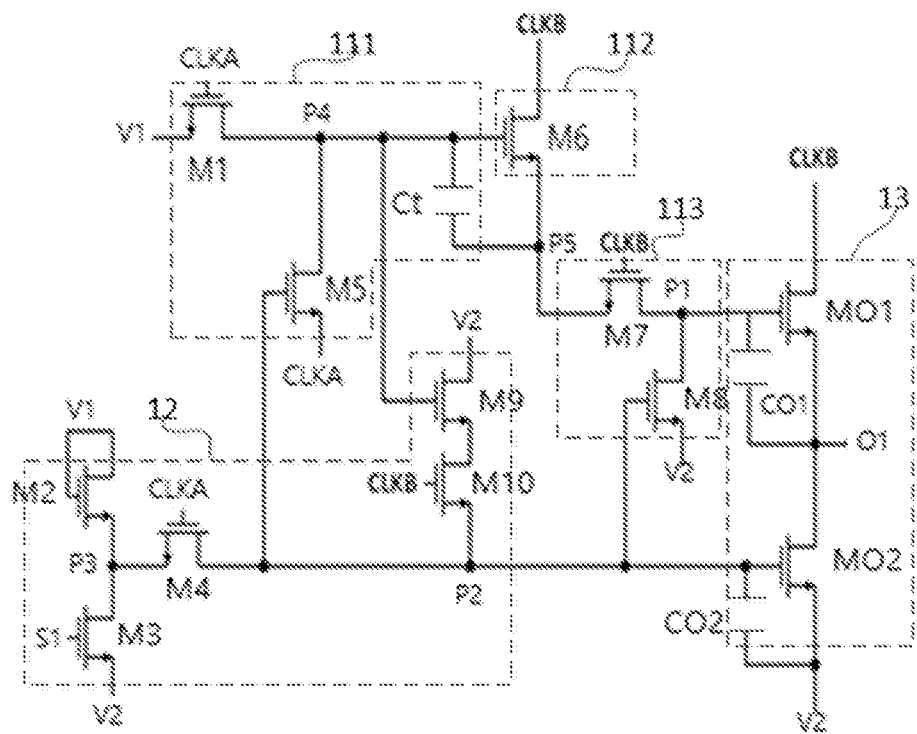
FIG. 7A is a circuit diagram of the shift register unit according to a second embodiment of the present disclosure.

As shown in FIG. 7A, the shift register unit described in the present disclosure includes a first node control circuit, a second node control circuit 12 and an output circuit 13;

The first node control circuit includes a first control sub-circuit 111, a second control sub-circuit 112 and a first node control sub-circuit 113;

The first control sub-circuit 111 includes a first transistor M1, a fifth transistor M5 and a control capacitor Ct, the second control sub-circuit 112 includes a sixth transistor M6, and the first node control sub-circuit 113 includes a seventh transistor M7 and the eighth transistor M8, wherein, The gate electrode of the first transistor M1 is electrically connected to the first clock signal terminal CLKA, the drain electrode of the first transistor M1 is electrically connected to the first voltage terminal V1, and the source electrode of the first transistor M1 electrically connected to the fourth node P4;

The gate electrode of the fifth transistor M5 is electrically connected to the second node P2, the drain electrode of the fifth transistor M5 is electrically connected to the fourth node P4, and the source electrode of the fifth transistor M5 is electrically connected to the first clock signal terminal CLKA;

The first terminal of the control capacitor Ct is electrically connected to the fourth node P4, and the second terminal of the control capacitor Ct is electrically connected to the fifth node P5;

The gate electrode of the sixth transistor M6 is electrically connected to the fourth node P4, the drain electrode of the sixth transistor M6 is electrically connected to the second clock signal terminal CLKB, and the source electrode of the sixth transistor M6 is electrically connected electrically connected to the fifth node P5;

The gate electrode of the seventh transistor M7 is electrically connected to the second clock signal terminal CLKB, the drain electrode of the seventh transistor M7 is electrically connected to the fifth node P5, and the source electrode of the seventh transistor M7 is electrically connected to the first node P1;

The gate electrode of the eighth transistor M8 is electrically connected to the second node P2, the drain electrode of the eighth transistor M8 is electrically connected to the first node P1, and the source electrode of the eighth transistor M8 is electrically connected to the second voltage terminal V2;

The second node control circuit 12 includes a second transistor M2, a third transistor M3, a fourth transistor M4, a ninth transistor M9 and a tenth transistor M10, wherein, The gate electrode of the second transistor M2 and the drain electrode of the second transistor M2 are both electrically connected to the first voltage terminal V1, and the source electrode of the second transistor M2 is electrically connected to the third node P3;

The gate electrode of the third transistor M3 is electrically connected to the initial voltage terminal S1, the drain electrode of the third transistor M3 is electrically connected to the third node P3, and the source electrode of the third transistor M3 is electrically connected to the second voltage terminal V2;

The gate electrode of the fourth transistor M4 is electrically connected to the first clock signal terminal CLKA, the drain electrode of the fourth transistor M4 is electrically connected to the third node P3, and the source electrode of the fourth transistor M4 is electrically connected to the second node P2;

The gate electrode of the ninth transistor M9 is electrically connected to the fourth node P4, and the drain electrode of the ninth transistor M9 is electrically connected to the second voltage terminal V2;

The gate electrode of the tenth transistor M10 is electrically connected to the second clock signal terminal CLKB, the drain electrode of the tenth transistor M10 is electrically connected to the source electrode of the ninth transistor M9, and the drain electrode of the tenth transistor M10 is electrically connected to the second node P2;

The output circuit 13 includes a first output transistor MO1, a second output transistor MO2, a first output capacitor CO1 and a second output capacitor CO2;

The gate electrode of the first output transistor MO1 is electrically connected to the first node P1, the drain electrode of the first output transistor MO1 is electrically connected to the second clock signal terminal CLKA, and the drain electrode of the first output transistor MO1 is electrically connected to the output terminal O1;

The first terminal of the first output capacitor CO1 is electrically connected to the first node P1, and the second terminal of the first output capacitor CO1 is electrically connected to the output terminal O1;

The gate electrode of the second output transistor MO2 is electrically connected to the second node P2, the drain electrode of the second output transistor MO2 is electrically connected to the output terminal O1, and the source electrode of the second output transistor MO2 is electrically connected to the second voltage terminal;

The first terminal of the second output capacitor CO2 is electrically connected to the second node P2, and the second terminal of the second output capacitor CO2 is electrically connected to the second voltage terminal V2.

In the shift register unit shown in FIG. 7A of the present disclosure, the width-to-length ratio of M3 is greater than the width-to-length ratio of M2, but not limited thereto.

In the shift register unit shown in FIG. 7A of the present disclosure, all transistors are n-type thin film transistors, but not limited thereto.

In the second specific embodiment of the shift register unit shown in FIG. 7A, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

Figure 8:
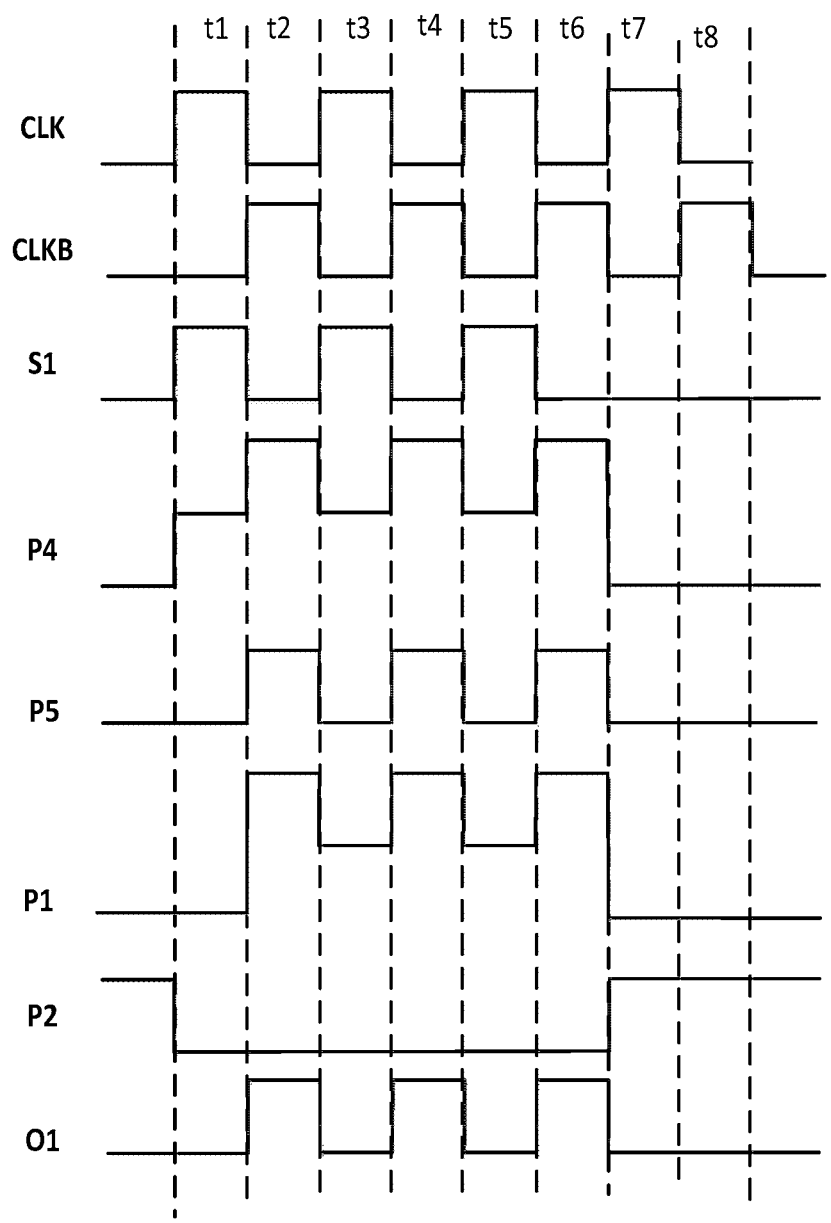
FIG. 8 is a working timing diagrams of the shift register units according to the second embodiment and the third embodiment of the present disclosure.

As shown in FIG. 8, when the shift register unit shown in FIG. 7A of the present disclosure is in operation, In a time period before the first time period t1, the potential of P1 is a low voltage, and O1 outputs a low voltage;

In a first time period t1, CLKA provides a high voltage, CLKB provides a low voltage, S1 provides a high voltage, M1 is turned on, M2 is turned on, M3 is turned on, the potential of P3 is a low voltage, M4 is turned on, the potential of P2 is a low voltage, and the potential of P4 is a low voltage, M6 is turned on, the potential of P5 is a low voltage, M7 is turned off, M8 is turned off, the potential of P1 remains at a low voltage, MO1 and MO2 are turned off, and O1 continues to output a low voltage;

In a second time period t2, CLKA provides a low voltage, CLKB provides a high voltage, S1 provides a low voltage, M1 is turned off, M2 is turned on, M3 is turned off, the potential of P3 is a high voltage, M4 is turned off, and M6 is turned on to control the potential of P4 to be pulled up by the bootstrapping, M9 and M10 are both turned on, the potential of P2 is a low voltage, M8 is turned off, the potential of P5 is a high voltage, M7 is turned on, the potential of P1 is a high voltage, MO1 is turned on, MO2 is turned off, and O1 outputs a high voltage;

In a third time period t3, CLKA provides a high voltage, CLKB provides a low voltage, S1 provides a high voltage, M1 is turned on, M2 is turned on, M3 is turned on, the potential of P3 is a low voltage, M4 is turned on, and the potential of P2 is a low voltage, M5 is turned off, the potential of P4 is a high voltage, M6 is turned on, the potential of P5 is a low voltage, M7 is turned off, M8 is turned off, the potential of P1 is a high voltage, MO1 is turned on, MO2 is turned off, O1 outputs a low voltage;

In a fourth time period t4, CLKA provides a low voltage, CLKB provides a high voltage, S1 provides a low voltage, M1 is turned off, M2 is turned on, M3 is turned off, the potential of P3 is a high voltage, M4 is turned off, and the potential of P4 is pulled up by the bootstrapping, M9 and M10 are both turned on, the potential of P2 is a low voltage, M5 is turned off, M8 is turned off, M6 is turned on, the potential of P5 is a high voltage, M7 is turned on, the potential of P1 is a high voltage, MO1 is turned on, MO2 is turned off, O1 outputs a high voltage;

In a fifth time period t5, CLKA provides a high voltage, CLKB provides a low voltage, S1 provides a high voltage, M1 is turned on, M2 is turned on, M3 is turned on, the potential of P3 is a low voltage, M4 is turned on, and the potential of P2 is a low voltage, the potential of P4 is a high voltage, M6 is turned on, the potential of P5 is a low voltage, M7 is turned off, M8 is turned off, the potential of P1 is maintained at a high voltage, MO1 is turned on, MO2 is turned off, and O1 outputs a low voltage;

In a sixth time period t6, CLKA provides a low voltage, CLKB provides a high voltage, S1 provides a low voltage, M1 is turned off, M2 is turned on, M3 is turned off, the potential of P3 is a high voltage, M4 is turned off, and the potential of P4 is pulled up by the bootstrapping, M9 and M10 are both turned on, M6 is turned on, the potential of P5 is a high voltage, the potential of P2 is a low voltage, M8 is turned off, M7 is turned on, the potential of P1 is a high voltage, MO1 is turned on, MO2 is turned off, O1 outputs a high voltage;

In a seventh time period t7, CLKA provides a high voltage, CLKB provides a low voltage, S1 provides a low voltage, M1 is turned on, M2 is turned on, M3 is turned off, the potential of P3 is a high voltage, M4 is turned on, and the potential of P2 is a high voltage, M5 is turned on, the potential of P4 is a high voltage, M6 is turned on, M7 is turned off, M8 is turned on, the potential of P1 is a low voltage, MO1 is turned off, MO2 is turned on, and O1 outputs a low voltage;

In an eighth time period t8, CLKA provides a low voltage, CLKB provides a high voltage, S1 provides a low voltage, M1 is turned off, M2 is turned on, M3 is turned off, the potential of P3 is a high voltage, M4 is turned off, and the potential of P2 is maintained at a high voltage, M5 turns on, the potential of P4 is a low voltage, M6 is turned on, the potential of P5 is a high voltage, M7 is turned on, M8 is turned on, the potential of P1 is a low voltage, MO1 is turned off, MO2 is turned on, O1 outputs a low voltage.

In FIG. 8, the input time period is labeled t1, the reset time period is labeled t7, and the output time period is labeled t2-t6.

Figure 7B:
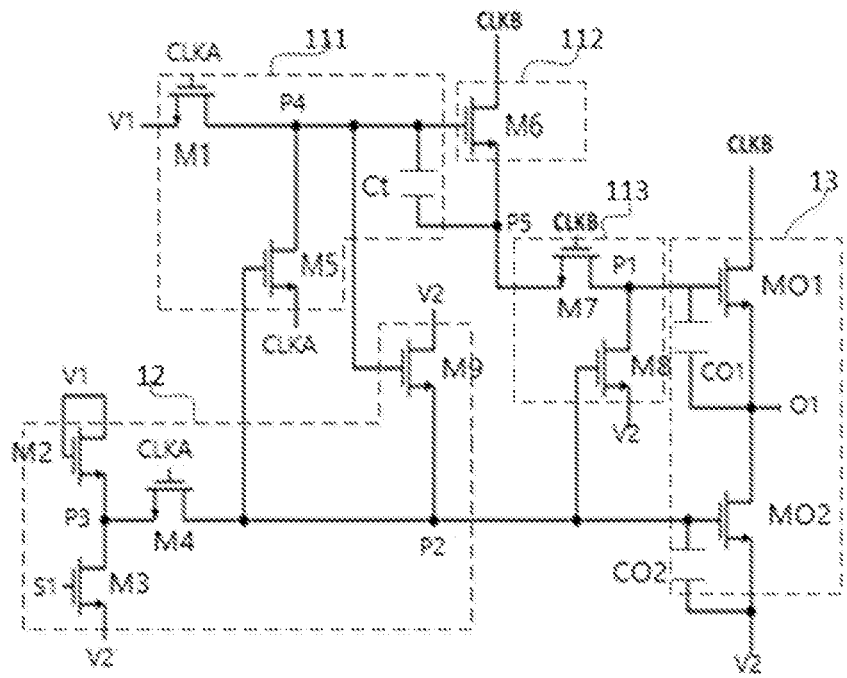
FIG. 7B is a circuit diagram of the shift register unit according to a third embodiment of the present disclosure.

As shown in FIG. 7B, the shift register unit described in the present disclosure includes a first node control circuit, a second node control circuit 12 and an output circuit 13;

The first node control circuit includes a first control sub-circuit 111, a second control sub-circuit 112 and a first node control sub-circuit 113;

The first control sub-circuit 111 includes a first transistor M1, a fifth transistor M5 and a control capacitor Ct, the second control sub-circuit 112 includes a sixth transistor M6, and the first node control sub-circuit 113 includes a seventh transistor M7 and the eighth transistor M8, wherein, The gate electrode of the first transistor M1 is electrically connected to the first clock signal terminal CLKA, the drain electrode of the first transistor M1 is electrically connected to the first voltage terminal V1, and the source electrode of the first transistor M1 electrically connected to the fourth node P4;

The gate electrode of the fifth transistor M5 is electrically connected to the second node P2, the drain electrode of the fifth transistor M5 is electrically connected to the fourth node P4, and the source electrode of the fifth transistor M5 is electrically connected to the first clock signal terminal CLKA;

The first terminal of the control capacitor Ct is electrically connected to the fourth node P4, and the second terminal of the control capacitor Ct is electrically connected to the fifth node P5;

The gate electrode of the sixth transistor M6 is electrically connected to the fourth node P4, the drain electrode of the sixth transistor M6 is electrically connected to the second clock signal terminal CLKB, and the source electrode of the sixth transistor M6 is electrically connected to the fifth node P5;

The gate electrode of the seventh transistor M7 is electrically connected to the second clock signal terminal CLKB, the drain electrode of the seventh transistor M7 is electrically connected to the fifth node P5, and the source electrode of the seventh transistor M7 is electrically connected to the first node P1;

The gate electrode of the eighth transistor M8 is electrically connected to the second node P2, the drain electrode of the eighth transistor M8 is electrically connected to the first node P1, and the source electrode of the eighth transistor M8 is electrically connected to the second voltage terminal V2;

The second node control circuit 12 includes a second transistor M2, a third transistor M3, a fourth transistor M4 and a ninth transistor M9, wherein, The gate electrode of the second transistor M2 and the drain electrode of the second transistor M2 are both electrically connected to the first voltage terminal V1, and the source electrode of the second transistor M2 is electrically connected to the third node P3;

The gate electrode of the third transistor M3 is electrically connected to the initial voltage terminal S1, the drain electrode of the third transistor M3 is electrically connected to the third node P3, and the source electrode of the third transistor M3 is electrically connected to the second voltage terminal V2;

The gate electrode of the fourth transistor M4 is electrically connected to the first clock signal terminal CLKA, the drain electrode of the fourth transistor M4 is electrically connected to the third node P3, and the source electrode of the fourth transistor M4 is electrically connected to the second node P2;

The gate electrode of the ninth transistor M9 is electrically connected to the fourth node P4, the drain electrode of the ninth transistor M9 is electrically connected to the second voltage terminal V2, and the source electrode of the ninth transistor M9 is electrically connected to the second node P2;

The output circuit 13 includes a first output transistor MO1, a second output transistor MO2, a first output capacitor CO1 and a second output capacitor CO2;

The gate electrode of the first output transistor MO1 is electrically connected to the first node P1, the drain electrode of the first output transistor MO1 is electrically connected to the second clock signal terminal CLKA, and the source electrode of the first output transistor MO1 is electrically connected to output terminal O1, The first terminal of the first output capacitor CO1 is electrically connected to the first node P1, and the second terminal of the first output capacitor CO1 is electrically connected to the output terminal O1;

The gate electrode of the second output transistor MO2 is electrically connected to the second node P2, the drain electrode of the second output transistor MO2 is electrically connected to the output terminal O1, and the source electrode of the second output transistor MO2 is electrically connected to the second voltage terminal;

The first terminal of the second output capacitor CO2 is electrically connected to the second node P2, and the second terminal of the second output capacitor CO2 is electrically connected to the second voltage terminal V2.

In the shift register unit shown in FIG. 7B of the present disclosure, the width-to-length ratio of M3 is greater than the width-to-length ratio of M2, but not limited thereto.

In the third specific embodiment of the shift register unit shown in FIG. 7B of the present disclosure, all transistors are n-type thin film transistors, but not limited thereto.

In the shift register unit shown in FIG. 7B, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

As shown in FIG. 8, when the shift register unit shown in FIG. 7B of the present disclosure is in operation, In a time period before the first time period t1, the potential of P1 is a low voltage, and O1 outputs a low voltage;

In a first time period t1, CLKA provides a high voltage, CLKB provides a low voltage, S1 provides a high voltage, M1 is turned on, M2 is turned on, M3 is turned on, the potential of P3 is a low voltage, M4 is turned on, the potential of P2 is a low voltage, and the potential of P4 is a high voltage, M6 is turned on, the potential of P5 is a low voltage, M7 is turned off, M8 is turned off, the potential of P1 remains at a low voltage, MO1 and MO2 are turned off, and O1 continues to output a low voltage;

In a second time period t2, CLKA provides a low voltage, CLKB provides a high voltage, S1 provides a low voltage, M1 is turned off, M2 is turned on, M3 is turned off, the potential of P3 is a high voltage, M4 is turned off, and M6 is turned on to control to pull up the potential of P4 by the bootstrapping, M9 is turned on, the potential of P2 is low voltage, M8 is turned off, the potential of P5 is a high voltage, M7 is turned on, the potential of P1 is a high voltage, MO1 is turned on, MO2 is turned off, and O1 outputs a high voltage;

In a third time period t3, CLKA provides a high voltage, CLKB provides a low voltage, S1 provides a high voltage, M1 is turned on, M2 is turned on, M3 is turned on, the potential of P3 is a low voltage, M4 is turned on, and the potential of P2 is a low voltage, M5 is turned off, the potential of P4 is a high voltage, M6 is turned on, the potential of P5 is a low voltage, M7 is turned off, M8 is turned off, the potential of P1 is a high voltage, MO1 is turned on, MO2 is turned off, O1 outputs a low voltage;

In a fourth time period t4, CLKA provides a low voltage, CLKB provides a high voltage, S1 provides a low voltage, M1 is turned off, M2 is turned on, M3 is turned off, the potential of P3 is a high voltage, M4 is turned off, and the potential of P4 is pulled up by the bootstrap, M9 is turned on, the potential of P2 is a low voltage, M5 is turned off, M8 is turned off, M6 is turned on, the potential of P5 is a high voltage, M7 is turned on, the potential of P1 is a high voltage, MO1 is turned on, MO2 is turned off, O1 output a high voltage;

In a fifth time period t5, CLKA provides a high voltage, CLKB provides a low voltage, S1 provides a high voltage, M1 is turned on, M2 is turned on, M3 is turned on, the potential of P3 is a low voltage, M4 is turned on, and the potential of P2 is a low voltage, the potential of P4 is a high voltage, M6 is turned on, the potential of P5 is a low voltage, M7 is turned off, M8 is turned off, the potential of P1 is maintained at a high voltage, MO1 is turned on, MO2 is turned off, and O1 outputs a low voltage;

In a sixth time period t6, CLKA provides a low voltage, CLKB provides a high voltage, S1 provides a low voltage, M1 is turned off, M2 is turned on, M3 is turned off, the potential of P3 is a high voltage, M4 is turned off, and the potential of P4 is pulled up by the bootstrap, M9 is turned on, M6 is turned on, the potential of P5 is a high voltage, the potential of P2 is a low voltage, M8 is turned off, M7 is turned on, the potential of P1 is a high voltage, MO1 is turned on, MO2 is turned off, and O1 outputs a high voltage;

In a seventh time period t7, CLKA provides a high voltage, CLKB provides a low voltage, S1 provides a low voltage, M1 is turned on, M2 is turned on, M3 is turned off, the potential of P3 is a high voltage, M4 is turned on, and the potential of P2 is a high voltage, M5 is turned on, the potential of P4 is a high voltage, M6 is turned on, M7 is turned off, M8 is turned on, the potential of P1 is a low voltage, MO1 is turned off, MO2 is turned on, and O1 outputs a low voltage;

In an eighth time period t8, CLKA provides a low voltage, CLKB provides a high voltage, S1 provides a low voltage, M1 is turned off, M2 is turned on, M3 is turned off, the potential of P3 is a high voltage, M4 is turned off, and the potential of P2 is maintained at a high voltage, M5 is turned on, the potential of P4 is a low voltage, M6 is turned on, the potential of P5 is a high voltage, M7 is turned on, M8 is turned on, the potential of P1 is a low voltage, MO1 is turned off, MO2 is turned on, O1 outputs a low voltage.

The driving method described in at least one embodiment of the present disclosure is applied to the above-mentioned shift register unit, and the driving method includes:

Controlling, by the first node control circuit, the potential of the first node;

Controlling, by the second node control circuit, the potential of the third node under the control of the first voltage signal and the initial voltage signal, and controlling to connect to disconnect the third node and the second node under the control of the first clock signal;

Controlling, by the output circuit, to connect or disconnect the output terminal and the second clock signal terminal under the control of the potential of the first node, and controlling to connect or disconnect the output terminal and the second voltage terminal under the control of the potential of the second node.

Based on the driving method described in at least one embodiment of the present disclosure, the shift register unit can output a pulse signal, the pulse signal is a multi-pulse signal, and the pulse data is adjustable, so as to correspond to the threshold voltage compensation time required by different internal compensation circuits (the internal compensation circuit is included in the pixel circuit).

In at least one embodiment of the present disclosure, the step of controlling, by the first node control circuit, the potential of the first node may include:

Controlling, by the first node control circuit, the potential of the first node according to a first clock signal and an initial voltage signal.

In a specific implementation, the first node control circuit may include a first control sub-circuit, a second control sub-circuit and a first node control sub-circuit; the step of controlling, by the first node control circuit, the potential of the first node includes:

Controlling, by the first control sub-circuit, to connect or disconnect the fourth node and the first voltage terminal under the control of the first clock signal, and controlling, by the first control sub-circuit, to connect or disconnect the fourth node and the first clock signal terminal under the control of the potential of the second node, and maintaining, by the first control sub-circuit, the potential of the fourth node;

Controlling, by the second control sub-circuit, to connect or disconnect the fifth node and the second clock signal terminal under the control of the potential of the fourth node;

Controlling, by the first node control sub-circuit, to connect or disconnect the first node and the fifth node under the control of the second clock signal, and controlling, by the first node control sub-circuit, to connect or disconnect the first node and the second voltage terminal under the control of the potential of the second node.

Specifically, the driving method according to at least one embodiment of the present disclosure may further include: controlling, by the second node control circuit, to connect or disconnect the second node and the second voltage terminal under the control of the potential of the fourth node and the second clock signal.

The gate driving circuit according to at least one embodiment of the present disclosure includes a plurality of stages of the above-mentioned shift register unit;

Except for the first stage of shift register unit, an initial voltage terminal of each stage of the shift register unit is electrically connected to an output terminal of an adjacent previous stage of the shift register unit.

Figure 9:
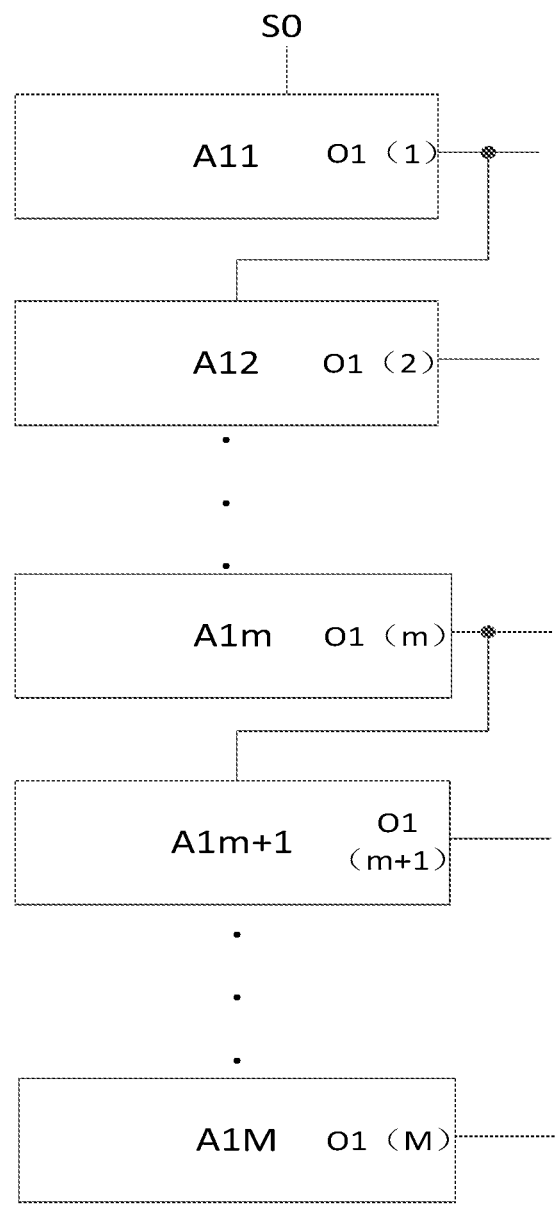
FIG. 9 is a structural diagram of a gate driving circuit according to at least one embodiment of the present disclosure.

As shown in FIG. 9, the gate driving circuit according to at least one embodiment of the present disclosure includes a plurality of the above-mentioned shift register units that are connected in series;

The first stage of shift register unit is labeled A11, and the output terminal of A11 is labeled O1(1);

The second stage of shift register unit is labeled A12, and the output terminal of A12 is labeled O1(2);

The m-th stage of shift register unit is labeled A1$m$, and the output terminal of A1$m$ is labeled O1($m$);

The (m+1)-th stage of shift register unit is labeled A1$m$+1, and the output terminal of A1$m$+1 is labeled O1($m$+1);

The M-th stage of shift register unit is labeled A1M, and the output terminal of A1M is labeled O1(M);

m is an integer greater than 2, and M is a positive integer greater than 3;

The initial voltage terminal of A11 is connected to the initial voltage signal S0, and the initial voltage terminal of A12 is electrically connected to O1(1);

The initial voltage terminal of A1$m$+1 is electrically connected to O1($m$).

The display device according to at least one embodiment of the present disclosure includes the above-mentioned gate driving circuit.

Figure 10:
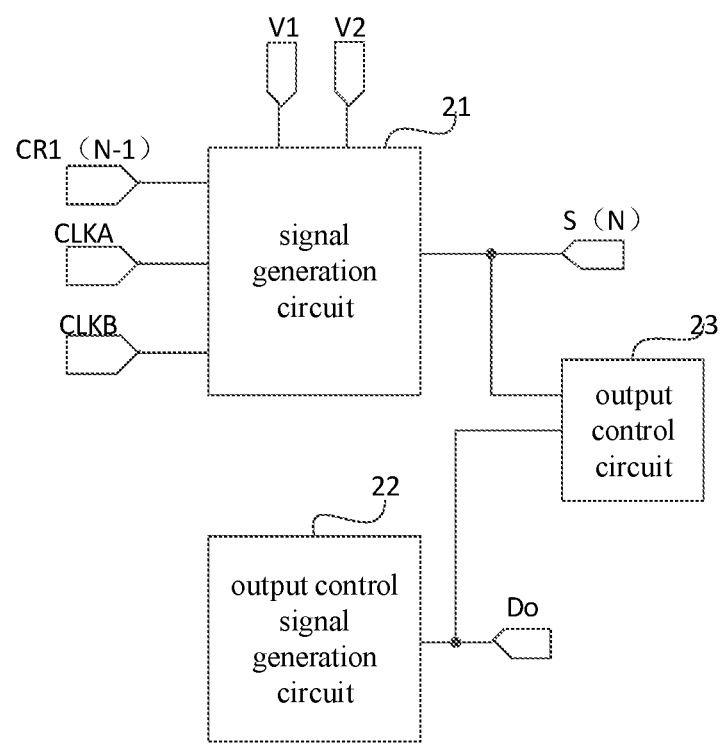
FIG. 10 is a structural diagram of a signal generation unit circuit according to at least one embodiment of the present disclosure.

As shown in FIG. 10, the signal generation unit circuit described in at least one embodiment of the present disclosure includes a signal generation circuit 21, an output control signal generation circuit 22 and an output control circuit 23, wherein, The signal generation circuit 21 is respectively connected to the (N−1)th stage of first carry signal terminal CR1 (N−1), the first clock signal terminal CLKA, the second clock signal terminal CLKB, the first signal output terminal S(N), the first voltage terminal V1 and a second voltage terminal V2, is used to generate the N-th stage of first carry signal according to the (N−1)th stage of first carry signal, the first clock signal, the second clock signal, the first voltage signal and the second voltage signal, control the potential of the second node P2, and control to connect the first signal output terminal S(N) and the first voltage terminal V1 under the control of the N-th stage of first carry signal, control to connect the first signal output terminal S(N) and the second voltage terminal V2 under the control of the potential of the second node P2;

The output control signal generation circuit 22 is electrically connected to the output control terminal Do, and is used to control the potential of the output control terminal Do;

The output control circuit 23 is electrically connected to the output control terminal Do and the first signal output terminal S(N), and is used to control the scan signal outputted by the first signal output terminal S(N) under the control of the output control signal provided by the output control terminal Do.

The first clock signal terminal CLKA is used to provide the first clock signal, the second clock signal terminal CLKB is used to provide the second clock signal; the (N−1)th stage of first carry signal terminal is used to provide the (N−1)th stage of first carry signal; the first voltage terminal is used to provide the first voltage signal, and the second voltage terminal is used to provide the second voltage signal;

N is a positive integer.

The scan signal outputted by the signal generation unit circuit through the first signal output terminal S(N) may be a pulse signal, and the pulse signal may be a multi-pulse signal, and the number of pulses and the pulse width are adjustable, and the pulse of the scan signal can have two different pulse widths, so as to correspond to the time required for frequency multiplication of the data voltage and the threshold voltage compensation time required by the internal compensation circuit (the internal compensation circuit is included in the pixel circuit).

In at least one embodiment of the present disclosure, when N is equal to 1, the (N−1)th stage of first carry signal terminal CR1 (N−1) may be a first initial carry signal terminal, and the first initial carry signal terminal is used to provide the first initial carry signal, but not limited to this.

In at least one embodiment of the present disclosure, the first voltage signal may be a high voltage signal, and the second voltage signal may be a low voltage signal, but not limited thereto.

In the related art, the internal compensation circuit in the pixel circuit usually needs many time compensation threshold voltage offset, and at the same time, due to the frequency multiplication of the data voltage, two pulse combinations with different pulse widths need to be set. Based on this, the signal generation single circuit can provide a multi-pulse signal, and the number of pulses and the pulse width are adjustable, and the pulses of the scan signal can have two different pulse widths.

Figure 11:
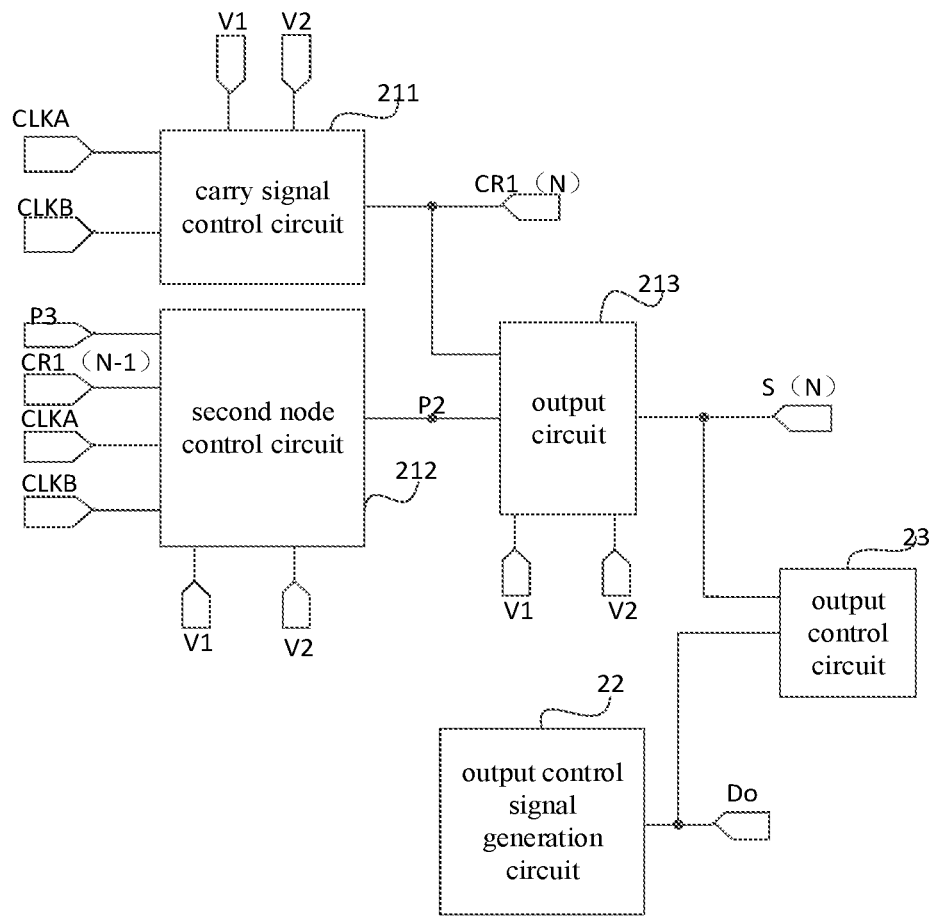
FIG. 11 is a structural diagram of a signal generation unit circuit according to at least one embodiment of the present disclosure.

In specific implementation, based on the signal generation unit circuit shown in FIG. 10, as shown in FIG. 11, the signal generation circuit may include a carry signal control circuit 211, a second node control circuit 212 and an output circuit 213, wherein, The carry signal control circuit 211 is electrically connected to the first clock signal terminal CLKA, the second clock signal terminal CLKB, the first voltage terminal V1, the second voltage terminal V2 and the N-th stage of first carry signal output terminal CR1(N), is configured to generate and output the N-th stage of first carry signal through the N-th stage of first carry signal output terminal CR1 (N) according to the first clock signal, the second clock signal, the first voltage signal and the second voltage signal;

The second node control circuit 212 is connected to the second node P2, the third node P3, the first voltage terminal V1, the (N−1)th stage of first carry signal terminal CR1 (N−1), the first clock signal terminal CLKA, the second clock signal terminal CLKB and the second voltage terminal V2, and is used to control the potential of the third node P3 under the control of the first voltage signal and the (N−1)th stage of first carry signal, and control to connect the third node P3 and the second node P2 under the control of the first clock signal;

The output circuit 213 is electrically connected to the first signal output terminal S(N), the N-th stage of first carry signal terminal CR1(N), the second node P2, the first voltage terminal V1 and the second voltage terminal V2, is used to control and maintain the potential of the N-th stage of first carry signal and the potential of the second node, and control to connect the first signal output terminal S(N) and the first voltage terminal V1 under the control of the N-th stage of first voltage terminal V1, and control to connect the first signal output terminal S(N) and the second voltage terminal V2 under the control of the potential of the second node P2.

In at least one embodiment of the present disclosure, the signal generation circuit may include a carry signal control circuit 211, a second node control circuit 212 and an output circuit 213, and the carry signal control circuit 211 controls to output the N-th stage of first carry signal, the second node control circuit 212 controls the potential of the second node P2, and the output circuit 213 controls the first signal output terminal S(N) to output the scan signal under the control of the N-th stage of first carry signal and the potential of the second node P2.

Figure 12:
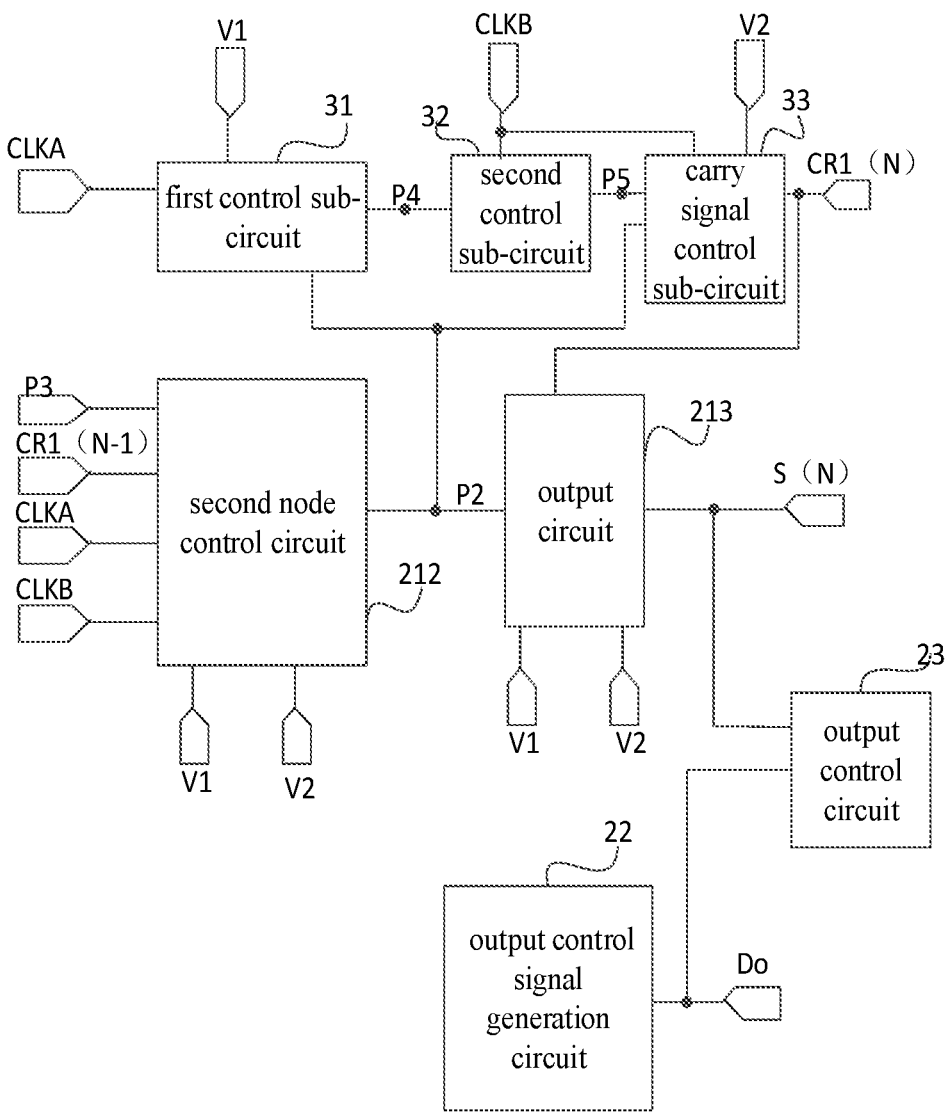
FIG. 12 is a structural diagram of a signal generation unit circuit according to at least one embodiment of the present disclosure.

In at least one embodiment of the present disclosure, on the basis of the embodiment of the signal generation unit circuit shown in FIG. 11, as shown in FIG. 12, the carry signal control circuit may include a first control sub-circuit 31, a second control sub-circuit 32 and a carry signal control sub-circuit 33;

The first control sub-circuit 31 is electrically connected to the first voltage terminal V1, the first clock signal terminal CLKA, the second node P2 and the fourth node P4, and is used to control to connect the fourth node P4 and the first voltage terminal V1 under the control of the first clock signal, and control to connect the fourth node P4 and the first clock signal terminal CLKA under the control of the potential of the second node P2, and used to maintain the potential of the fourth node P4;

The second control sub-circuit 32 is electrically connected to the fourth node P4, the second clock signal terminal CLKB and the fifth node P5, and is used to control to connect the fifth node P5 and the second clock signal terminal CLKB under the control of the potential of the fourth node P4;

The carry signal control sub-circuit 33 is respectively connected to the second clock signal terminal CLKB, the fifth node P5, the N-th stage of first carry signal terminal CR1 (N), the second node P2 and the second voltage terminal V2, and configured to control to connect the N-th stage of first carry signal terminal CR1 (N) and the fifth node P5 under the control of the second clock signal provided by the second clock signal terminal CLKB, and control to connect the N-th stage of first carry signal terminal CR1 (N) and the second voltage terminal V2 under the control of the potential of the second node P2.

In at least one embodiment of the present disclosure, N may be a positive integer, but is not limited thereto.

In a specific implementation, the carry signal control circuit may include a first control sub-circuit 31, a second control sub-circuit 32 and a carry signal control sub-circuit 33. The first control sub-circuit 31 controls the potential of the fourth node P4, and the second control sub-circuit 32 controls the potential of the fifth node P5, and the carry signal control sub-circuit 33 controls the N-th stage of first carry signal outputted by the N-th stage of first carry signal terminal CR1(N).

Optionally, the first control sub-circuit includes a first control transistor, a second control transistor and a control capacitor, the second control sub-circuit includes a third control transistor, and the carry signal control sub-circuit includes a fourth control transistor and a fifth control transistor, wherein, A control electrode of the first control transistor is electrically connected to the first clock signal terminal, a first electrode of the first control transistor is electrically connected to the first voltage terminal, and a second electrode of the first control transistor is electrically connected to the fourth node;

A control electrode of the second control transistor is electrically connected to the second node, a first electrode of the second control transistor is electrically connected to the fourth node, and a second electrode of the second control transistor is electrically connected to the first clock signal terminal;

A first terminal of the control capacitor is electrically connected to the fourth node, and a second terminal of the control capacitor is electrically connected to the fifth node;

A control electrode of the third control transistor is electrically connected to the fourth node, a first electrode of the third control transistor is electrically connected to the second clock signal terminal, and a second electrode of the third control transistor is electrically connected to the fifth node;

A control electrode of the fourth control transistor is electrically connected to the second clock signal terminal, a first electrode of the fourth control transistor is electrically connected to the fifth node, and a second electrode of the fourth control transistor is electrically connected to the N-th stage of first carry signal terminal;

A control electrode of the fifth control transistor is electrically connected to the second node, a first electrode of the fifth control transistor is electrically connected to the N-th stage of first carry signal terminal, and a second electrode of the fifth control transistor is electrically connected to the second voltage terminal.

Figure 13:
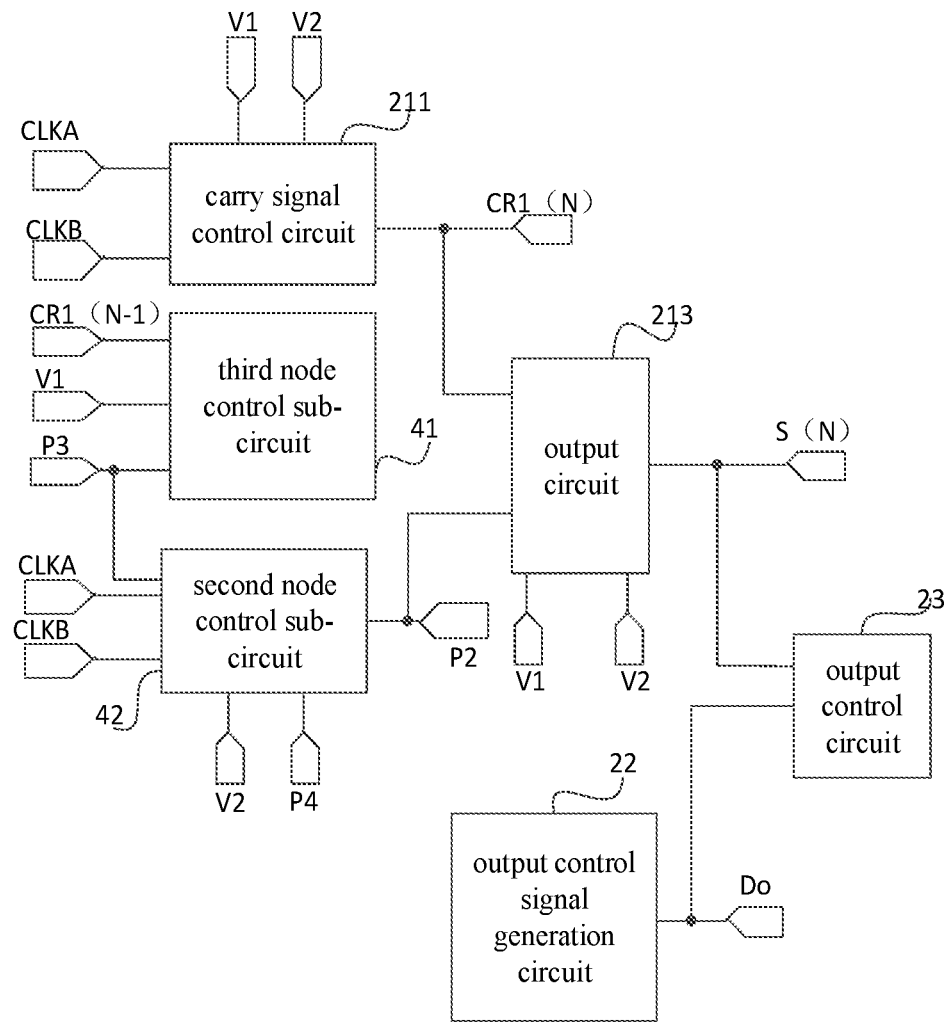
FIG. 13 is a structural diagram of a signal generation unit circuit according to at least one embodiment of the present disclosure.

In specific implementation, based on at least one embodiment of the signal generation unit circuit shown in FIG. 11, as shown in FIG. 13, the second node control circuit may include a third node control sub-circuit 41 and a second node control sub-circuit 42, wherein, The third node control sub-circuit 41 is electrically connected to the first voltage terminal V1, the (N−1)th stage of first carry signal terminal CR1 (N−1) and the third node P3, and is used to control the potential of the third node P3 under the control of the (N−1)th stage of first carry signal provided by CR1 (N−1);

The second node control sub-circuit 42 is electrically connected to the first clock signal terminal CLKA, the third node P3, the fourth node P4, the second clock signal terminal CLKB, the second voltage terminal V2 and the second node P2, is configured to control to connect the third node P3 and the second node P2 under the control of the first clock signal, and control to connect the second node P2 and the second voltage terminal V2 under the control of the potential of the fourth node P4 and the second clock signal.

In at least one embodiment of the present disclosure, the second node control circuit may include a third node control sub-circuit 41 and a second node control sub-circuit 42, the third node control sub-circuit 41 controls the potential of the third node P3, and the second node control sub-circuit 42 controls the potential of the second node P2.

Optionally, the second node control sub-circuit includes a sixth control transistor, a seventh control transistor and an eighth control transistor, wherein, A control electrode of the sixth control transistor is electrically connected to the first clock signal terminal, a first electrode of the sixth control transistor is electrically connected to the third node, and a second electrode of the sixth control transistor is electrically connected to the second node;

A control electrode of the seventh control transistor is electrically connected to the fourth node, and a first electrode of the seventh control transistor is electrically connected to the second voltage terminal;

A control electrode of the eighth control transistor is electrically connected to the second clock signal terminal, a first electrode of the eighth control transistor is electrically connected to a second electrode of the seventh control transistor, and the second electrode of the eighth control transistor is electrically connected to the second node.

Optionally, the third node control sub-circuit includes a ninth control transistor and a tenth control transistor, wherein, A control electrode of the ninth control transistor and the first electrode of the ninth control transistor are both electrically connected to the first voltage terminal;

A control electrode of the tenth control transistor is electrically connected to the (N−1)th stage of first carry signal terminal, a first electrode of the tenth control transistor is electrically connected to a first electrode of the ninth control transistor, and the second electrode of the ten control transistor is electrically connected to the second voltage terminal.

Optionally, the third node control sub-circuit includes a ninth control transistor, a tenth control transistor, an eleventh control transistor and a twelfth control transistor, wherein, A control electrode of the ninth control transistor is electrically connected to the first electrode of the ninth control transistor and the first voltage terminal;

A control electrode of the tenth control transistor is electrically connected to the (N−1)th stage of first carry signal terminal, a first electrode of the tenth control transistor is electrically connected to a second electrode of the ninth control transistor, and a second electrode of the tenth control transistor is electrically connected to the second voltage terminal;

A control electrode of the eleventh control transistor is electrically connected to the second electrode of the ninth control transistor, a first electrode of the eleventh control transistor is electrically connected to the first voltage terminal, and a second electrode of the eleventh control transistor is electrically connected to the third node;

A control electrode of the twelfth control transistor is electrically connected to the (N−1)th stage of first carry signal terminal, a first electrode of the twelfth control transistor is electrically connected to the third node, and the second electrode of twelfth control transistor is electrically connected to the second voltage terminal.

In a specific implementation, the output circuit may include a first output transistor, a second output transistor, a first output capacitor and a second output capacitor, wherein, A control electrode of the first output transistor is electrically connected to the N-th stage of first carry signal terminal, a first electrode of the first output transistor is electrically connected to the first voltage terminal, and a second electrode of the first output transistor is electrically connected to the first signal output terminal;

A control electrode of the second output transistor is electrically connected to the second node, a first electrode of the second output transistor is electrically connected to the first signal output terminal, and a second electrode of the second output transistor is electrically connected to the second voltage terminal;

A first terminal of the first output capacitor is electrically connected to the first voltage terminal, and a second terminal of the first output capacitor is electrically connected to the N-th stage of first carry signal terminal;

A first terminal of the second output capacitor is electrically connected to the second node, and a second terminal of the second output capacitor is electrically connected to the second voltage terminal.

In at least one embodiment of the present disclosure, the output control terminal may be an N-th stage of second carry signal terminal;

The output control signal generation circuit is connected to the (N−1)th stage of second carry signal terminal, the (N+5)th stage of second carry signal terminal, the N-th stage of second carry signal terminal, the first clock signal terminal and the second clock signal terminal, is configured to generate and output the N-th stage of second carry signal through the N-th stage of second carry signal terminal according to the (N−1)th stage of second carry signal, the (N+5)th stage of second carry signal, the first clock signal and the second clock signal;

The (N−1)th stage of second carry signal terminal is used to provide the (N−1)th stage of second carry signal, and the (N+5)th stage of second carry signal terminal is used to provide the (N+5)th stage of second carry signal.

During specific implementation, the output control signal generation circuit may generate the N-th stage of second carry signal according to the (N−1)th stage of second carry signal, the (N+5)th stage of second carry signal, the first clock signal and the second clock signal.

Figure 14:
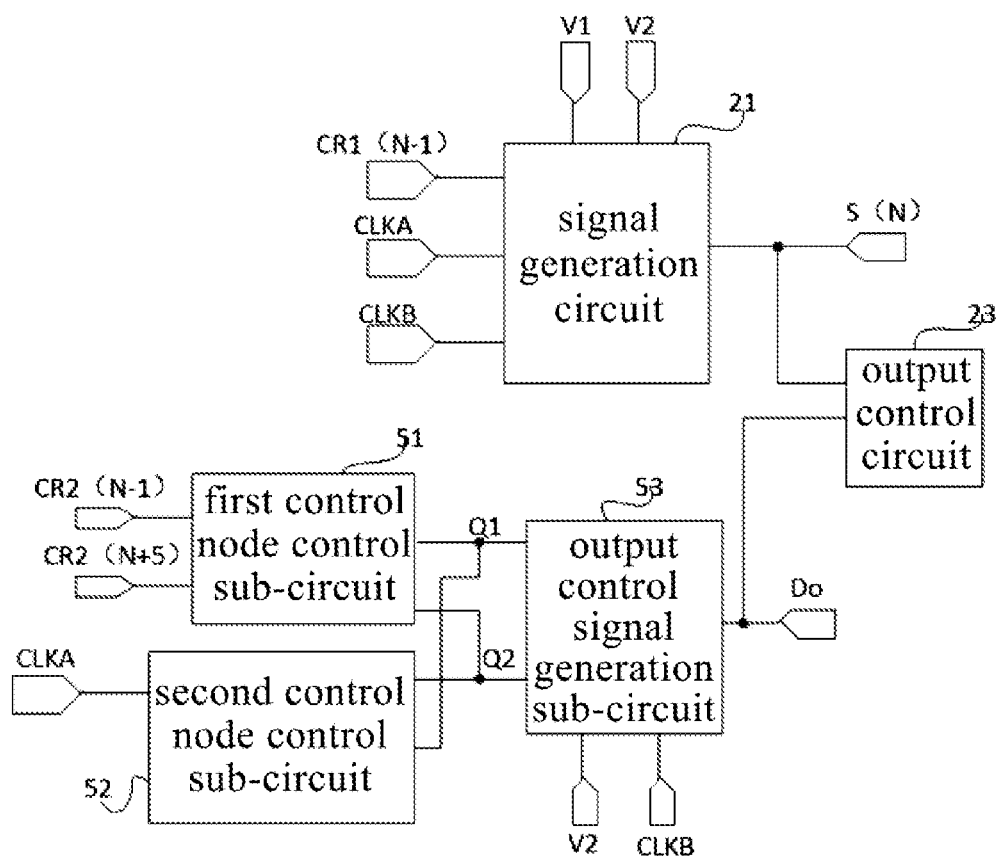
FIG. 14 is a structural diagram of a signal generation unit circuit according to at least one embodiment of the present disclosure.

During specific implementation, as shown in FIG. 14, based on at least one embodiment of the signal generation unit circuit shown in FIG. 10, the output control signal generation circuit may include a first control node control sub-circuit 51, a second control node control sub-circuit 52 and an output control signal generation sub-circuit 53;

The first control node control sub-circuit 51 is connected to the (N−1)th stage of second carry signal terminal CR2 (N−1), the (N+5)th stage of second carry signal terminal CR2 (N+5), the first control node Q1 and the second control node Q2, and is configured to, under the control of the (N−1)th stage of second carry signal, the (N+5)th stage of second carry signal, and the potential of the second control node Q2, control the potential of the first control node Q1 and maintain the potential of the first control node Q1;

The second control node control sub-circuit 52 is electrically connected to the first clock signal terminal CLKA, the first control node Q1 and the second control node Q2, and is configured to, under the control of the first clock signal and the potential of the first control node Q1, control the potential of the second control node Q2 and maintain the potential of the second control node Q2;

The output control signal generation sub-circuit 53 is electrically connected to the first control node Q1, the second control node Q2, the second clock signal terminal CLKB, the second voltage terminal V2 and the output control terminal Do, is configured to, under the control of the potential of the first control node Q1, to connect the output control terminal Do and the second clock signal terminal CLKB, and under the control of the potential of the second control node Q2, control to connect the output control terminal Do and the second voltage terminal V2.

In at least one embodiment of the present disclosure, N may be a positive integer.

When N is 1, the (N−1)th stage of second carry signal terminal CR2 (N−1) may be the second initial carry signal terminal, and the second initial carry signal terminal is used to provide the second initial carry signal, but not limited to this.

In at least one embodiment of the present disclosure, the output control signal generation circuit may include a first control node control sub-circuit 51, a second control node control sub-circuit 52 and an output control signal generation sub-circuit 53. The first control node control sub-circuit 51 controls the potential of the first control node Q1, the second control node control sub-circuit 52 controls the potential of the second control node Q2, and the output control signal generation sub-circuit 53 controls the output control signal provided by the output control terminal Do.

Optionally, the first control node control sub-circuit includes a first control node control transistor, a second control node control transistor, a third control node control transistor, and a first control node control capacitor, wherein, A control electrode of the first control node control transistor and a first electrode of first control node control transistor are both electrically connected to the (N−1)th stage of second carry signal terminal, and a second electrode of the first control node control transistor is electrically connected to the first control node;

A control electrode of the second control node control transistor is electrically connected to the (N+5)th stage of second carry signal terminal, a first electrode of the second control node control transistor is electrically connected to the first control node, and the second electrode of the second control node control transistor is electrically connected to the second voltage terminal;

A control electrode of the third control node control transistor is electrically connected to the second control node, a first electrode of the third control node control transistor is electrically connected to the first control node, and a second electrode of the third control node control transistor is electrically connected to the second voltage terminal;

A first terminal of the first control node control capacitor is electrically connected to the first control node, and a second terminal of the first control node control capacitor is electrically connected to the first signal output terminal;

The second control node control sub-circuit includes a fourth control node control transistor, a fifth control node control transistor and a second control node control capacitor;

A control electrode of the fourth control node control transistor is electrically connected to a first electrode of the fourth control node control transistor and the first clock signal terminal, and a second electrode of the fourth control node control transistor is electrically connected to the second control node;

A control electrode of the fifth control node control transistor is electrically connected to the first control node, a first electrode of the fifth control node control transistor is electrically connected to the second control node, and a second electrode of the fifth control node control transistor is electrically connected to the second voltage terminal;

A first terminal of the second control node control capacitor is electrically connected to the second control node, and a second terminal of the second control node control capacitor is electrically connected to the second voltage terminal;

The output control signal generation sub-circuit includes a first output control signal generation transistor and a second output control signal generation transistor, wherein, A control electrode of the first output control signal generation transistor is electrically connected to the first control node, a first electrode of the first output control signal generation transistor is electrically connected to the second clock signal terminal, and a second electrode of the first output control signal generation transistor is electrically connected to the N-th stage of second carry signal terminal;

A control electrode of the second output control signal generation transistor is electrically connected to the second control node, and a first electrode of the second output control signal generation transistor is electrically connected to the N-th stage of second carry signal terminal, a second electrode of the second output control signal generation transistor is electrically connected to the second voltage terminal.

Figure 15:
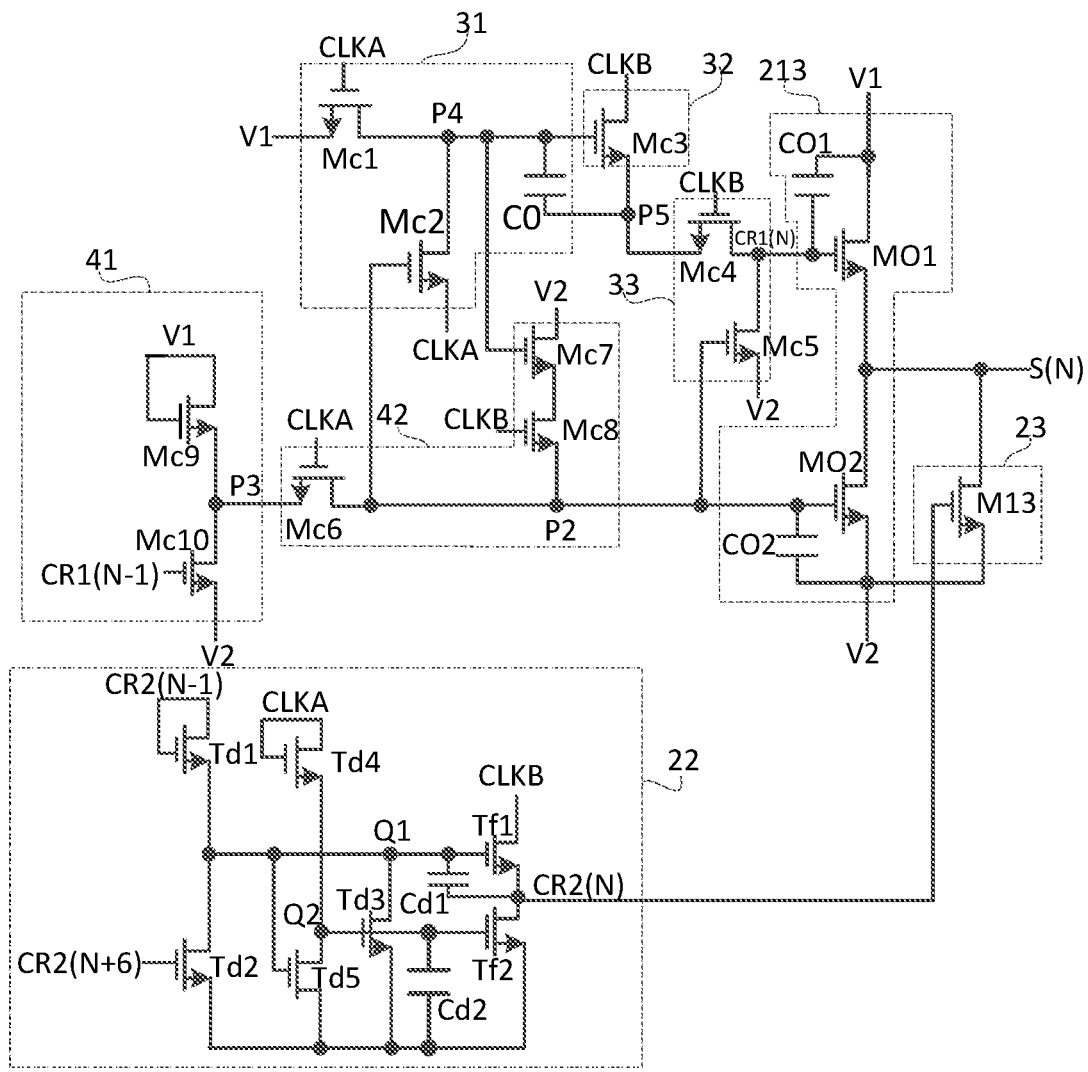
FIG. 15 is a circuit diagram of the signal generation unit circuit according a first embodiment of the present disclosure.

As shown in FIG. 15, the signal generation unit circuit described in the present disclosure includes a signal generation circuit, an output control signal generation circuit 22 and an output control circuit 23, wherein, The signal generation circuit includes a carry signal control circuit 211, a second node control circuit 212 and an output circuit 213;

The carry signal control circuit includes a first control sub-circuit 31, a second control sub-circuit 32 and a carry signal control sub-circuit 33;

The first control sub-circuit 31 includes a first control transistor Mc1, a second control transistor Mc2 and a control capacitor C0, the second control sub-circuit 32 includes a fourth control transistor Mc3, and the carry signal control sub-circuit 33 includes a fourth control transistors Mc4 and fifth control transistors Mc5, wherein, The gate electrode of the first control transistor Mc1 is electrically connected to the first clock signal terminal CLKA, the drain electrode of the first control transistor Mc1 is electrically connected to the first voltage terminal V1, and the source electrode of the first control transistor Mc1 is electrically connected to the fourth node P4;

The gate electrode of the second control transistor Mc2 is electrically connected to the second node P2, the drain electrode of the second control transistor Mc2 is electrically connected to the fourth node P4, and the source electrode of the second control transistor Mc2 is electrically connected to the first clock signal terminal CLKA; the first terminal of the control capacitor C0 is electrically connected to the fourth node P4, and the second terminal of the control capacitor C0 is electrically connected to the fifth node P5;

The gate electrode of the third control transistor Mc3 is electrically connected to the fourth node P4, the drain electrode of the third control transistor Mc3 is electrically connected to the second clock signal terminal CLKB, and the source electrode of the third control transistor Mc3 is electrically connected to the fifth node P5;

The gate electrode of the fourth control transistor Mc4 is electrically connected to the second clock signal terminal CLKB, the drain electrode of the fourth control transistor Mc4 is electrically connected to the fifth node P5, and the source electrode of the fourth control transistor Mc4 is electrically connected to the N-th stage of first carry signal terminal CR1 (N);

The gate electrode of the fifth control transistor Mc5 is electrically connected to the second node P2, the drain electrode of the fifth control transistor Mc5 is electrically connected to the N-th stage of first carry signal terminal CR1(N), and the source electrode of the fifth control transistor Mc5 is electrically connected to the second voltage terminal V2;

The second node control circuit includes a third node control sub-circuit 41 and a second node control sub-circuit 42;

The second node control sub-circuit 42 includes a sixth control transistor Mc6, a seventh control transistor Mc7 and an eighth control transistor Mc8, wherein, The gate electrode of the sixth transistor Mc6 is electrically connected to the first clock signal terminal CLKA, the drain electrode of the sixth control transistor Mc6 is electrically connected to the third node P3, and the source electrode of the sixth control transistor Mc6 is electrically connected to the second node P2;

The gate electrode of the seventh control transistor Mc7 is electrically connected to the fourth node P4, and the drain electrode of the seventh control transistor Mc7 is electrically connected to the second voltage terminal V2;

The gate electrode of the eighth control transistor Mc8 is electrically connected to the second clock signal terminal CLKB, the drain electrode of the eighth control transistor Mc8 is electrically connected to the source electrode of the seventh control transistor Mc7, and the source electrode of the eighth control transistor Mc8 is electrically connected to the second node P2;

The third node control sub-circuit 41 includes a ninth control transistor Mc9 and a tenth control transistor Mc10, wherein, The gate electrode of the ninth control transistor Mc9 and the drain electrode of the ninth control transistor Mc9 are both electrically connected to the first voltage terminal V1;

The gate electrode of the tenth control transistor Mc10 is electrically connected to the (N−1)th stage of first carry signal terminal CR1 (N−1), and the drain electrode of the tenth control transistor Mc10 is electrically connected to the drain electrode of the ninth control transistor Mc9, and the source electrode of the tenth control transistor Mc10 is electrically connected to the second voltage terminal V2;

The output circuit 213 includes a first output transistor MO1, a second output transistor MO2, a first output capacitor CO1 and a second output capacitor CO2, wherein, The gate electrode of the first output transistor MO1 is electrically connected to the N-th stage of first carry signal terminal CR1 (N), the drain electrode of the first output transistor MO1 is electrically connected to the first voltage terminal V1, and the source electrode of the first output transistor MO1 is electrically connected to the first signal output terminal S(N);

The gate electrode of the second output transistor MO2 is electrically connected to the second node P2, the drain electrode of the second output transistor MO2 is electrically connected to the first signal output terminal S(N), and the source electrode of the second output transistor MO2 is electrically connected to the second voltage terminal V2;

The first terminal of the first output capacitor CO1 is electrically connected to the first voltage terminal V1, and the second terminal of the first output capacitor CO1 is electrically connected to the N-th stage of first carry signal terminal CR1(N);

The first terminal of the second output capacitor CO2 is electrically connected to the second node P2, and the second terminal of the second output capacitor CO2 is electrically connected to the second voltage terminal V2;

The output control terminal is the N-th stage of second carry signal terminal CR2 (N);

The output control signal generation circuit 22 includes a first control node control sub-circuit, a second control node control sub-circuit and an output control signal generation sub-circuit;

The first control node control sub-circuit includes a first control node control transistor Td1, a second control node control transistor Td2, a third control node control transistor Td3 and a first control node control capacitor Cd1, wherein, The gate electrode of the first control node control transistor Td1 and the drain electrode of the first control node control transistor Td1 are both electrically connected to the (N−1)th stage of second carry signal terminal CR2 (N−1), and the source electrode of the first control node control transistor Td1 is electrically connected to the first control node Q1;

The gate electrode of the second control node control transistor Td2 is electrically connected to the (N+5)th stage of second carry signal terminal CR2 (N+5), and the drain electrode of the second control node control transistor Td2 is electrically connected to the first control node Q1, and the source electrode of the second control node control transistor Td2 is electrically connected to the second voltage terminal V2;

The gate electrode of the third control node control transistor Td3 is electrically connected to the second control node Q2, the drain electrode of the third control node control transistor Td3 is electrically connected to the first control node Q1, and the source electrode of the third control node control transistor Td3 is electrically connected to the second voltage terminal V2;

The first terminal of the first control node control capacitor Cd1 is electrically connected to the first control node Q1, and the second terminal of the first control node control capacitor Cd1 is electrically connected to the first signal output terminal S(N);

The second control node control sub-circuit includes a fourth control node control transistor Td4, a fifth control node control transistor Td5 and a second control node control capacitor Cd2;

The gate electrode of the fourth control node control transistor Td4 and the drain electrode of the fourth control node control transistor Td4 are electrically connected to the first clock signal terminal CLKA, and the source electrode of the fourth control node control transistor Td4 is connected to the second control node Q2;

The gate electrode of the fifth control node control transistor Td5 is electrically connected to the first control node Q1, the drain electrode of the fifth control node control transistor Td5 is electrically connected to the second control node Q2, and the source electrode of the fifth control node control transistor Td5 is electrically connected to the second voltage terminal V2;

The first terminal of the second control node control capacitor Cd2 is electrically connected to the second control node Q2, and the second terminal of the second control node control capacitor Cd2 is electrically connected to the second voltage terminal V2;

The output control signal generation sub-circuit includes a first output control signal generation transistor Tf1 and a second output control signal generation transistor Tf2, wherein, The gate electrode of the first output control signal generation transistor Tf1 is electrically connected to the first control node Q1, and the drain electrode of the first output control signal generation transistor Tf1 is electrically connected to the second clock signal terminal CLKB, the source electrode of the first output control signal generation transistor Tf1 is electrically connected to the N-th stage of second carry signal terminal CR2 (N);

The gate electrode of the second output control signal generation transistor Tf2 is electrically connected to the second control node Q2, and the drain electrode of the second output control signal generation transistor Tf2 is connected to the N-th stage of second carry signal terminal CR2 (N), the source electrode of the second output control signal generation transistor Tf2 is electrically connected to the second voltage terminal V2;

The output control circuit 23 includes a first output control transistor M13;

The gate electrode of the first output control transistor M13 is electrically connected to the N-th stage of second carry signal terminal CR2(N), and the drain electrode of the first output control transistor M13 is electrically connected to the first signal output terminal S(N), the source electrode of the first output control transistor M13 is electrically connected to the second voltage terminal V2.

In the first specific embodiment of the signal generation unit circuit shown in FIG. 15, N may be a positive integer.

In the first specific embodiment of the signal generation unit circuit shown in FIG. 15, the width-to-length ratio of Mc10 is greater than the width-to-length ratio of Mc9, but not limited thereto.

In the first specific embodiment of the signal generation unit circuit shown in FIG. 15, all transistors are n-type thin film transistors, but not limited thereto.

In the first specific embodiment of the signal generation unit circuit shown in FIG. 15, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

Figure 16:
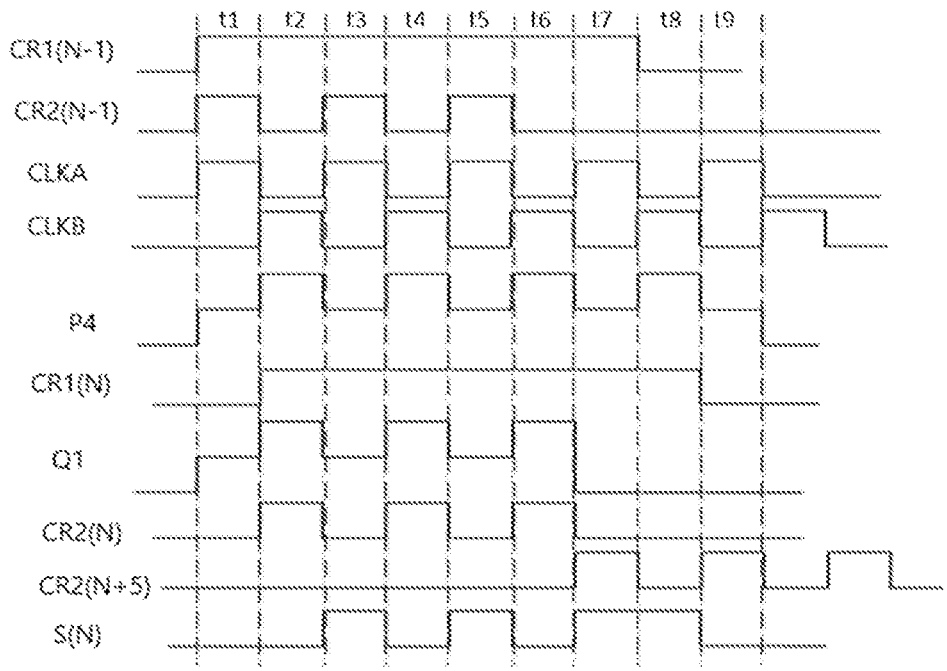
FIG. 16 is a working timing diagram of the signal generation unit circuit according to the first embodiment of the present disclosure.

As shown in FIG. 16, when the first specific embodiment of the signal generation unit circuit shown in FIG. 15 of the present disclosure is in operation, Before the first time period t1 starts, CR1(N) provides a low voltage, CR2(N) provides a low voltage, CR2(N+5) provides a low voltage, and S(N) outputs a low voltage;

In the first time period t1, CR1 (N−1) provides a high voltage, CR2 (N−1) provides a high voltage, CR2 (N+5) provides a low voltage, CLKA provides a high voltage, CLKB provides a low voltage, and Mc1 is turned on, the potential of P4 is a high voltage, Mc3 is turned on, the potential of P5 is a low voltage, Mc4 is turned off, Mc9 is turned on, Mc10 is turned off, the potential of P3 is a low voltage, Mc6 is turned on, the potential of P2 is a low voltage, Td1 is turned on, Td2 is turned off, the voltage of Q1 is a high voltage, Tf1 is turned on, CR2(N) provides a low voltage; S(N) provides a low voltage;

In the second time period t2, CR1 (N−1) provides a high voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned on, the potential of P3 is a low voltage, Mc6 is turned off, Mc3 is turned on, the potential of P4 is pulled up by the bootstrapping, the potential of P5 is a high voltage, Mc4 is turned on, CR1 (N) provides a high voltage, MO1 is turned on, Mc7 and Mc8 are both turned on, the potential of P2 is a low voltage, MO2 is turned off; Td1 is turned off, Td2 is turned off, Td4 is turned off, Tf1 is turned on, the potential of Q1 is pulled up by the bootstrapping, CR2 (N) provides a high voltage, M13 is turned on, S(N) provides a low voltage;

In the third time period t3, CR1 (N−1) provides a high voltage, CR2 (N−1) provides a high voltage, CR2 (N+5) provides a low voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, Mc2 is turned off, Mc8 is turned off, MO2 is turned off, the potential of P4 is a high voltage, Mc3 is turned on, Mc4 is turned off, Mc5 is turned off, the potential of the N-th stage of first carry signal outputted by CR1 (N) is maintained at a high voltage, MO1 is turned on; Td1 is turned off, Td2 is turned off, Td4 is turned on, and the potential of Q1 is a high voltage (the potential of Q1 is pulled down, but the potential of Q1 can still enable Tf1 to be turned on), Tf1 is turned on, Td5 is turned on, the potential of Q2 is a low voltage, CR2 (N) outputs a low voltage, M13 is turned off, and S (N) outputs a high voltage;

In the fourth time period t4, CR1 (N−1) provides a high voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned on, the potential of P3 is a low voltage, Mc6 is turned off, the potential of P4 is a high voltage, Mc7 and Mc8 are turned on, the potential of P2 is a low voltage, Mc5 is turned off, Mc3 is turned on, the potential of P5 is a high voltage, Mc is turned on, CR1 (N) provides a high voltage, MO1 is turned on, MO2 is turned off, Td1 is turned off, Td2 is turned off, the potential of Q1 is pulled up by the bootstrapping, Td4 is turned off, Td5 is turned on, the potential of Q2 is a low voltage, and Td3 is turned off, Tf1 is turned on, Tf2 is turned off, CR2 (N) outputs a high voltage, M13 is turned on, S (N) outputs a low voltage;

In the fifth time period t5, CR1 (N-1) provides a high voltage, CR2 (N-1) provides a high voltage, CR2 (N+5) provides a low voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, Mc2 is turned off, the potential of P4 is a high voltage, Mc7 is turned on, Mc8 is turned off, Mc3 is turned on, Mc4 is turned off, Mc5 is turned off, CR1 (N) outputs a high voltage, MO1 is turned on, MO2 is turned off, Td1 is turned on, Td2 is turned off, Td4 is turned off, the potential of Q1 is a high voltage (the potential of Q1 is pulled down, but the potential of Q1 can still enable Tf1 to be turned on), Td5 is turned on, the potential of Q2 is a low voltage, Td3 is turned off, Tf1 is turned on, Tf2 is turned off, CR2 (N) provides a low voltage, M13 is turned off, and S (N) outputs a high voltage;

In the sixth time period t6, CR1 (N-1) provides a high voltage, CR2 (N-1) provides a low voltage, CR2 (N+5) provides a low voltage, CLKA provides a low voltage, CLKB provides a high voltage, Mc1 is turned off, Mc9 is turned on, Mc10 is turned off, the potential of P3 is a high voltage, Mc6 is turned off, the potential of P2 is a low voltage, Mc2 is turned off, the potential of P4 is a high voltage, Mc3 is turned on, the potential of P5 is a high voltage, Mc4 is turned on, CR1 (N) provides a high voltage, MO1 is turned on, MO2 is turned off; Td1 is turned off, Td2 is turned off, Td4 is turned off, the potential of Q2 is a low voltage, the potential of Q1 is pulled up by the bootstrapping, Tf1 is turned on, Tf2 is turned off, and CR2 (N) outputs a high voltage, M13 is turned on, S(N) outputs a low voltage;

In the seventh time period t7, CR1 (N-1) provides a high voltage, CR2 (N-1) provides a low voltage, CR2 (N+5) provides a high voltage, CLKA provides a high voltage, CLKB provides a low voltage, and Mc1 is turned on, Mc9 is turned on, Mc10 is turned on, the potential of P3 is a low voltage, Mc6 is turned on, the potential of P4 is a high voltage, Mc7 is turned on, Mc8 is turned off, the potential of P2 is a low voltage, Mc2 is turned off, Mc3 is turned on, Mc4 is turned off, Mc5 is turned off, CR1 (N) continues to output a high voltage, MO1 is turned on, MO2 is turned off; Td1 is turned off, Td2 is turned on, the potential of Q1 is a low voltage, Td5 is turned off, Td4 is turned on, the potential of Q2 is a high voltage, Tf2 is turned on, Tf1 is turned off, CR2 (N) outputs a low voltage, M13 is turned off, S (N) outputs a high voltage;

In the eighth time period t8, CR1 (N-1) provides a low voltage, CR2 (N-1) provides a low voltage, CR2 (N+5) provides a low voltage, CLKA provides a low voltage, CLKB provides a high voltage, Mc1 is turned off, Mc9 is turned on, Mc10 is turned off, the potential of P3 is a high voltage, Mc6 is turned off, the potential of P4 is a high voltage, Mc7 and Mc8 are turned on, the potential of P2 is a low voltage, Mc3 is turned on, the potential of P5 is a high voltage, Mc4 is turned on, CR1 (N) outputs a high voltage, MO1 is turned on, MO2 is turned off; Td1 is turned off, Td2 is turned off, the potential of Q1 is maintained at a low voltage, Td5 is turned off, Td4 is turned off, the potential of Q2 is maintained at a high voltage, Tf1 is turned off, and Tf2 is turned on, CR2(N) outputs a low voltage, M13 is turned off, S(N) outputs a high voltage;

In the ninth time period t9, CR1 (N-1) provides a low voltage, CR2 (N-1) provides a low voltage, CR2 (N+5) provides a high voltage, CLKA provides a high voltage, CLKB provides a low voltage, and Mc1 is turned on, Mc9 is turned on, Mc10 is turned off, the potential of P3 is a high voltage, Mc6 is turned on, the potential of P2 is a high voltage, Mc2 is turned on, the potential of P4 is a high voltage, Mc3 is turned on, the potential of P5 is a low voltage, Mc4 is turned off, Mc5 is turned on, CR1 (N) outputs a low voltage, MO1 is turned off, MO2 is turned on; Td1 is turned off, Td2 is turned on, the potential of Q1 is a low voltage, Td4 is turned on, Td5 is turned off, the potential of Q2 is a high voltage, Td3 is turned on, Tf1 is turned off, Tf2 is turned on, CR2(N) provides a low voltage, M13 is turned off, S(N) outputs a low voltage.

Optionally, the third node control sub-circuit includes a ninth control transistor, a tenth control transistor, an eleventh control transistor and a twelfth control transistor, wherein, A control electrode of the ninth control transistor is electrically connected to a first electrode of the ninth control transistor and the first voltage terminal;

A control electrode of the tenth control transistor is electrically connected to the (N-1)th stage of first carry signal terminal, a first electrode of the tenth control transistor is electrically connected to a second electrode of the ninth control transistor, and a second electrode of the tenth control transistor is electrically connected to the second voltage terminal;

A control electrode of the eleventh control transistor is electrically connected to the second electrode of the ninth control transistor, a first electrode of the eleventh control transistor is electrically connected to the first voltage terminal, and the second electrode of the eleventh control transistor is electrically connected to the third node;

A control electrode of the twelfth control transistor is electrically connected to the (N-1)th stage of first carry signal terminal, a first electrode of the twelfth control transistor is electrically connected to the third node, and the second electrode of the twelfth control transistor is electrically connected to the second voltage terminal.

In a specific implementation, the third node control sub-circuit may include a ninth control transistor, a tenth control transistor, an eleventh control transistor and a twelfth control transistor, and a multi-transistor input structure is used to ensure the amplitude of the input voltage (the input voltage can be the (N-1)th stage of first carry signal).

Figure 17:
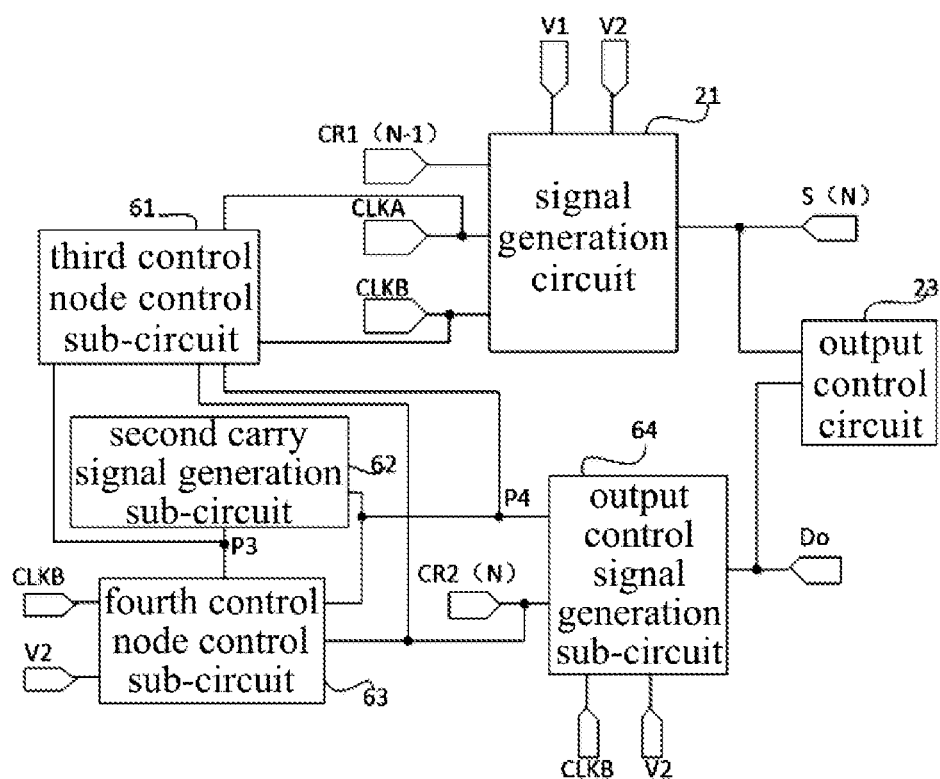
FIG. 17 is a structural diagram of a signal generation unit circuit according to another embodiment of the present disclosure.

In specific implementation, as shown in FIG. 17, based on at least one embodiment of the signal generation unit circuit shown in FIG. 10, the output control signal generation circuit 22 may include a third control node control sub-circuit 61, a second carry signal generation sub-circuit 62, a fourth control node control sub-circuit 63 and an output control signal generation sub-circuit 64, wherein, The third control node control sub-circuit 61 is electrically connected to the third control node P3, the first clock signal terminal CLKA, the fourth control node P4, the second clock signal terminal CLKB and the first voltage terminal V1, and is configured to control the potential of the third control node P3 and maintain the potential of the third control node P3 according to the first clock signal, the second clock signal, the potential of the fourth control node P4 and the first voltage signal;

The second carry signal generation sub-circuit 62 is electrically connected to the third control node P3, the fourth control node P4, the second clock signal terminal CLKB, the N-th stage of second carry signal terminal CR2(N) and the second voltage terminal V2, is configured to control the N-th stage of second carry signal outputted by the N-th stage of second carry signal terminal CR2(N) according to the potential of the third control node P3, the second clock signal, the potential of the fourth control node P4 and the second voltage signal;

The fourth control node control sub-circuit 63 is connected with the first voltage terminal V1, the (N−1)th stage of second carry signal terminal CR2 (N−1), the first clock signal terminal CLKA, the third control node P3, the second clock signal terminal CLKB and the fourth control node P4, and is configured to control the potential of the fourth control node P4 and maintain the potential of the fourth control node P4 according to the first voltage signal, the (N−1)th stage of second carry signal, the potential of the third control node P3, the first clock signal, the second clock signal and the second voltage signal;

The output control signal generation sub-circuit 64 is electrically connected to the N-th stage of second carry signal terminal CR2 (N), the fourth control node P4, the second clock signal terminal CLKB, the second voltage terminal V2 and the output control terminal, is configured to control to connect the output control terminal Do and the second clock signal terminal CLKB under the control of the N-th stage of second carry signal, and control to connect the output control terminal Do and the second voltage terminal V2 under the control of the potential of the fourth control node P4.

In at least one embodiment of the present disclosure, the output control signal generation circuit 22 may include a third control node control sub-circuit 61, a second carry signal generation sub-circuit 62, a fourth control node control sub-circuit 63, and an output control signal generation sub-circuit 64, the third control node control sub-circuit 61 controls the potential of the third control node P3, and the second carry signal generation sub-circuit 62 controls the N-th stage of second carry signal outputted by the N-th stage of second carry signal terminal CR2(N), the fourth control node control sub-circuit 63 controls the potential of the fourth control node P4, and the output control signal generation sub-circuit 64 controls the output control terminal Do to provide an output control signal.

Optionally, the third control node control sub-circuit includes a first generation control transistor, a second generation control transistor and a first generation control capacitor, wherein, A control electrode of the first generation control transistor is electrically connected to the first clock signal terminal, a first electrode of the first generation control transistor is electrically connected to the first voltage terminal, and a second electrode of the first generation control transistor is electrically connected to the third control node;

A control electrode of the second generation control transistor is electrically connected to the fourth control node, a first electrode of the second generation control transistor is electrically connected to the third control node, and a second electrode of the second generation control transistor is electrically connected to the second clock signal terminal;

A first terminal of the first generation control capacitor is electrically connected to the third control node, and a second terminal of the first generation control capacitor is electrically connected to the fifth control node.

Optionally, the second carry signal generation sub-circuit includes a third generation control transistor, a fourth generation control transistor, a fifth generation control transistor and a second generation control capacitor, wherein, A control electrode of the third generation control transistor is electrically connected to the third control node, a first electrode of the third generation control transistor is electrically connected to the second clock signal terminal, and the second electrode of the third generation control transistor is electrically connected to the fifth control node;

A control electrode of the fourth generation control transistor is electrically connected to the second clock signal terminal, a first electrode of the fourth generation control transistor is electrically connected to the fifth control node, and a second electrode of the fourth generation control transistor is electrically connected to the N-th stage of second carry signal terminal;

A control electrode of the fifth generation control transistor is electrically connected to the fourth control node, a first electrode of the fifth generation control transistor is electrically connected to the N-th stage of second carry signal terminal, and a second electrode of the fifth generation control transistor is electrically connected to the second voltage terminal;

A first terminal of the second generation control capacitor is electrically connected to the N-th stage of second carry signal terminal, and a second terminal of the second generation control capacitor is electrically connected to the output control terminal.

Optionally, the fourth control node control sub-circuit includes a sixth generation control transistor, a seventh generation control transistor, an eighth generation control transistor, a ninth generation control transistor, a tenth generation control transistor, and a third generation control capacitor;

A control electrode of the sixth generation control transistor and a first electrode of the sixth generation control transistor are both electrically connected to the first voltage terminal;

A control electrode of the seventh generation control transistor is electrically connected to the (N−1)th stage of second carry signal terminal, a first electrode of the seventh generation control transistor is electrically connected to a second electrode of the sixth generation control transistor, a second electrode of the seventh generation control transistor is electrically connected to the second voltage terminal;

A control electrode of the eighth generation control transistor is electrically connected to the first clock signal terminal, a first electrode of the eighth generation control transistor is electrically connected to a first electrode of the seventh generation control transistor, and a second electrode of the eighth generation control transistor is electrically connected to the fourth control node;

A control electrode of the ninth generation control transistor is electrically connected to the third control node, and a first electrode of the ninth generation control transistor is electrically connected to the second voltage terminal;

A control electrode of the tenth generation control transistor is electrically connected to the second clock signal terminal, a first electrode of the tenth generation control transistor is electrically connected to a second electrode of the ninth generation control transistor, and a second electrode of the tenth generation control transistor is electrically connected to the third control node;

A first terminal of the third generation control capacitor is electrically connected to the fourth control node, and a second terminal of the third generation control capacitor is electrically connected to the second voltage terminal.

Optionally, the fourth control node control sub-circuit includes a first input transistor, a second input transistor, a sixth generation control transistor, a seventh generation control transistor, an eighth generation control transistor, a ninth generation control transistor, and a tenth generation control transistor and a third generation control capacitor;

A control electrode of the first input transistor and a first electrode of the first input transistor are both electrically connected to the first voltage terminal;

A control electrode of the second input transistor is electrically connected to the (N–1)th stage of second carry signal terminal, a first electrode of the second input transistor is electrically connected to a second electrode of the first input transistor, and a second electrode of the second input transistor is electrically connected to the second voltage terminal;

A control electrode of the sixth generation control transistor is electrically connected to a first electrode of the second input transistor, and a first electrode of the sixth generation control transistor is electrically connected to the first voltage terminal;

A control electrode of the seventh generation control transistor is electrically connected to the (N–1)th stage of second carry signal terminal, a first electrode of the seventh generation control transistor is electrically connected to a second electrode of the sixth generation control transistor, a second electrode of the seventh generation control transistor is electrically connected to the second voltage terminal;

A control electrode of the eighth generation control transistor is electrically connected to the first clock signal terminal, a first electrode of the eighth generation control transistor is electrically connected to a first electrode of the seventh generation control transistor, and a second electrode of the eighth generation control transistor is electrically connected to the fourth control node;

A control electrode of the ninth generation control transistor is electrically connected to the third control node, and a first electrode of the ninth generation control transistor is electrically connected to the second voltage terminal;

A control electrode of the tenth generation control transistor is electrically connected to the second clock signal terminal, a first electrode of the tenth generation control transistor is electrically connected to a second electrode of the ninth generation control transistor, and a second electrode of the tenth generation control transistor is electrically connected to the third control node;

A first terminal of the third generation control capacitor is electrically connected to the fourth control node, and a second terminal of the third generation control capacitor is electrically connected to the second voltage terminal.

Optionally, the output control signal generation sub-circuit includes an eleventh generation control transistor and a twelfth generation control transistor, wherein, A control electrode of the eleventh generation control transistor is electrically connected to the N-th stage of second carry signal terminal, a first electrode of the eleventh generation control transistor is electrically connected to the second clock signal terminal, and a second electrode of the eleventh generation control transistor is electrically connected to the output control terminal;

A control electrode of the twelfth generation control transistor is electrically connected to the fourth control node, a first electrode of the twelfth generation control transistor is electrically connected to the output control terminal, and a second electrode of the twelfth generation control transistor is electrically connected to the second voltage terminal.

In a specific implementation, the output control circuit may include a first output control transistor; a control electrode of the first output control transistor is electrically connected to the output control terminal, and a first electrode of the first output control transistor is connected to the first signal output terminal, and a second electrode of the first output control transistor is electrically connected to the second voltage terminal.

Figure 18:
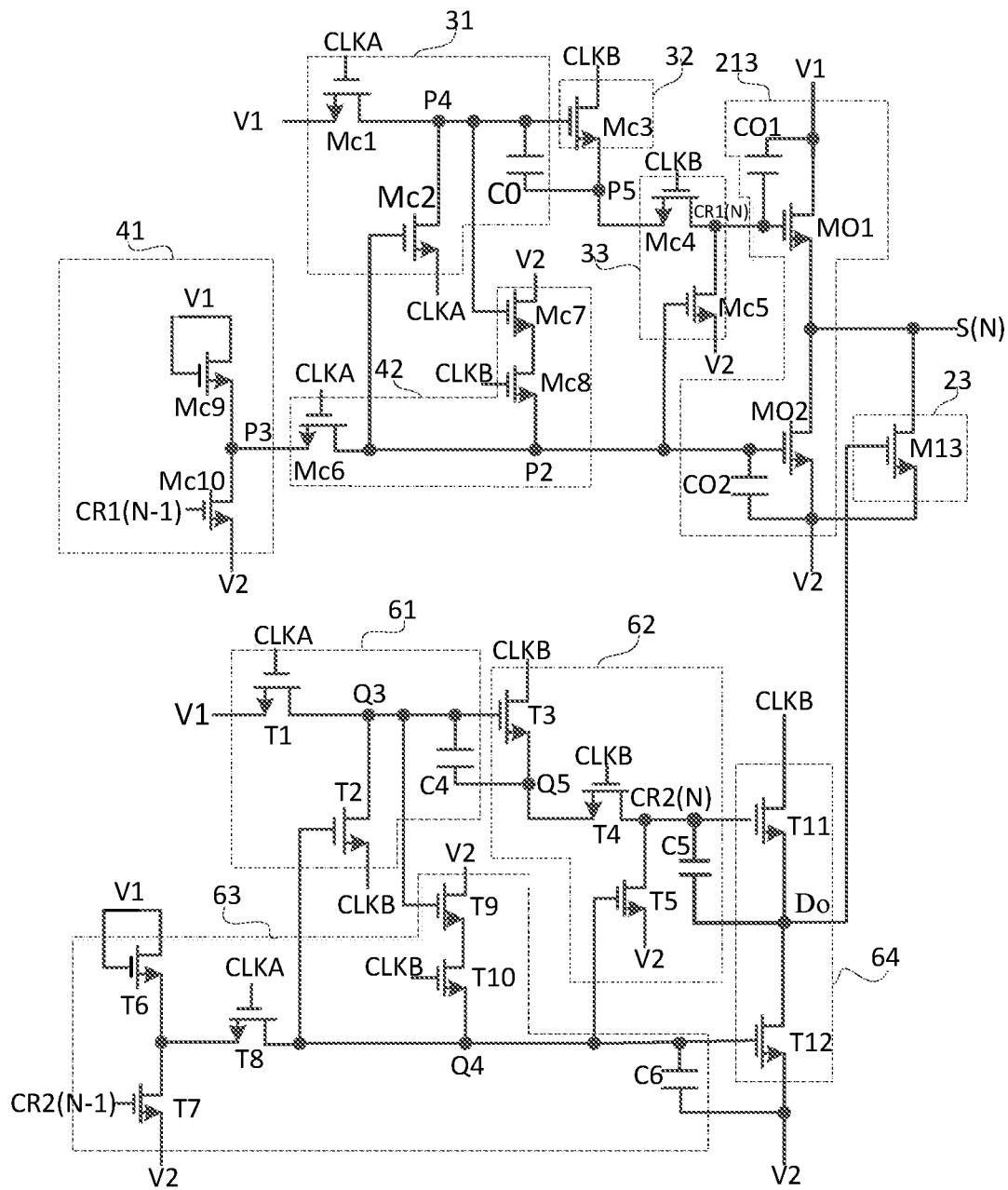
FIG. 18 is a circuit diagram of the signal generation unit circuit according to a second embodiment of the present disclosure.

As shown in FIG. 18, the second specific embodiment of the signal generation unit circuit described in the present disclosure includes a signal generation circuit, an output control signal generation circuit, and an output control circuit 23, wherein, The signal generation circuit includes a carry signal control circuit, a second node control circuit 212 and an output circuit 213;

The carry signal control circuit includes a first control sub-circuit 31, a second control sub-circuit 32 and a carry signal control sub-circuit 33;

The first control sub-circuit 31 includes a first control transistor Mc1, a second control transistor Mc2 and a control capacitor C0, the second control sub-circuit 32 includes a fourth control transistor Mc3, and the carry signal control sub-circuit 33 includes a fourth control transistors Mc4 and a fifth control transistor Mc5, wherein, The gate electrode of the first control transistor Mc1 is electrically connected to the first clock signal terminal CLKA, the drain electrode of the first control transistor Mc1 is electrically connected to the first voltage terminal V1, and the source electrode of the first control transistor Mc1 is electrically connected to the fourth node P4;

The gate electrode of the second control transistor Mc2 is electrically connected to the second node P2, the drain electrode of the second control transistor Mc2 is electrically connected to the fourth node P4, and the source electrode of the second control transistor Mc2 is electrically connected to the first clock signal terminal CLKA; the first terminal of the control capacitor C0 is electrically connected to the fourth node P4, and the second terminal of the control capacitor C0 is electrically connected to the fifth node P5;

The gate electrode of the third control transistor Mc3 is electrically connected to the fourth node P4, the drain electrode of the third control transistor Mc3 is electrically connected to the second clock signal terminal CLKB, and the source electrode of the third control transistor Mc3 is electrically connected to the fifth node P5;

The gate electrode of the fourth control transistor Mc4 is electrically connected to the second clock signal terminal CLKB, the drain electrode of the fourth control transistor Mc4 is electrically connected to the fifth node P5, and the source electrode of the fourth control transistor Mc4 is electrically connected to the N-th stage of first carry signal terminal CR1 (N);

The gate electrode of the fifth control transistor Mc5 is electrically connected to the second node P2, the drain electrode of the fifth control transistor Mc5 is electrically connected to the N-th stage of first carry signal terminal CR1(N), and the source electrode of the fifth control transistor Mc5 is electrically connected to the second voltage terminal V2;

The second node control circuit includes a third node control sub-circuit 41 and a second node control sub-circuit 42;

The second node control sub-circuit 42 includes a sixth control transistor Mc6, a seventh control transistor Mc7 and an eighth control transistor Mc8, wherein, The gate electrode of the sixth transistor Mc6 is electrically connected to the first clock signal terminal CLKA, the drain electrode of the sixth control transistor Mc6 is electrically connected to the third node P3, and the source electrode of the sixth control transistor Mc6 is electrically connected to the second node P2;

The gate electrode of the seventh control transistor Mc7 is electrically connected to the fourth node P4, and the drain electrode of the seventh control transistor Mc7 is electrically connected to the second voltage terminal V2;

The gate electrode of the eighth control transistor Mc8 is electrically connected to the second clock signal terminal CLKB, the drain electrode of the eighth control transistor Mc8 is electrically connected to the source electrode of the seventh control transistor Mc7, and the source electrode of the eighth control transistor Mc8 is electrically connected to the second node P2;

The third node control sub-circuit 41 includes a ninth control transistor Mc9 and a tenth control transistor Mc10, wherein, The gate electrode of the ninth control transistor Mc9 and the drain electrode of the ninth control transistor Mc9 are both electrically connected to the first voltage terminal V1;

The gate electrode of the tenth control transistor Mc10 is electrically connected to the (N−1)th stage of first carry signal terminal CR1 (N−1), and the drain electrode of the tenth control transistor Mc10 is electrically connected to the drain electrode of the ninth control transistor Mcg, and the source electrode of the tenth control transistor Mc10 is electrically connected to the second voltage terminal V2;

The output circuit 213 includes a first output transistor MO1, a second output transistor M02, a first output capacitor CO1 and a second output capacitor CO2, wherein, The gate electrode of the first output transistor MO1 is electrically connected to the N-th stage of first carry signal terminal CR1 (N), the drain electrode of the first output transistor MO1 is electrically connected to the first voltage terminal V1, and the source electrode of the first output transistor MO1 is electrically connected to the first signal output terminal S(N);

The gate electrode of the second output transistor MO2 is electrically connected to the second node P2, the drain electrode of the second output transistor MO2 is electrically connected to the first signal output terminal S(N), and the source electrode of the second output transistor MO2 is electrically connected to the second voltage terminal V2;

The first terminal of the first output capacitor CO1 is electrically connected to the first voltage terminal V1, and the second terminal of the first output capacitor CO1 is electrically connected to the N-th stage of first carry signal terminal CR1(N);

The first terminal of the second output capacitor CO2 is electrically connected to the second node P2, and the second terminal of the second output capacitor CO2 is electrically connected to the second voltage terminal V2;

The output control circuit 23 includes a first output control transistor M13;

The gate electrode of the first output control transistor M13 is electrically connected to the output control terminal Do, the drain electrode of the first output control transistor M13 is electrically connected to the first signal output terminal S(N), and the source electrode of the first output control transistor M13 is electrically connected to the second voltage terminal V2;

The output control signal generation circuit includes a third control node control sub-circuit 61, a second carry signal generation sub-circuit 62, a fourth control node control sub-circuit 63 and an output control signal generation sub-circuit 64, wherein, The third control node control sub-circuit 61 includes a first generation control transistor T1, a second generation control transistor T2 and a first generation control capacitor C4, wherein, The gate electrode of the first generation control transistor T1 is electrically connected to the first clock signal terminal CLKA, the drain electrode of the first generation control transistor T1 is electrically connected to the first voltage terminal V1, and the source electrode of the first generation control transistor T1 is electrically connected to the third control node Q3;

The control electrode of the second generation control transistor T2 is electrically connected to the fourth control node Q4, the drain electrode of the second generation control transistor T2 is electrically connected to the third control node Q3, and the source electrode of the second generation control transistor T2 is electrically connected to the second clock signal terminal CLKB;

The first terminal of the first generation control capacitor C4 is electrically connected to the third control node Q3, and the second terminal of the first generation control capacitor C4 is electrically connected to the fifth control node Q5;

The second carry signal generation sub-circuit 62 includes a third generation control transistor T3, a fourth generation control transistor T4, a fifth generation control transistor T5 and a second generation control capacitor C5, wherein, The gate electrode of the third generation control transistor T3 is electrically connected to the third control node Q3, the drain electrode of the third generation control transistor T3 is electrically connected to the second clock signal terminal CLKB, and the source electrode of third generation control transistor T3 is electrically connected to the fifth control node Q5;

The gate electrode of the fourth generation control transistor T4 is electrically connected to the second clock signal terminal CLKB, the drain electrode of the fourth generation control transistor T4 is electrically connected to the fifth control node Q5, and the source electrode of the fourth generation control transistor T4 is electrically connected to the N-th stage of second carry signal terminal CR2 (N);

The gate electrode of the fifth generation control transistor T5 is electrically connected to the fourth control node Q4, and the drain electrode of the fifth generation control transistor T5 is electrically connected to the N-th stage of second carry signal terminal CR2(N), the source electrode of the fifth generation control transistor T5 is electrically connected to the second voltage terminal V2;

The first terminal of the second generation control capacitor C5 is electrically connected to the N-th stage of second carry signal terminal CR2(N), and the second terminal of the second generation control capacitor C5 is electrically connected to the output control terminal Do;

The fourth control node control sub-circuit 63 includes a sixth generation control transistor T6, a seventh generation control transistor T7, an eighth generation control transistor T8, a ninth generation control transistor T9, a tenth generation control transistor T10, and a third generation control capacitor C6;

The gate electrode of the sixth generation control transistor T6 and the drain electrode of the sixth generation control transistor T6 are both electrically connected to the first voltage terminal V1;

The gate electrode of the seventh generation control transistor T7 is electrically connected to the (N−1)-th stage of second carry signal terminal CR2 (N−1), and the drain electrode of the seventh generation control transistor T7 is electrically connected to the source electrode of the sixth generation control transistor T6, and the source electrode of the seventh generation control transistor T7 is electrically connected to the second voltage terminal V2;

The gate electrode of the eighth generation control transistor T8 is electrically connected to the first clock signal terminal CLKA, the drain electrode of the eighth generation control transistor T8 is electrically connected to the drain electrode of the seventh generation control transistor T7, the source electrode of the eighth generation control transistor T8 is electrically connected to the fourth control node Q4;

The gate electrode of the ninth generation control transistor T9 is electrically connected to the third control node Q3, and the drain electrode of the ninth generation control transistor T9 is electrically connected to the second voltage terminal V2;

The gate electrode of the tenth generation control transistor T10 is electrically connected to the second clock signal terminal CLKB, the drain electrode of the tenth generation control transistor T10 is electrically connected to the drain electrode of the ninth generation control transistor T9, and the source electrode of the tenth generation control transistor T10 is electrically connected to the third control node Q3;

The first terminal of the third generation control capacitor C6 is electrically connected to the fourth control node Q4, and the second terminal of the third generation control capacitor C6 is electrically connected to the second voltage terminal V2;

The output control signal generation sub-circuit 64 includes an eleventh generation control transistor T11 and a twelfth generation control transistor T12, wherein, The gate electrode of the eleventh generation control transistor T11 is electrically connected to the N-th stage of second carry signal terminal CR2(N), the drain electrode of the eleventh generation control transistor T11 is electrically connected to the second clock signal terminal CLKB, the source electrode of the eleventh generation control transistor T11 is electrically connected to the output control terminal Do;

The gate electrode of the twelfth generation control transistor T12 is electrically connected to the fourth control node Q4, the drain electrode of the twelfth generation control transistor T12 is electrically connected to the output control terminal Do, and the source electrode of the twelfth generation control transistor T12 is electrically connected to the second voltage terminal V2.

In the second specific embodiment of the signal generation unit circuit shown in FIG. 18, N may be a positive integer.

In the second specific embodiment of the signal generation unit circuit shown in FIG. 18, the width-to-length ratio of Mc10 is greater than that of Mc9, and the width-to-length ratio of T7 is greater than that of T6, but not limited thereto.

In the second specific embodiment of the signal generation unit circuit shown in FIG. 18, all transistors are n-type thin film transistors, but not limited thereto.

In the second specific embodiment of the signal generation unit circuit shown in FIG. 18, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

Figure 19:
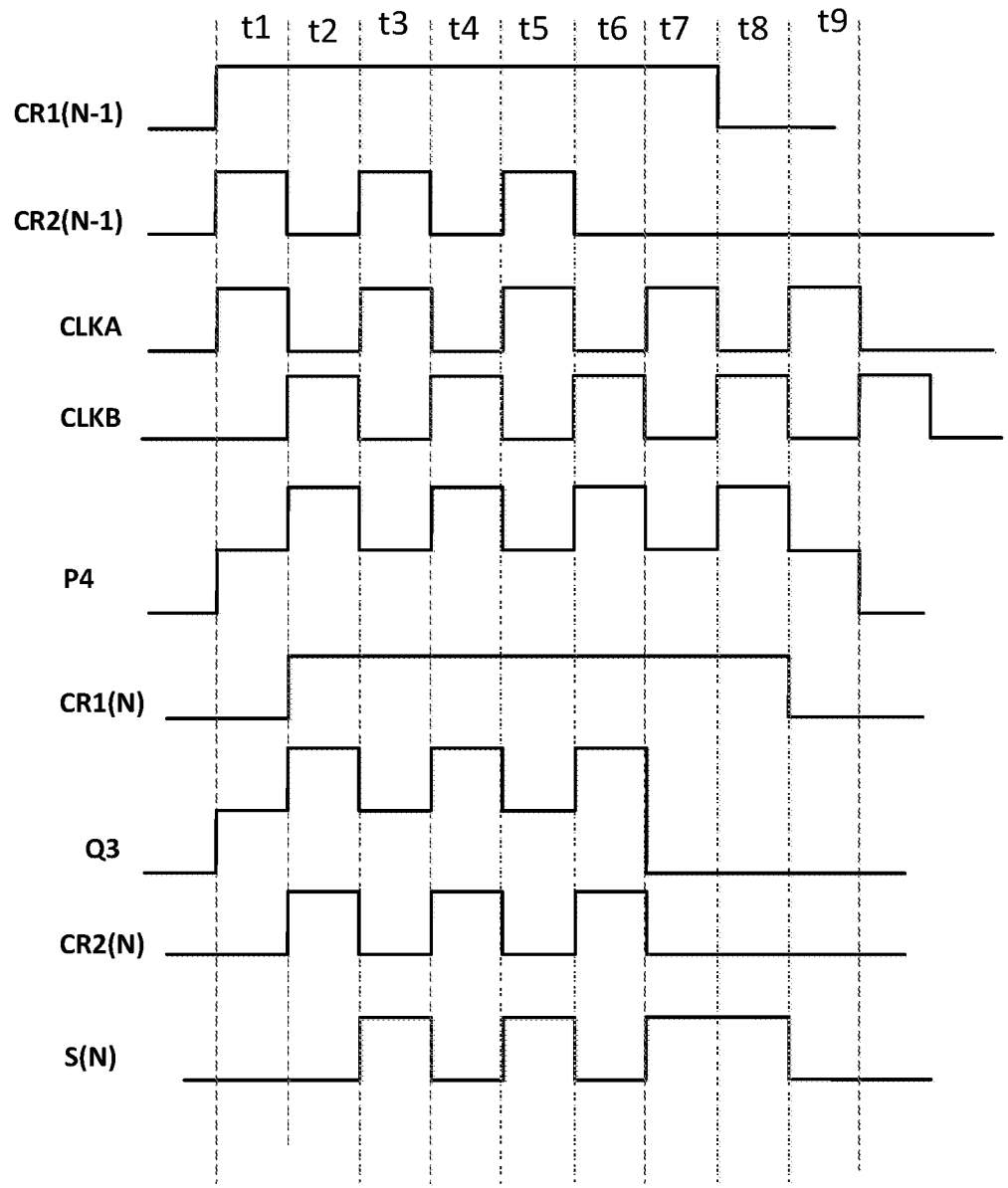
FIG. 19 is a working timing diagram of the signal generation unit circuit according to the second embodiment of the present disclosure.

As shown in FIG. 19, when the second specific embodiment of the signal generation unit circuit shown in FIG. 18 of the present disclosure in operation, In the first time period t1, CR1 (N−1) provides a high voltage, CR2 (N−1) provides a high voltage, CR2 (N+5) provides a low voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, Mc2 is turned off, the potential of P4 is a high voltage, Mc3 is turned on, Mc4 is turned off, CR1 (N) outputs a low voltage, MO1 is turned off, MO2 is turned off; T1 is turned on, the potential of Q3 is a high voltage, T6 is turned on, T7 is turned on, T8 is turned on, the potential of Q4 is a low voltage, T3 is turned on, T4 is turned off, T9 is turned on, T10 is turned off, CR2(N) outputs a low voltage, T11 and T12 are both turned off, S(N) outputs a low voltage;

In the second time period t2, CR1 (N−1) provides a high voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned on, the potential of P3 is a high voltage, Mc6 is turned off, Mc3 is turned on, the potential of P4 is pulled up by the bootstrapping, Mc3 is turned on, Mc4 is turned on, CR1 (N) outputs a high voltage, MO1 is turned on, Mc7 and Mc8 are turned on, the potential of P2 is a low voltage, MO2 is turned off; T1 is turned off, T6 is turned on, T7 is turned off, T8 is turned off, the potential of Q4 is a low voltage, T2 is turned off, the potential of Q3 is pulled up by the bootstrapping, and T3 is turned on, T9 and T10 are both turned on, T3 is turned on, the potential of Q5 is a high voltage, T4 is turned on, CR2 (N) outputs a high voltage, T11 is turned on, Do outputs a high voltage, M13 is turned off, S (N) outputs a low voltage;

In the third time period t3, CR1 (N−1) provides a high voltage, CR2 (N−1) provides a high voltage, CR2 (N+5) provides a low voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, and the potential of P4 is a high voltage (in the third time period t3, although the potential of P4 is pulled down, the potential of P4 can still control Mc3 to be turned on), Mc3 is turned on, Mc4 is turned off, Mc7 is turned off, Mc8 is turned off, the potential of P2 is a low voltage, CR1 (N) outputs a high voltage, MO1 is turned on, and MO2 is turned off;

T1 is turned on, T6 is turned on, T7 is turned on, T8 is turned on, the potential of Q4 is a low voltage, T2 is turned off, the potential of Q3 is a high voltage, T9 is turned on, T10 is turned off, T3 is turned on, and the potential of Q5 is a low voltage, T4 is turned off, at the beginning of the third time period t3, T11 is turned on, the second clock signal with reduced potential pulls down the potential of CR2 (N) through C5, to control T11 to be turned off, CR2 (N) outputs a low voltage, Do outputs a low voltage, M13 is turned off, S(N) outputs a high voltage;

In the fourth time period t4, CR1 (N−1) provides a high voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned off, the potential of P3 is a high voltage, Mc6 is turned off, Mc3 is turned on, the potential of P4 is pulled up by the bootstrapping, both Mc7 and Mc8 are turned on, the potential of P2 is a low voltage, Mc2 is turned off, the potential of P5 is a high voltage, Mc4 is turned on, CR1 (N) outputs a high voltage, MO1 is turned on, and MO2 is turned off;

T1 is turned off, T6 is turned on, T7 is turned off, T8 is turned off, the potential of Q3 is a high voltage, T3 is turned on, the potential of Q5 is a high voltage, T4 is turned on, CR2 (N) provides a high voltage, both T9 and T10 are turned on, the potential of Q4 is a low voltage, T12 is turned off, T11 is turned on, Do outputs a high voltage, M13 is turned on, and S(N) outputs a low voltage;

In the fifth time period t5, CR1 (N−1) provides a high voltage, CR2 (N−1) provides a high voltage, CR2 (N+5) provides a low voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, Mc2 is turned off, the potential of P4 is a high voltage (in the fifth time period t5, although the potential of P4 is pulled down, the potential of P4 can still control Mc3 to be turned on), Mc3 is turned on, Mc4 is turned off, Mc7 is turned on, Mc8 is turned off, CR1 (N) outputs a high voltage, MO1 is turned on, and MO2 is turned off;

T1 is turned on, T6 is turned on, T7 is turned on, T8 is turned on, the potential of Q4 is a low voltage, T12 is turned off, T5 is turned off, the potential of Q3 is a high voltage, T3 is turned on, the potential of Q5 is a low voltage, T4 is turned off, at the beginning of the fifth time period t5, T11 is turned on, the second clock signal with reduced potential pulls down the potential of CR2 (N) through C5, CR2 (N) outputs a low voltage to control T11 to be turned off, Do outputs a low voltage, M13 is closed, S(N) outputs a high voltage;

In the sixth time period t6, CR1 (N−1) provides a high voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned on, the potential of P3 is a low voltage, Mc6 is turned off, Mc3 is turned on, the potential of P4 is pulled up by the bootstrapping, both Mc7 and Mc8 are turned on, the potential of P2 is a low voltage, Mc5 is turned off, and the potential of P5 is a high voltage, Mc4 is turned on, CR1 (N) outputs a high voltage, MO1 is turned on, and MO2 is turned off;

T1 is turned off, T6 is turned on, T7 is turned off, T8 is turned off, the potential of Q3 is a high voltage, both T9 and T10 are turned on, the potential of Q4 is a low voltage, T2 is turned off, T3 is turned on, the potential of Q5 is a high voltage, T4 is turned on, CR2(N) outputs a high voltage, T11 is turned on, T12 is turned off, Do outputs a high voltage, M13 is turned on; S(N) outputs a low voltage;

In the seventh time period t7, CR1 (N−1) provides a high voltage, CR2 (N−1) provides a low voltage, CR2 (N+5) provides a high voltage, CLKA provides a high voltage, CLKB provides a low voltage, and Mc1 is turned on, Mc9 is turned on, Mc10 is turned on, the potential of P3 is a low voltage, Mc6 is turned on, the potential of P2 is a low voltage, Mc2 is turned off, the potential of P4 is a high voltage, Mc3 is turned on, Mc4 is turned off, Mc7 is turned on, Mc8 is turned off, MO2 is turned off, CR1 (N) continues to output a high voltage, and MO1 is turned on;

T1 is turned on, T6 is turned on, T7 is turned off, T8 is turned on, the potential of Q4 is a high voltage, T2 is turned on, the potential of Q3 is a low voltage, T3 is turned off, T4 is turned off, T5 is turned on, CR2 (N) outputs a low voltage, T11 is turned off, T12 is turned on, Do outputs a low voltage, M13 is turned off, S(N) output a high voltage;

In the eighth time period t8, CR1 (N−1) provides a low voltage, CR2 (N−1) provides a low voltage, CR2 (N+5) provides a low voltage, CLKA provides a low voltage, CLKB provides a high voltage, Mc1 is turned off, Mc9 is turned on, Mc10 is turned off, the potential of P3 is a low voltage, Mc6 is turned off, Mc3 is turned on, the potential of P4 is pulled up by the bootstrapping, both Mc7 and Mc8 are turned on, the potential of P2 is a low voltage, MO2 is turned off, and Mc3 is turned on, Mc4 is turned on, CR1 (N) outputs a high voltage, MO1 is turned on, and MO2 is turned off;

T1 is turned off, T6 is turned on, T7 is turned off, T8 is turned off, the potential of Q4 is maintained at a high voltage, T12 is turned on, T5 is turned on, CR2 (N) outputs a low voltage, T11 is turned off, T12 is turned on, M13 is turned off, and MO1 is turned on, MO2 is turned off, S(N) provides a high voltage;

In the ninth time period t9, CR1 (N−1) provides a low voltage, CR2 (N−1) provides a low voltage, CR2 (N+5) provides a high voltage, CLKA provides a high voltage, CLKB provides a low voltage, and Mc1 is turned on, Mc9 is turned on, Mc10 is turned off, the potential of P3 is a high voltage, Mc6 is turned on, the potential of P2 is a high voltage, Mc5 is turned on, CR1 (N) outputs a low voltage, MO1 is turned off, MO2 is turned on, S (N) outputs a low voltage;

T1 is turned on, T6 is turned on, T7 is turned off, the potential of Q3 is a low voltage, T9 is turned off, T8 is turned on, the potential of Q4 is a high voltage, T2 is turned on, T4 is turned off, T5 is turned on, CR2 (N) provides a low voltage, T11 is turned off, T12 is turned on, the potential of the gate electrode of M13 is a low voltage, and M13 is turned off.

Optionally, the fourth control node control sub-circuit may include a first input transistor, a second input transistor, a sixth generation control transistor, a seventh generation control transistor, an eighth generation control transistor, a ninth generation control transistor, and a tenth generation control transistor and a third generation control capacitor;

A control electrode of the first input transistor and a first electrode of the first input transistor are both electrically connected to the first voltage terminal;

A control electrode of the second input transistor is electrically connected to the (N−1)th stage of second carry signal terminal, a first electrode of the second input transistor is electrically connected to a second electrode of the first input transistor, and the second electrode of the second input transistor is electrically connected to the second voltage terminal;

A control electrode of the sixth generation control transistor is electrically connected to a first electrode of the second input transistor, and a first electrode of the sixth generation control transistor is electrically connected to the first voltage terminal;

A control electrode of the seventh generation control transistor is electrically connected to the (N−1)th stage of second carry signal terminal, a first electrode of the seventh generation control transistor is electrically connected to a second electrode of the sixth generation control transistor, a second electrode of the seventh generation control transistor is electrically connected to the second voltage terminal;

A control electrode of the eighth generation control transistor is electrically connected to the first clock signal terminal, a first electrode of the eighth generation control transistor is electrically connected to a first electrode of the seventh generation control transistor, and a second electrode of the eighth generation control transistor is electrically connected to the fourth control node;

A control electrode of the ninth generation control transistor is electrically connected to the third control node, and a first electrode of the ninth generation control transistor is electrically connected to the second voltage terminal;

A control electrode of the tenth generation control transistor is electrically connected to the second clock signal terminal, a first electrode of the tenth generation control transistor is electrically connected to a second electrode of the ninth generation control transistor, and a second electrode of the tenth generation control transistor is electrically connected to the third control node;

A first terminal of the third generation control capacitor is electrically connected to the fourth control node, and a second terminal of the third generation control capacitor is electrically connected to the second voltage terminal.

Figure 20:
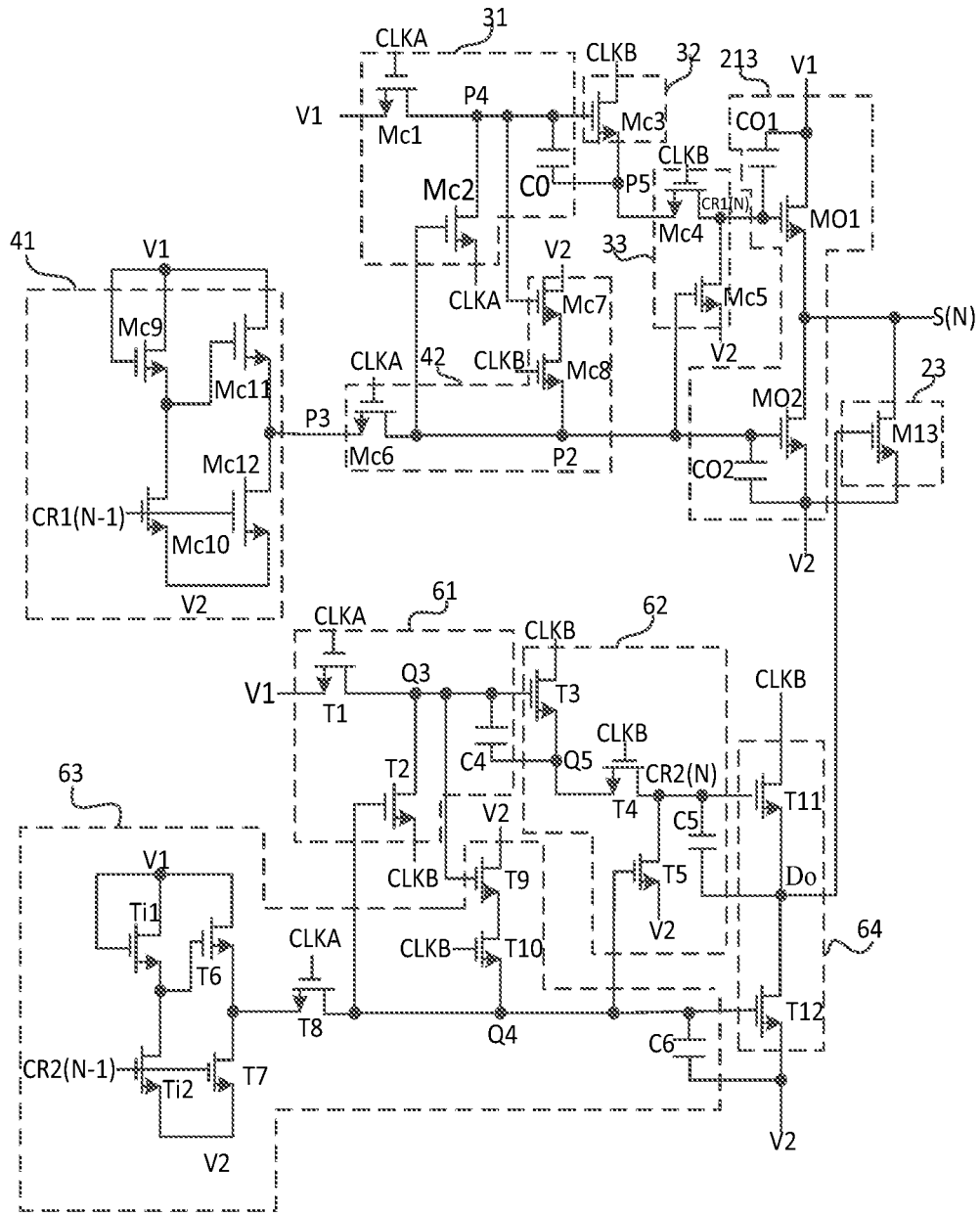
FIG. 20 is a circuit diagram of the signal generation unit circuit according to a third embodiment of the present disclosure.

As shown in FIG. 20, the third specific embodiment of the signal generation unit circuit described in the present disclosure includes a signal generation circuit 21, an output control signal generation circuit 22 and an output control circuit 23, wherein, The signal generation circuit includes a carry signal control circuit 211, a second node control circuit 212 and an output circuit 213;

The carry signal control circuit includes a first control sub-circuit 31, a second control sub-circuit 32 and a carry signal control sub-circuit 33;

The first control sub-circuit 31 includes a first control transistor Mc1, a second control transistor Mc2 and a control capacitor C0, the second control sub-circuit 32 includes a fourth control transistor Mc3, and the carry signal control sub-circuit 33 includes a fourth control transistors Mc4 and a fifth control transistors Mc5, wherein, The gate electrode of the first control transistor Mc1 is electrically connected to the first clock signal terminal CLKA, the drain electrode of the first control transistor Mc1 is electrically connected to the first voltage terminal V1, and the source electrode of the first control transistor Mc1 is electrically connected to the fourth node P4;

The gate electrode of the second control transistor Mc2 is electrically connected to the second node P2, the drain electrode of the second control transistor Mc2 is electrically connected to the fourth node P4, and the source electrode of the second control transistor Mc2 is electrically connected to the first clock signal terminal CLKA; the first terminal of the control capacitor C0 is electrically connected to the fourth node P4, and the second terminal of the control capacitor C0 is electrically connected to the fifth node P5;

The gate electrode of the third control transistor Mc3 is electrically connected to the fourth node P4, the drain electrode of the third control transistor Mc3 is electrically connected to the second clock signal terminal CLKB, and the source electrode of the third control transistor Mc3 is electrically connected to the fifth node P5;

The gate electrode of the fourth control transistor Mc4 is electrically connected to the second clock signal terminal CLKB, the drain electrode of the fourth control transistor Mc4 is electrically connected to the fifth node P5, and the source electrode of the fourth control transistor Mc4 is electrically connected to the N-th stage of first carry signal terminal CR1 (N);

The gate electrode of the fifth control transistor Mc5 is electrically connected to the second node P2, the drain electrode of the fifth control transistor Mc5 is electrically connected to the N-th stage of first carry signal terminal CR1(N), and the source electrode of the fifth control transistor Mc5 is electrically connected to the second voltage terminal V2;

The second node control circuit includes a third node control sub-circuit 41 and a second node control sub-circuit 42;

The second node control sub-circuit 42 includes a sixth control transistor Mc6, a seventh control transistor Mc7 and an eighth control transistor Mc8, wherein, The gate electrode of the sixth transistor Mc6 is electrically connected to the first clock signal terminal CLKA, the drain electrode of the sixth control transistor Mc6 is electrically connected to the third node P3, and the source electrode of the sixth control transistor Mc6 is electrically connected to the second node P2;

The gate electrode of the seventh control transistor Mc7 is electrically connected to the fourth node P4, and the drain electrode of the seventh control transistor Mc7 is electrically connected to the second voltage terminal V2;

The gate electrode of the eighth control transistor Mc8 is electrically connected to the second clock signal terminal CLKB, the drain electrode of the eighth control transistor Mc8 is electrically connected to the source electrode of the seventh control transistor Mc7, and the source electrode of the eighth control transistor Mc8 is electrically connected to the second node P2;

The third node control sub-circuit 41 includes a ninth control transistor Mc9, a tenth control transistor Mc10, an eleventh control transistor Mc11 and a twelfth control transistor Mc12, wherein, The gate electrode of the ninth control transistor Mc9 and the drain electrode of the ninth control transistor Mc9 are electrically connected to the first voltage terminal V1;

The gate electrode of the tenth control transistor Mc10 is electrically connected to the (N-1)th stage of first carry signal terminal CR1 (N-1), and the drain electrode of the tenth control transistor Mc10 is electrically connected to the source electrode of the ninth control transistor Mc10, and the source electrode of the tenth control transistor Mc10 is electrically connected to the second voltage terminal V2;

The gate electrode of the eleventh control transistor Mc11 is electrically connected to the source electrode of the ninth control transistor Mc9, the drain electrode of the eleventh control transistor Mc11 is electrically connected to the first voltage terminal V1, and the source electrode of the eleventh control transistor Mc11 is electrically connected to the third node P3;

The gate electrode of the twelfth control transistor Mc12 is electrically connected to the (N-1)th stage of first carry signal terminal CR1 (N-1), and the drain electrode of the twelfth control transistor Mc12 is electrically connected to the third node P3, the source electrode of the twelfth control transistor Mc12 is electrically connected to the second voltage terminal V2;

The output circuit 213 includes a first output transistor MO1, a second output transistor MO2, a first output capacitor CO1 and a second output capacitor CO2, wherein, The gate electrode of the first output transistor MO1 is electrically connected to the N-th stage of first carry signal terminal CR1 (N), the drain electrode of the first output transistor MO1 is electrically connected to the first voltage terminal V1, and the source electrode of the first output transistor MO1 is electrically connected to the first signal output terminal S(N);

The gate electrode of the second output transistor MO2 is electrically connected to the second node P2, the drain electrode of the second output transistor MO2 is electrically connected to the first signal output terminal S(N), and the source electrode of the second output transistor MO2 is electrically connected to the second voltage terminal V2;

The first terminal of the first output capacitor CO1 is electrically connected to the first voltage terminal V1, and the second terminal of the first output capacitor CO1 is electrically connected to the N-th stage of first carry signal terminal CR1(N);

The first terminal of the second output capacitor CO2 is electrically connected to the second node P2, and the second terminal of the second output capacitor CO2 is electrically connected to the second voltage terminal V2;

The output control circuit 23 includes a first output control transistor M13;

The gate electrode of the first output control transistor M13 is electrically connected to the output control terminal Do, the drain electrode of the first output control transistor M13 is electrically connected to the first signal output terminal S(N), and the source electrode of the first output control transistor M13 is electrically connected to the second voltage terminal V2;

The output control signal generation circuit includes a third control node control sub-circuit 61, a second carry signal generation sub-circuit 62, a fourth control node control sub-circuit 63 and an output control signal generation sub-circuit 64, wherein, The third control node control sub-circuit 61 includes a first generation control transistor T1, a second generation control transistor T2 and a first generation control capacitor C4, wherein, The gate electrode of the first generation control transistor T1 is electrically connected to the first clock signal terminal CLKA, the drain electrode of the first generation control transistor T1 is electrically connected to the first voltage terminal V1, and the source electrode of the first generation control transistor T1 is electrically connected to the third control node Q3;

The control electrode of the second generation control transistor T2 is electrically connected to the fourth control node Q4, the drain electrode of the second generation control transistor T2 is electrically connected to the third control node Q3, and the source electrode of the second generation control transistor T2 is electrically connected to the second clock signal terminal CLKB;

The first terminal of the first generation control capacitor C4 is electrically connected to the third control node Q3, and the second terminal of the first generation control capacitor C4 is electrically connected to the fifth control node Q5;

The second carry signal generation sub-circuit 62 includes a third generation control transistor T3, a fourth generation control transistor T4, a fifth generation control transistor T5 and a second generation control capacitor C5, wherein, The gate electrode of the third generation control transistor T3 is electrically connected to the third control node Q3, the drain electrode of the third generation control transistor T3 is electrically connected to the second clock signal terminal CLKB, and the source electrode of the third generation control transistor T3 is electrically connected to the fifth control node Q5;

The gate electrode of the fourth generation control transistor T4 is electrically connected to the second clock signal terminal CLKB, the drain electrode of the fourth generation control transistor T4 is electrically connected to the fifth control node Q5, and the source electrode of the fourth generation control transistor T4 is electrically connected to the N-th stage of second carry signal terminal CR2 (N);

The gate electrode of the fifth generation control transistor T5 is electrically connected to the fourth control node Q4, and the drain electrode of the fifth generation control transistor T5 is electrically connected to the N-th stage of second carry signal terminal CR2(N), the source electrode of the fifth generation control transistor T5 is electrically connected to the second voltage terminal V2;

The first terminal of the second generation control capacitor C5 is electrically connected to the N-th stage of second carry signal terminal CR2(N), and the second terminal of the second generation control capacitor C5 is electrically connected to the output control terminal Do;

The fourth control node control sub-circuit 63 includes a first input transistor Ti1, a second input transistor Ti2, a sixth generation control transistor T6, a seventh generation control transistor T7, an eighth generation control transistor T8, a ninth generation control transistor T9, a tenth generation control transistor T10 and a third generation control capacitor C6;

The gate electrode of the first input transistor Ti1 and the drain electrode of the first input transistor Ti1 are both electrically connected to the first voltage terminal V1;

The gate electrode of the second input transistor Ti2 is electrically connected to the (N−1)th stage of second carry signal terminal CR2 (N−1), and the drain electrode of the second input transistor Ti2 is electrically connected to the source electrode of the first input transistor Ti1, and the source electrode of the second input transistor Ti2 is electrically connected to the second voltage terminal V2;

The gate electrode of the sixth generation control transistor T6 is electrically connected to the drain electrode of the second input transistor Ti2, and the drain electrode of the sixth generation control transistor T6 is electrically connected to the first voltage terminal;

The gate electrode of the seventh generation control transistor T7 is electrically connected to the (N−1)th stage of second carry signal terminal CR2 (N−1), and the drain electrode of the seventh generation control transistor T7 is electrically connected to the source electrode of the sixth generation control transistor T6, and the source electrode of the seventh generation control transistor T7 is electrically connected to the second voltage terminal V2;

The gate electrode of the eighth generation control transistor T8 is electrically connected to the first clock signal terminal CLKA, the drain electrode of the eighth generation control transistor T8 is electrically connected to the drain electrode of the seventh generation control transistor T7, the source electrode of the eighth generation control transistor T8 is electrically connected to the fourth control node Q4;

The gate electrode of the ninth generation control transistor T9 is electrically connected to the third control node Q3, and the drain electrode of the ninth generation control transistor T9 is electrically connected to the second voltage terminal V2;

The gate electrode of the tenth generation control transistor T10 is electrically connected to the second clock signal terminal CLKB, the drain electrode of the tenth generation control transistor T10 is electrically connected to the source electrode of the ninth generation control transistor T9, and the source electrode of the tenth generation control transistor T10 is electrically connected to the third control node Q3;

The first terminal of the third generation control capacitor C6 is electrically connected to the fourth control node Q4, and the second terminal of the third generation control capacitor C6 is electrically connected to the second voltage terminal V2;

The output control signal generation sub-circuit 64 includes an eleventh generation control transistor T11 and a twelfth generation control transistor T12, wherein, The gate electrode of the eleventh generation control transistor T11 is electrically connected to the N-th stage of second carry signal terminal CR2(N), the drain electrode of the eleventh generation control transistor T11 is electrically connected to the second clock signal terminal CLKB, the source electrode of the eleventh generation control transistor T11 is electrically connected to the output control terminal Do;

The gate electrode of the twelfth generation control transistor T12 is electrically connected to the fourth control node Q4, the drain electrode of the twelfth generation control transistor T12 is electrically connected to the output control terminal Do, and the source electrode of the twelfth generation control transistor T12 is electrically connected to the second voltage terminal V2.

In the third specific embodiment of the signal generation unit circuit shown in FIG. 20, N may be a positive integer.

In the third specific embodiment of the signal generation unit circuit shown in FIG. 20, the width-to-length ratio of Mc10 is greater than that of Mc9, the width-to-length ratio of Mc12 is greater than that of Mc11, and the width-to-length ratio of T7 is greater than that of T6, the width-to-length ratio of Ti2 is greater than that of Ti1, but not limited thereto.

In the third specific embodiment of the signal generation unit circuit shown in FIG. 20, all transistors are n-type thin film transistors, but not limited to this.

In the third specific embodiment of the signal generation unit circuit shown in FIG. 20, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

The third specific embodiment of the signal generation unit circuit shown in FIG. 20 of the present disclosure is different from the second specific embodiment of the signal generation unit circuit shown in FIG. 18 of the present disclosure as follows:

The third node control sub-circuit 41 includes a ninth control transistor Mcg, a tenth control transistor Mc10, an eleventh control transistor Mc11 and a twelfth control transistor Mc12;

In the fourth control node control sub-circuit 63, a first input transistor Ti1 and a second input transistor Ti2 are added;

The third specific embodiment of the signal generation unit circuit shown in FIG. 20 of the present disclosure adopts a multi-transistor input structure to ensure the amplitude of the input voltage (the input voltage may be the (N−1)th stage of first carry signal, and the (N−1)th stage of second carry signal).

When the third specific embodiment of the signal generation unit circuit of the present disclosure as shown in FIG. 20 is in operation, when the (N−1)th stage of first carry signal provided by CR1 (N−1) is a high voltage signal, Mc10 is turned on, at this time, the potential of the gate electrode of Mc11 is a low voltage, Mc11 is turned off, and Mc12 is turned on, which can ensure that the potential of P3 is a low voltage;

When the (N−1)th stage of second carry signal provided by CR2 (N−1) is a high voltage signal, Ti1 is turned on, and the potential of the gate electrode of T6 is a low voltage, T6 is turned off, and T7 is turned on, which can ensure that the potential of the source electrode of T6 is a low potential.

Figure 21:
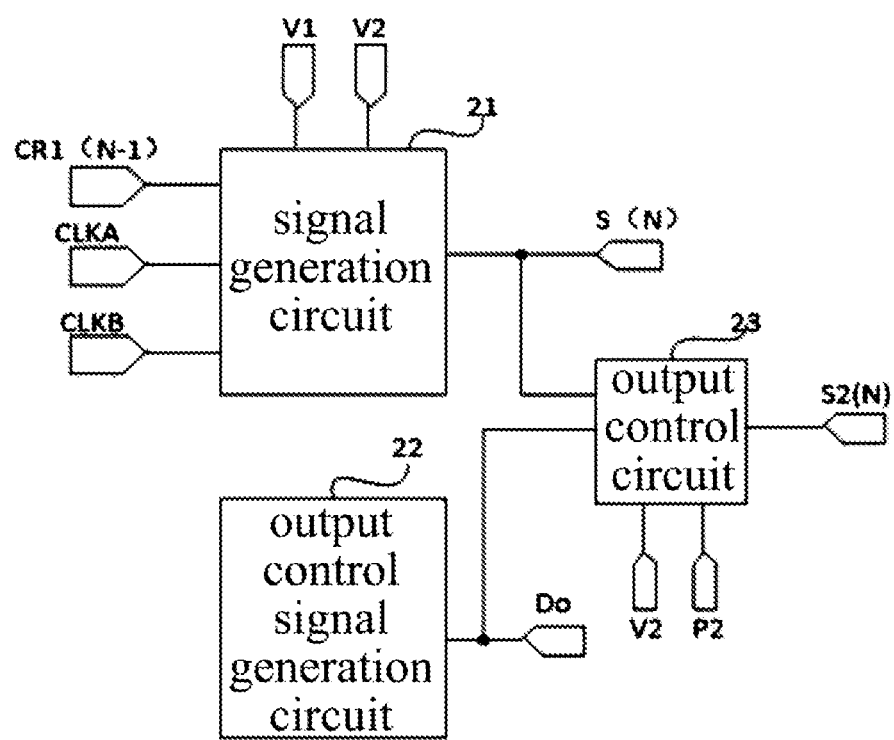
FIG. 21 is a structural diagram of a signal generation unit circuit according to at least one embodiment of the present disclosure.

In at least one embodiment of the present disclosure, as shown in FIG. 21, on the basis of the embodiment of the signal generation unit circuit shown in FIG. 10, the output control circuit 23 can also be electrically connected to the first voltage terminal V2, the second signal output terminal S2(N), the second node P2 and the first signal output terminal S(N), and is configured to control to connect the second signal output terminal S2(N) and the first voltage terminal V1 under the control of the scan signal outputted by the first signal output terminal S(N), and control to connect the second signal output terminal S2(N) and the second voltage terminal V2 under the control of the potential of the second node P2.

Optionally, the output control circuit may include a first output control transistor, a second output control transistor, a third output control transistor, and an output control capacitor, wherein a control electrode of the first output control transistor is electrically connected to the output control terminal, a first electrode of the first output control transistor is electrically connected to the first signal output terminal, and a second electrode of the first output control transistor is electrically connected to the second voltage terminal;

A control electrode of the second output control transistor is electrically connected to the first signal output terminal, a first electrode of the second output control transistor is electrically connected to the first voltage terminal, and a second electrode of the second output control transistor is electrically connected to the second signal output terminal;

A control electrode of the third output control transistor is electrically connected to the second node, a first electrode of the third output control transistor is electrically connected to the second signal output terminal, and a second electrode of the third output control transistor is electrically connected to the second voltage terminal;

A first terminal of the output control capacitor is electrically connected to the first voltage terminal, and a second terminal of the output control capacitor is electrically connected to the first signal output terminal.

Figure 22:
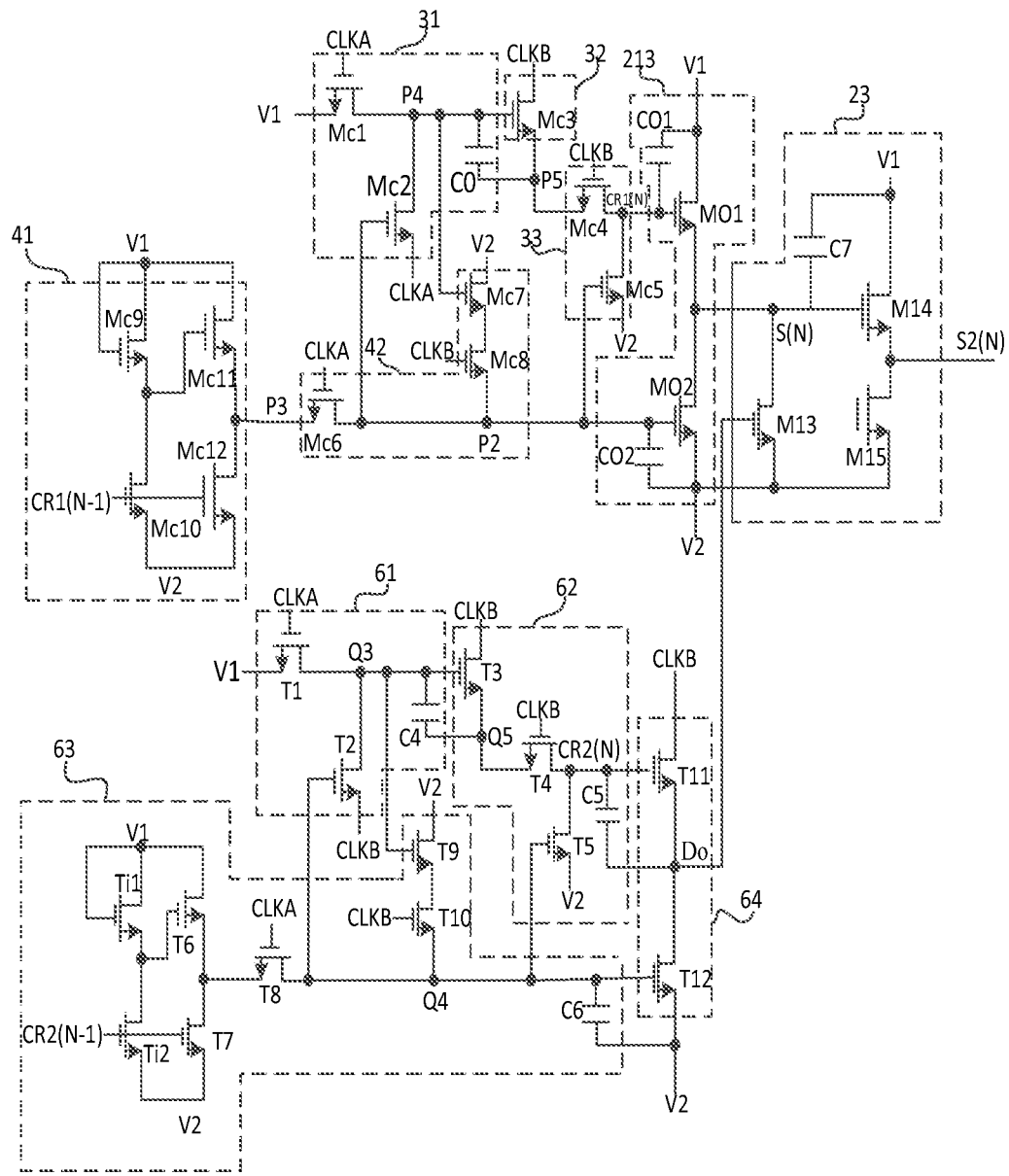
FIG. 22 is a circuit diagram of the signal generation unit circuit according to a fourth embodiment of the present disclosure.

As shown in FIG. 22, the fourth specific embodiment of the signal generation unit circuit described in the present disclosure includes a signal generation circuit 21, an output control signal generation circuit 22 and an output control circuit 23, wherein, The signal generation circuit includes a carry signal control circuit 211, a second node control circuit 212 and an output circuit 213;

The carry signal control circuit includes a first control sub-circuit 31, a second control sub-circuit 32 and a carry signal control sub-circuit 33;

The first control sub-circuit 31 includes a first control transistor Mc1, a second control transistor Mc2 and a control capacitor C0, the second control sub-circuit 32 includes a fourth control transistor Mc3, and the carry signal control sub-circuit 33 includes a fourth control transistors Mc4 and a fifth control transistors Mc5, wherein, The gate electrode of the first control transistor Mc1 is electrically connected to the first clock signal terminal CLKA, the drain electrode of the first control transistor Mc1 is electrically connected to the first voltage terminal V1, and the source electrode of the first control transistor Mc1 is electrically connected to the fourth node P4;

The gate electrode of the second control transistor Mc2 is electrically connected to the second node P2, the drain electrode of the second control transistor Mc2 is electrically connected to the fourth node P4, and the source electrode of the second control transistor Mc2 is electrically connected to the first clock signal terminal CLKA; the first terminal of the control capacitor C0 is electrically connected to the fourth node P4, and the second terminal of the control capacitor C0 is electrically connected to the fifth node P5;

The gate electrode of the third control transistor Mc3 is electrically connected to the fourth node P4, the drain electrode of the third control transistor Mc3 is electrically connected to the second clock signal terminal CLKB, and the source electrode of the third control transistor Mc3 is electrically connected to the fifth node P5;

The gate electrode of the fourth control transistor Mc4 is electrically connected to the second clock signal terminal CLKB, the drain electrode of the fourth control transistor Mc4 is electrically connected to the fifth node P5, and the source electrode of the fourth control transistor Mc4 is electrically connected to the N-th stage of first carry signal terminal CR1 (N);

The gate electrode of the fifth control transistor Mc5 is electrically connected to the second node P2, the drain electrode of the fifth control transistor Mc5 is electrically connected to the N-th stage of first carry signal terminal CR1(N), and the source electrode of the fifth control transistor Mc5 is electrically connected to the second voltage terminal V2;

The second node control circuit includes a third node control sub-circuit 41 and a second node control sub-circuit 42;

The second node control sub-circuit 42 includes a sixth control transistor Mc6, a seventh control transistor Mc7 and an eighth control transistor Mc8, wherein, The gate electrode of the sixth transistor Mc6 is electrically connected to the first clock signal terminal CLKA, the drain electrode of the sixth control transistor Mc6 is electrically connected to the third node P3, and the source electrode of the sixth control transistor Mc6 is electrically connected to the second node P2;

The gate electrode of the seventh control transistor Mc7 is electrically connected to the fourth node P4, and the drain electrode of the seventh control transistor Mc7 is electrically connected to the second voltage terminal V2;

The gate electrode of the eighth control transistor Mc8 is electrically connected to the second clock signal terminal CLKB, the drain electrode of the eighth control transistor Mc8 is electrically connected to the source electrode of the seventh control transistor Mc7, and the source electrode of the eighth control transistor Mc8 is electrically connected to the second node P2;

The third node control sub-circuit 41 includes a ninth control transistor Mc9, a tenth control transistor Mc10, an eleventh control transistor Mc11 and a twelfth control transistor Mc12, wherein, The gate electrode of the ninth control transistor Mc9 and the drain electrode of the ninth control transistor Mc9 are electrically connected to the first voltage terminal V1;

The gate electrode of the tenth control transistor Mc10 is electrically connected to the (N−1)th stage of first carry signal terminal CR1 (N−1), and the drain electrode of the tenth control transistor Mc10 is electrically connected to the source electrode of the ninth control transistor Mc10, and the source electrode of the tenth control transistor Mc10 is electrically connected to the second voltage terminal V2;

The gate electrode of the eleventh control transistor Mc11 is electrically connected to the source electrode of the ninth control transistor Mc9, the drain electrode of the eleventh control transistor Mc11 is electrically connected to the first voltage terminal V1, and the source electrode of the eleventh control transistor Mc11 is electrically connected to the third node P3;

The gate electrode of the twelfth control transistor Mc12 is electrically connected to the (N−1)th stage of first carry signal terminal CR1 (N−1), and the drain electrode of the twelfth control transistor Mc12 is electrically connected to the third node P3, the source electrode of the twelfth control transistor Mc12 is electrically connected to the second voltage terminal V2;

The output circuit 213 includes a first output transistor MO1, a second output transistor M02, a first output capacitor CO1 and a second output capacitor CO2, wherein, The gate electrode of the first output transistor MO1 is electrically connected to the N-th stage of first carry signal terminal CR1 (N), the drain electrode of the first output transistor MO1 is electrically connected to the first voltage terminal V1, and the source electrode of the first output transistor MO1 is electrically connected to the first signal output terminal S(N);

The gate electrode of the second output transistor MO2 is electrically connected to the second node P2, the drain electrode of the second output transistor MO2 is electrically connected to the first signal output terminal S(N), and the source electrode of the second output transistor MO2 is electrically connected to the second voltage terminal V2;

The first terminal of the first output capacitor CO1 is electrically connected to the first voltage terminal V1, and the second terminal of the first output capacitor CO1 is electrically connected to the N-th stage of first carry signal terminal CR1(N);

The first terminal of the second output capacitor CO2 is electrically connected to the second node P2, and the second terminal of the second output capacitor CO2 is electrically connected to the second voltage terminal V2;

The output control circuit 23 may include a first output control transistor M13, a second output control transistor M14, a third output control transistor M15 and an output control capacitor C7, wherein, The gate electrode of the first output control transistor M13 is electrically connected to the output control terminal Do, the drain electrode of the first output control transistor M13 is electrically connected to the first signal output terminal S(N), and the source electrode of the first output control transistor M13 is electrically connected to the second voltage terminal V2;

The gate electrode of the second output control transistor M14 is electrically connected to the first signal output terminal S(N), the drain electrode of the second output control transistor M14 is electrically connected to the first voltage terminal V1, and the source electrode of the second output control transistor M14 is electrically connected to the second signal output terminal S2 (N);

The gate electrode of the third output control transistor M15 is electrically connected to the second node P2, the drain electrode of the third output control transistor M15 is electrically connected to the second signal output terminal S2(N), and the source electrode of the third output control transistor M15 is electrically connected to the second voltage terminal V2;

The first terminal of the output control capacitor C7 is electrically connected to the first voltage terminal V1, and the second terminal of the output control capacitor C7 is electrically connected to the first signal output terminal S(N);

The output control signal generation circuit includes a third control node control sub-circuit 61, a second carry signal generation sub-circuit 62, a fourth control node control sub-circuit 63 and an output control signal generation sub-circuit 64, wherein, The third control node control sub-circuit 61 includes a first generation control transistor T1, a second generation control transistor T2 and a first generation control capacitor C4, wherein, The gate electrode of the first generation control transistor T1 is electrically connected to the first clock signal terminal CLKA, the drain electrode of the first generation control transistor T1 is electrically connected to the first voltage terminal V1, and the source electrode of the first generation control transistor T1 is electrically connected to the third control node Q3;

The control electrode of the second generation control transistor T2 is electrically connected to the fourth control node Q4, the drain electrode of the second generation control transistor T2 is electrically connected to the third control node Q3, and the source electrode of the second generation control transistor T2 is electrically connected to the second clock signal terminal CLKB;

The first terminal of the first generation control capacitor C4 is electrically connected to the third control node Q3, and the second terminal of the first generation control capacitor C4 is electrically connected to the fifth control node Q5;

The second carry signal generation sub-circuit 62 includes a third generation control transistor T3, a fourth generation control transistor T4, a fifth generation control transistor T5 and a second generation control capacitor C5, wherein, The gate electrode of the third generation control transistor T3 is electrically connected to the third control node Q3, the drain electrode of the third generation control transistor T3 is electrically connected to the second clock signal terminal CLKB, and the source electrode of the third generation control transistor T3 is electrically connected to the fifth control node Q5;

The gate electrode of the fourth generation control transistor T4 is electrically connected to the second clock signal terminal CLKB, the drain electrode of the fourth generation control transistor T4 is electrically connected to the fifth control node Q5, and the source electrode of the fourth generation control transistor T4 is electrically connected to the N-th stage of second carry signal terminal CR2 (N);

The gate electrode of the fifth generation control transistor T5 is electrically connected to the fourth control node Q4, and the drain electrode of the fifth generation control transistor T5 is electrically connected to the N-th stage of second carry signal terminal CR2(N), the source electrode of the fifth generation control transistor T5 is electrically connected to the second voltage terminal V2;

The first terminal of the second generation control capacitor C5 is electrically connected to the N-th stage of second carry signal terminal CR2(N), and the second terminal of the second generation control capacitor C5 is electrically connected to the output control terminal Do;

The fourth control node control sub-circuit 63 includes a first input transistor Ti1, a second input transistor Ti2, a sixth generation control transistor T6, a seventh generation control transistor T7, an eighth generation control transistor T8, a ninth generation control transistor T9, a tenth generation control transistor T10 and a third generation control capacitor C6;

The gate electrode of the first input transistor Ti1 and the drain electrode of the first input transistor Ti1 are both electrically connected to the first voltage terminal V1;

The gate electrode of the second input transistor Ti2 is electrically connected to the (N−1)th stage of second carry signal terminal CR2 (N−1), and the drain electrode of the second input transistor Ti2 is electrically connected to the source electrode of the first input transistor Ti1, and the source electrode of the second input transistor Ti2 is electrically connected to the second voltage terminal V2;

The gate electrode of the sixth generation control transistor T6 is electrically connected to the drain electrode of the second input transistor Ti2, and the drain electrode of the sixth generation control transistor T6 is electrically connected to the first voltage terminal;

The gate electrode of the seventh generation control transistor T7 is electrically connected to the (N−1)th stage of second carry signal terminal CR2 (N−1), and the drain electrode of the seventh generation control transistor T7 is electrically connected to the source electrode of the sixth generation control transistor T6, and the source electrode of the seventh generation control transistor T7 is electrically connected to the second voltage terminal V2;

The gate electrode of the eighth generation control transistor T8 is electrically connected to the first clock signal terminal CLKA, the drain electrode of the eighth generation control transistor T8 is electrically connected to the drain electrode of the seventh generation control transistor T7. the source electrode of the eighth generation control transistor T8 is electrically connected to the fourth control node Q4;

The gate electrode of the ninth generation control transistor T9 is electrically connected to the third control node Q3, and the drain electrode of the ninth generation control transistor T9 is electrically connected to the second voltage terminal V2;

The gate electrode of the tenth generation control transistor T10 is electrically connected to the second clock signal terminal CLKB, the drain electrode of the tenth generation control transistor T10 is electrically connected to the source electrode of the ninth generation control transistor T9, and the source electrode of the tenth generation control transistor T10 is electrically connected to the third control node Q3;

The first terminal of the third generation control capacitor C6 is electrically connected to the fourth control node Q4, and the second terminal of the third generation control capacitor C6 is electrically connected to the second voltage terminal V2;

The output control signal generation sub-circuit 64 includes an eleventh generation control transistor T11 and a twelfth generation control transistor T12, wherein, The gate electrode of the eleventh generation control transistor T11 is electrically connected to the N-th stage of second carry signal terminal CR2(N), the drain electrode of the eleventh generation control transistor T11 is electrically connected to the second clock signal terminal CLKB, the source electrode of the eleventh generation control transistor T11 is electrically connected to the output control terminal Do;

The gate electrode of the twelfth generation control transistor T12 is electrically connected to the fourth control node Q4, the drain electrode of the twelfth generation control transistor T12 is electrically connected to the output control terminal Do, and the twelfth generation control transistor T12 is electrically connected to the output control terminal Do, the source electrode of the twelfth generation control transistor T12 is electrically connected to the second voltage terminal V2.

In the fourth specific embodiment of the signal generation unit circuit shown in FIG. 22, N may be a positive integer.

In the fourth specific embodiment of the signal generation unit circuit shown in FIG. 22, the width-to-length ratio of Mc10 is greater than that of Mc9, the width-to-length ratio of Mc12 is greater than that of Mc11, and the width-to-length ratio of T7 is greater than that of T6, the width-to-length ratio of Ti2 is greater than that of Ti1, but not limited thereto.

In the fourth specific embodiment of the signal generation unit circuit shown in FIG. 22, all transistors are n-type thin film transistors, but not limited thereto.

In the fourth specific embodiment of the signal generation unit circuit shown in FIG. 22, the first voltage terminal V1 may be a high voltage terminal, the second voltage terminal V2 may be a low voltage terminal, and the first voltage terminal V1 is used for providing a high voltage signal, the second voltage terminal V2 is used for providing a low voltage signal, but not limited thereto.

The fourth specific embodiment of the signal generation unit circuit shown in FIG. 22 of the present disclosure is different from the third specific embodiment of the signal generation unit circuit shown in FIG. 19 in the present disclosure in that the output control circuit includes a first output control transistor M13, a second output control transistor M14, a third output control transistor M15 and an output control capacitor C7.

In the fourth specific embodiment of the signal generation unit circuit shown in FIGS. 22, M14 and M15 form a buffer circuit, so that when the voltage is divided, the current generated at the voltage dividing node is smaller and the power consumption is smaller.

In the fourth specific embodiment of the signal generation unit circuit shown in FIG. 22 of the present disclosure, the width to length ratio of M14 is relative large, the parasitic capacitance between the gate electrode of M14 and the source electrode of M14 is large, so when M14 is turned off, S(N) provides a low voltage, the potential of the voltage signal outputted by S2(N) is also pulled down.

Figure 23:
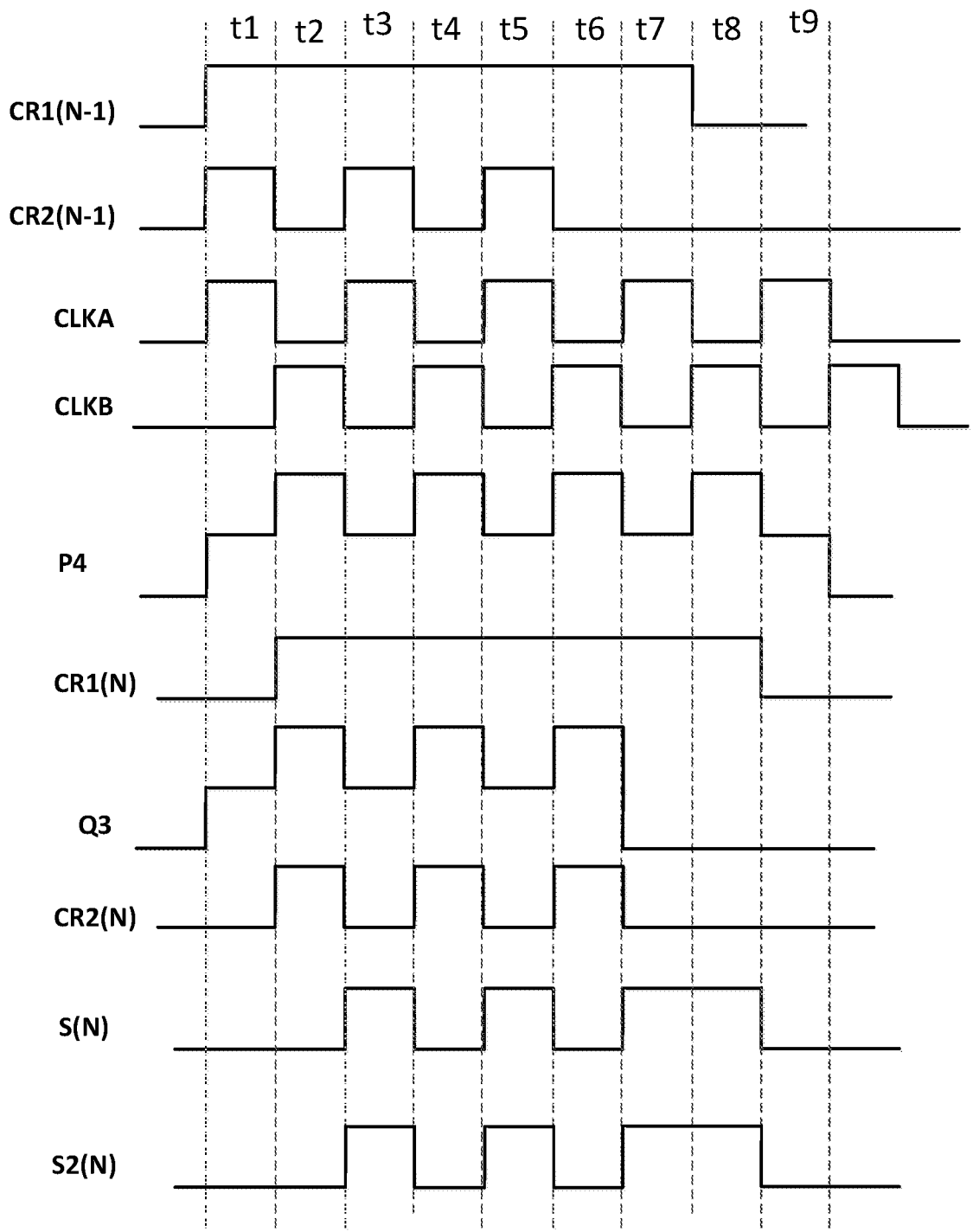
FIG. 23 is a working timing diagram of the signal generation unit circuit according to the fourth embodiment of the present disclosure.

As shown in FIG. 23, when the fourth specific embodiment of the signal generation unit circuit shown in FIG. 22 of the present disclosure in operation, In the first time period t1, the potential of P2 is a low voltage, S(N) outputs a low voltage, and S2(N) outputs a low voltage;

In the second time period t2, S(N) outputs a low voltage, the potential of P2 is a low voltage, and S2(N) outputs a low voltage;

In the third time period t3, S(N) outputs a high voltage, the potential of P2 is a low voltage, M13 is turned off, M14 is turned on, M15 is turned off, and S2(N) outputs a high voltage;

In the fourth time period t4, S(N) outputs a low voltage, the potential of P2 is a low voltage, M13 is turned on, and S2(N) outputs a low voltage;

In the fifth time period t5, S(N) has a high voltage, the potential of P2 is a low voltage, M13 is turned off, M14 is turned on, M15 is turned off, and S2(N) outputs a high voltage;

In the sixth time period t6, S(N) outputs a low voltage, the potential of P2 is a low voltage, M13 is turned on, both M14 and M15 are turned off, and S2(N) outputs a low voltage;

In the seventh time period t7, S(N) outputs a high voltage, the potential of P2 is a low voltage, M13 is turned off, M14 is turned on, M15 is turned off, and S2(N) provides a high voltage;

In the eighth time period t8, S(N) outputs a high voltage, the potential of P2 is a low voltage, M13 is turned off, and S2(N) provides a high voltage;

In the ninth time period t9, S(N) outputs a low voltage, the potential of P2 is a high voltage, M13 is turned off, M14 is turned off, M15 is turned on, and S2(N) outputs a low voltage.

Figure 24:
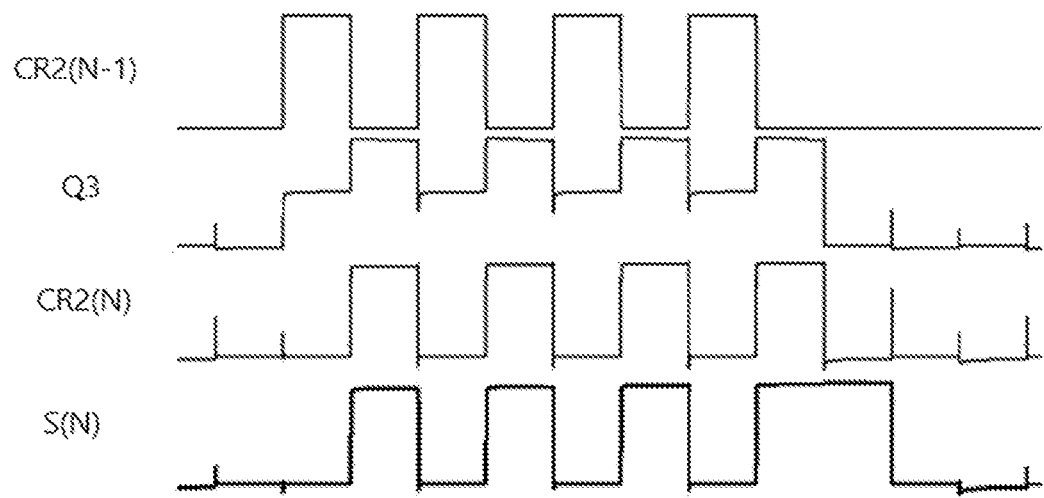
FIG. 24 is a working timing simulation diagram of the signal generation unit circuit according to the first embodiment of the present disclosure.

FIG. 24 is a simulation diagram of the working timing sequence of the signal generation unit circuit shown in FIG. 15.

Figure 25:
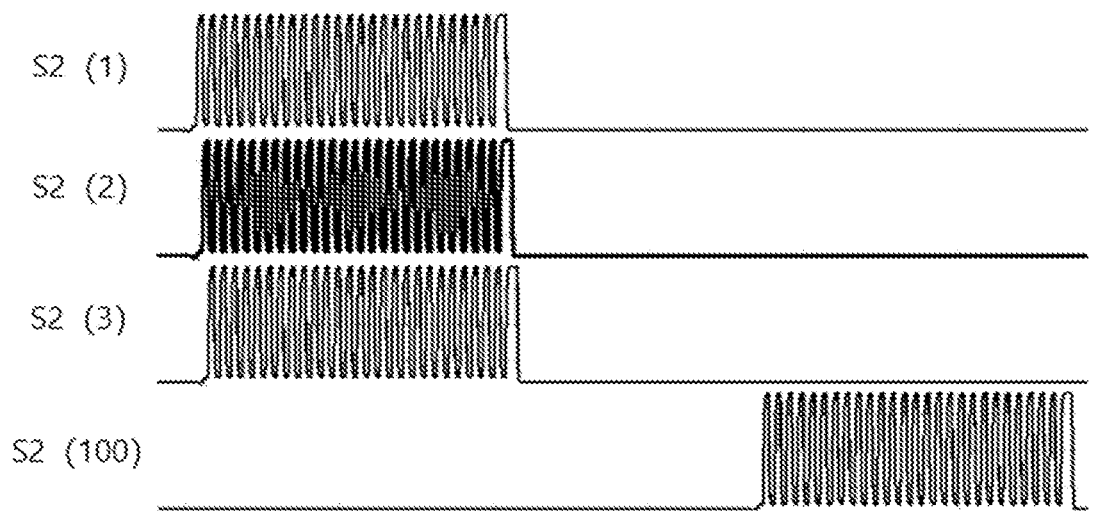
FIG. 25 is a working timing simulation diagram of a signal generation circuit including a plurality of stages of the signal generation unit circuit according to the fourth embodiment of the present disclosure.

FIG. 25 is a working timing simulation diagram of the signal generation circuit including a plurality of stages of the signal generation unit circuit described in the present disclosure. In FIG. 25, S2(1) is the second signal output terminal of the first stage of signal generation unit circuit, S2(2) is the second signal output terminal of the second stage of signal generation unit circuit, and S2(3) is the second signal output terminal of the third stage of signal generation unit circuit, S2(100) is the second signal output terminal of the 100-th stage of signal generation unit circuit; the timing diagram corresponding to S2(1) is the timing sequence simulation diagram of the signal outputted by S2(1), the timing diagram corresponding to S2(2) is the timing simulation diagram of the signal outputted by S2(2), and the timing diagram corresponding to S2(3) is the timing simulation diagram of the signal outputted by S2(3), and the timing diagram corresponding to S2(100) is the timing simulation diagram of the signal outputted by S2(100).

The signal generation method described in at least one embodiment of the present disclosure is applied to the above-mentioned signal generation unit circuit, and the signal generation method includes: generating, by the signal generation circuit, the N-th stage of first carry signal according the (N−1)th stage of first carry signal, the first clock signal, the second clock signal, the first voltage signal, and the second voltage signal, and controlling the potential of the second node, and controlling to connect the first signal output terminal and the first voltage terminal under the control of the N-th stage of first carry signal, and controlling to connect the first signal output terminal and the second voltage terminal under the control the potential of the second node;

Controlling, by the output control signal generation circuit, the potential of the output control terminal;

Controlling, by the output control circuit, the scan signal outputted by the first signal output terminal under the control of the output control signal provided by the output control terminal.

In the signal generation method described in at least one embodiment of the present disclosure, the scan signal outputted by the first signal output terminal may be a pulse signal, and the pulse signal may be a multi-pulse signal, and the number of pulses and the pulse width are adjustable, so as to correspond to threshold voltage compensation time required by different internal compensation circuits (the internal compensation circuit is included in the pixel circuit).

The signal generation circuit according to at least one embodiment of the present disclosure includes a plurality of stages of the above-mentioned signal generation unit circuits;

The N-th stage of signal generation circuit is electrically connected to the (N−1)th stage of first carry signal terminal, the N-th stage of first carry signal terminal, the N-th stage of first signal output terminal, the (N−1)th stage of second carry signal terminal and the N-th stage of second carry signal terminal;

N is a positive integer.

In specific implementation, the output control terminal is the N-th stage of second carry signal terminal (CR2(N)); the output control signal generation circuit is connected to the (N−1)th stage of second carry signal terminal (CR2(N−1)), the (N+5)th stage of second carry signal terminal (CR2(N+5)), the N-th stage of second carry signal terminal (CR2(N)), the first clock signal terminal and the second clock signal terminal, is configured to generate and output the N-th stage of second carry signal outputted by the N-th stage of second carry signal terminal according to the (N−1)th stage of second carry signal, the (N+5)th stage of second carry signal, the first clock signal and the second clock signal;

The N-th stage of signal generation circuit is also electrically connected to the (N+5)th stage of second carry signal terminal.

Figure 26:
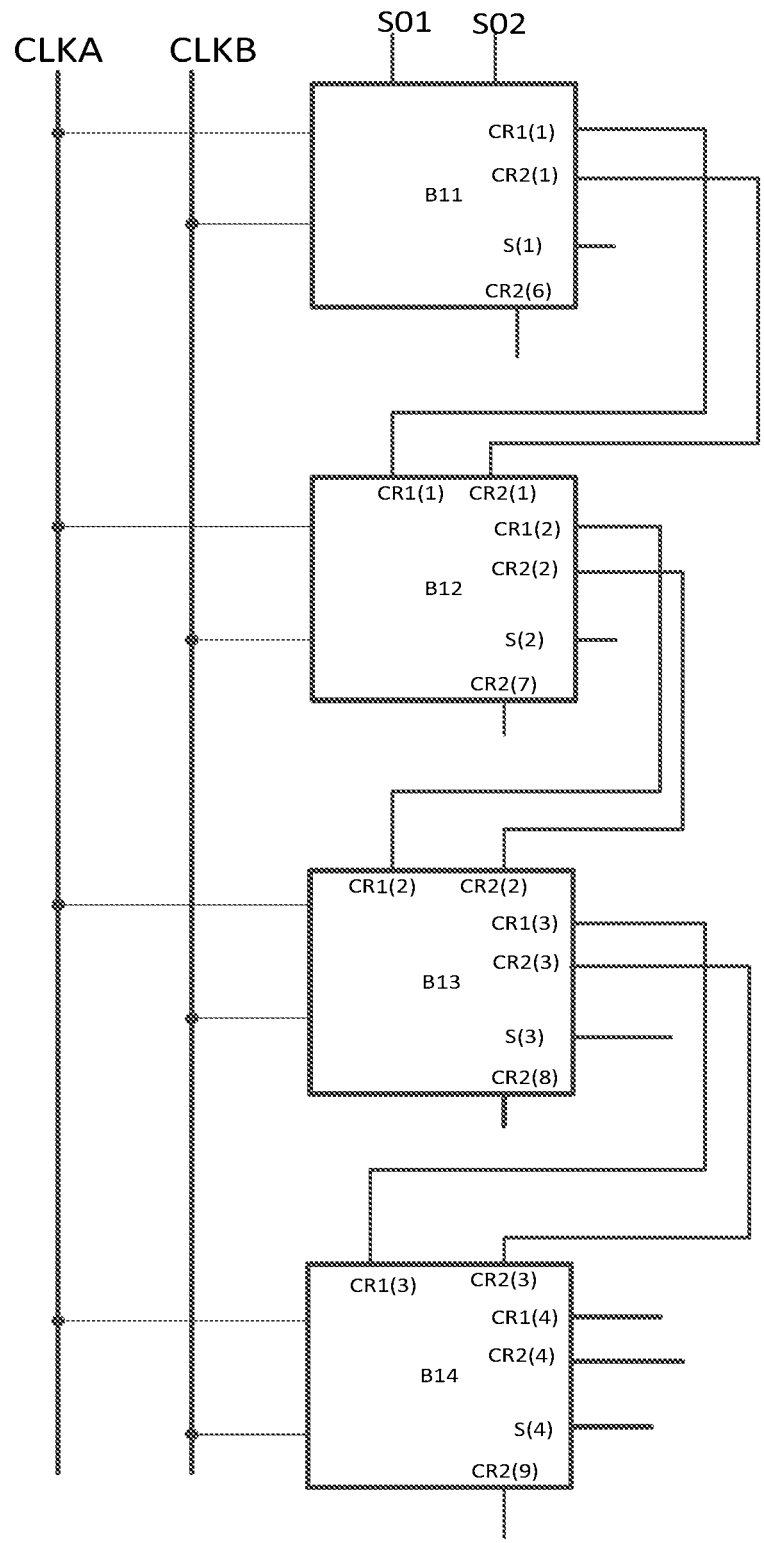
FIG. 26 is a schematic diagram of a cascade relationship of the first four stages of signal generation unit circuits included in the signal generation circuit according to at least one embodiment of the present disclosure.

As shown in FIG. 26, the first stage of signal generation unit circuit is labeled B11, the second stage of signal generation unit circuit is labeled B12, the second stage of signal generation unit circuit is labeled B13, and the fourth stage of signal generation circuit is labeled B14; B11 is respectively electrically connected to the first clock signal terminal CLKA and the second clock signal terminal CLKB, B12 is electrically connected to the first clock signal terminal CLKA and the second clock signal terminal CLKB; B13 is electrically connected to the first clock signal terminal CLKA and the second clock signal terminal CLKB, B 14 is electrically connected to the first clock signal terminal CLKA and the second clock signal terminal CLKB;

B11 is respectively connected to the first initial voltage signal SO1 and the second initial voltage signal S02;

The first stage of first carry signal terminal is labeled CR1(1), the first stage of second carry signal terminal is labeled CR2(1), the first stage of first signal output terminal is labled S(1); B11 is electrically connected to the sixth stage of second carry signal terminal CR2(6);

B12 is electrically connected to CR1(1) and CR2(1); the second stage of first carry signal terminal is labeled CR1(2), and the second stage of second carry signal terminal is labeled CR2(2), the second stage of first signal output terminal is labeled S(2); B12 is electrically connected to the seventh stage of second carry signal terminal CR2(7);

B13 is electrically connected to CR1(2) and CR2(2); the third stage of first carry signal terminal is labeled CR1(3), and the third stage of second carry signal terminal is labeled CR2(3), the third stage of first signal output terminal is labeled S(3); B13 is electrically connected to the eighth stage of carry signal terminal CR2(8);

B14 is electrically connected to CR1(3) and CR2(3); the fourth stage of first carry signal terminal is labeled CR1(4), and the fourth stage of second carry signal terminal is labeled CR2(4), the fourth stage of first signal output terminal is labeled S(4); B14 is electrically connected to the ninth stage of carry signal terminal CR2(9).

The display device according to at least one embodiment of the present disclosure includes the above-mentioned signal generation circuit.

The display device provided by at least one embodiment of the present disclosure may be any product or component with a display function, such as a mobile phone, a tablet computer, a TV, a monitor, a notebook computer, a digital photo frame, and a navigator.

Unless otherwise defined, technical or scientific terms used in this disclosure shall have the ordinary meaning as understood by one of ordinary skill in the art. "First", "second" and similar terms do not denote any order, quantity, or importance, but are merely used to distinguish the various components. "Including" or "comprising" and similar words mean that the elements or things appearing before the word encompass the elements or things recited after the word and their equivalents, but do not exclude other elements or things. "Connected", "coupled" are not limited to physical or mechanical connections, but may include electrical connections directly or indirectly. "Up", "Down", "Left", "Right" are only used to represent the relative positional relationship, and when the absolute position of the described object changes, the relative positional relationship may also change accordingly.

It will be understood that when an element such as a layer, film, area or substrate is referred to as being "on" or "under" another element, it can be "directly on" or "under" the other element, or intermediate elements may be present.

In the foregoing description of the embodiments, the particular features, structures, materials or characteristics may be combined in any suitable manner in any one or more of the embodiments or examples.

The above are the optionally embodiments of the present disclosure. It should be pointed out that for those skilled in the art, several improvements and modifications can be made without departing from the principles described in the present disclosure and these modifications and improvements shall also fall within the scope of the present disclosure.

What is claimed is:

1. A shift register unit, comprising a first node control circuit, a second node control circuit and an output circuit, wherein, the first node control circuit is configured to control a potential of a first node;

the second node control circuit is electrically connected to a second node, a third node, a first voltage terminal, an initial voltage terminal and a first clock signal terminal, and is configured to control a potential of the third node under the control a first voltage signal and an initial voltage signal, and control to connect the third node and the second node under the control of a first clock signal; the first voltage terminal is used for providing the first voltage signal, the initial voltage terminal is used for providing the initial voltage signal, and the first clock signal terminal is used for providing the first clock signal;

the output circuit is electrically connected to an output terminal, the first node, the second node, a second clock signal terminal and a second voltage terminal, is configured to maintain the potential of the first node and a potential of the second node, and control to connect the output terminal and the second clock signal terminal under the control of the potential of the first node, and control to connect the output terminal and the second voltage terminal under the control of the potential of the second node.

2. The shift register unit according to claim 1, wherein the first node control circuit is connected to the first clock signal terminal, the first node, and the initial voltage terminal, and configured to control the potential of the first node according to the first clock signal provided by the first clock signal terminal and the initial voltage signal provided by the initial voltage terminal.

3. The shift register unit according to claim 2, wherein the first node control circuit comprises a first transistor;

a control electrode of the first transistor is electrically connected to the first clock signal terminal, a first electrode of the first transistor is electrically connected to the initial voltage terminal, and a second electrode of the first transistor is electrically connected to the first node;

the second node control circuit may include a second transistor, a third transistor, and a fourth transistor, wherein, a control electrode of the second transistor and a first electrode of the second transistor are both electrically connected to the first voltage terminal, and a second electrode of the second transistor is electrically connected to the third node;

a control electrode of the third transistor is electrically connected to the initial voltage terminal, a first electrode of the third transistor is electrically connected to the third node, and a second electrode of the third transistor is electrically connected to the second voltage terminal;

a control electrode of the fourth transistor is electrically connected to the first clock signal terminal, a first electrode of the fourth transistor is electrically connected to the third node, and a second electrode of the fourth transistor is electrically connected to the second node.

4. The shift register unit according to claim 1, wherein the first node control circuit includes a first control sub-circuit, a second control sub-circuit and a first node control sub-circuit;

the first control sub-circuit is electrically connected to the first voltage terminal, the first clock signal terminal, the second node and a fourth node, and is configured to control to connect the fourth node and the first voltage terminal under the control of the first clock signal, and control to connect the fourth node and the first clock signal terminal under the control of the potential of the second node, and configured to maintain a potential of the fourth node;

the second control sub-circuit is electrically connected to the fourth node, the second clock signal terminal and a fifth node, and is configured to control to connect the fifth node and the second clock signal terminal under the control of the potential of the fourth node;

the first node control sub-circuit is electrically connected to the second clock signal terminal, the fifth node, the first node, the second node and the second voltage terminal, is configured to control to connect the first node and the fifth node under the control of the second clock signal provided by the second clock signal terminal, control to connect the first node and the second voltage terminal under the control of the potential of the second node.

5. The shift register unit according to claim 4, wherein the first control sub-circuit includes a first transistor, a fifth transistor and a control capacitor, the second control sub-circuit includes a sixth transistor, and the first node control sub-circuit includes a seventh transistor and an eighth transistor, a control electrode of the first transistor is electrically connected to the first clock signal terminal, a first electrode of the first transistor is electrically connected to the first voltage terminal, and a second electrode of the first transistor is electrically connected to the fourth node;

a control electrode of the fifth transistor is electrically connected to the second node, a first electrode of the fifth transistor is electrically connected to the fourth node, and a second electrode of the fifth transistor is electrically connected to the first clock signal terminal;

a first terminal of the control capacitor is electrically connected to the fourth node, and a second terminal of the control capacitor is electrically connected to the fifth node;

a control electrode of the sixth transistor is electrically connected to the fourth node, a first electrode of the sixth transistor is electrically connected to the second clock signal terminal, and a second electrode of the sixth transistor is electrically connected to the fifth node;

a control electrode of the seventh transistor is electrically connected to the second clock signal terminal, a first electrode of the seventh transistor is electrically connected to the fifth node, and a second electrode of the seventh transistor is electrically connected to the first node;

a control electrode of the eighth transistor is electrically connected to the second node, a first electrode of the eighth transistor is electrically connected to the first node, and a second electrode of the eighth transistor is electrically connected to the second voltage terminal.

6. The shift register unit according to claim 4, wherein the second node control circuit is connected to the second clock signal terminal and the fourth node, and is also configured to control to connect the second node and the second voltage terminal under the control of the potential of the fourth node and the second clock signal provided by the second clock signal terminal.

7. The shift register unit according to claim 6, wherein the second node control circuit includes a second transistor, a third transistor, a fourth transistor, a ninth transistor, and a tenth transistor, wherein, a control electrode of the second transistor and a first electrode of the second transistor are both electrically connected to the first voltage terminal, and a second electrode of the second transistor is electrically connected to the third node;

a control electrode of the third transistor is electrically connected to the initial voltage terminal, a first electrode of the third transistor is electrically connected to the third node, and a second electrode of the third transistor is electrically connected to the second voltage terminal;

a control electrode of the fourth transistor is electrically connected to the first clock signal terminal, a first electrode of the fourth transistor is electrically connected to the third node, and a second electrode of the fourth transistor is electrically connected to the second node;

a control electrode of the ninth transistor is electrically connected to the fourth node, and a first electrode of the ninth transistor is electrically connected to the second voltage terminal;

a control electrode of the tenth transistor is electrically connected to the second clock signal terminal, a first electrode of the tenth transistor is electrically connected to a second electrode of the ninth transistor, and a second electrode of the tenth transistor is electrically connected to the second node.

8. The shift register unit according to claim 6, wherein the second node control circuit comprises a second transistor, a third transistor, a fourth transistor, and a ninth transistor;

a control electrode of the second transistor and a first electrode of the second transistor are both electrically connected to the first voltage terminal, and a second electrode of the second transistor is electrically connected to the third node;

a control electrode of the third transistor is electrically connected to the initial voltage terminal, a first electrode of the third transistor is electrically connected to the third node, and a second electrode of the third transistor is electrically connected to the second voltage terminal;

a control electrode of the fourth transistor is electrically connected to the first clock signal terminal, a first electrode of the fourth transistor is electrically connected to the third node, and a second electrode of the fourth transistor is electrically connected to the second node;

a control electrode of the ninth transistor is electrically connected to the fourth node, a first electrode of the ninth transistor is electrically connected to the second voltage terminal, and a second electrode of the ninth transistor is electrically connected to the second node.

9. The shift register unit according to claim 1, wherein the output circuit comprises a first output transistor, a second output transistor, a first output capacitor and a second output capacitor;

a control electrode of the first output transistor is electrically connected to the first node, a first electrode of the first output transistor is electrically connected to the second clock signal terminal, and a second electrode of the first output transistor is electrically connected to the output terminal;

a first terminal of the first output capacitor is electrically connected to the first node, and a second terminal of the first output capacitor is electrically connected to the output terminal;

a control electrode of the second output transistor is electrically connected to the second node, a first electrode of the second output transistor is electrically connected to the output terminal, and a second electrode of the second output transistor is electrically connected to the second voltage terminal;

a first terminal of the second output capacitor is electrically connected to the second node, and a second terminal of the second output capacitor is electrically connected to the second voltage terminal.

10. A driving method, applied to the shift register unit according to claim 1, the driving method comprising:

controlling, by the first node control circuit, the potential of the first node;

controlling, by the second node control circuit, the potential of the third node under the control of the first voltage signal and the initial voltage signal, and controlling to connect to disconnect the third node and the second node under the control of the first clock signal;

controlling, by the output circuit, to connect or disconnect the output terminal and the second clock signal terminal under the control of the potential of the first node, and controlling to connect or disconnect the output terminal and the second voltage terminal under the control of the potential of the second node.

11. The driving method according to claim 10, wherein the step of controlling, by the first node control circuit, the potential of the first node comprises:

controlling, by the first node control circuit, the potential of the first node according to the first clock signal and the initial voltage signal.

12. The driving method according to claim 10, wherein the first node control circuit includes a first control sub-circuit, a second control sub-circuit and a first node control sub-circuit; the step of controlling, by the first node control circuit, the potential of the first node includes:

controlling, by the first control sub-circuit, to connect or disconnect a fourth node and the first voltage terminal under the control of the first clock signal, and controlling, by the first control sub-circuit, to connect or disconnect the fourth node and the first clock signal terminal under the control of the potential of the second node, and maintaining, by the first control sub-circuit, a potential of the fourth node;

controlling, by the second control sub-circuit, to connect or disconnect a fifth node and a second clock signal terminal under the control of the potential of the fourth node;

controlling, by the first node control sub-circuit, to connect or disconnect the first node and the fifth node under the control of the second clock signal, and controlling, by the first node control sub-circuit, to connect or disconnect the first node and the second voltage terminal under the control of the potential of the second node;

controlling, by the second node control circuit, to connect or disconnect the second node and the second voltage terminal under the control of the potential of the fourth node and the second clock signal.

13. A gate driving circuit comprising a plurality of stages of shift register units according to claim 1;

except for a first stage of shift register unit, an initial voltage terminal of each stage of the shift register unit is electrically connected to an output terminal of an adjacent previous stage of the shift register unit.

* * * * *